United States Patent
Coakley et al.

(10) Patent No.: US 12,218,385 B2
(45) Date of Patent: *Feb. 4, 2025

(54) BATTERY INTERCONNECTS

(71) Applicant: CelLink Corporation, San Carlos, CA (US)

(72) Inventors: Kevin Michael Coakley, Belmont, CA (US); Malcolm Brown, Mountain View, CA (US); Paul Tsao, Los Altos, CA (US)

(73) Assignee: CelLink Corporation, San Carlos, CA (US)

( * ) Notice: Subject to any disclaimer, the term of this patent is extended or adjusted under 35 U.S.C. 154(b) by 1023 days.

This patent is subject to a terminal disclaimer.

(21) Appl. No.: 17/180,605

(22) Filed: Feb. 19, 2021

(65) Prior Publication Data

US 2021/0175588 A1 Jun. 10, 2021

Related U.S. Application Data

(63) Continuation of application No. 16/227,472, filed on Dec. 20, 2018, now Pat. No. 10,964,931, which is a
(Continued)

(51) Int. Cl.
*H01M 50/581* (2021.01)
*H01M 10/48* (2006.01)
(Continued)

(52) U.S. Cl.
CPC ....... *H01M 50/581* (2021.01); *H01M 10/482* (2013.01); *H01M 50/503* (2021.01);
(Continued)

(58) Field of Classification Search
None
See application file for complete search history.

(56) References Cited

U.S. PATENT DOCUMENTS

| 3,750,278 A | 8/1973 | Oberg et al. |
| 3,864,169 A | 2/1975 | Cestaro et al. |

(Continued)

FOREIGN PATENT DOCUMENTS

| CN | 101199242 A | 6/2008 |
| CN | 203715762 U | 7/2014 |

(Continued)

OTHER PUBLICATIONS

Nagarajan Palavesam et al; "Roll-to-roll processing of film substrates for hybrid integrated flexible electronics" Flexible and Printed Electronics, Feb. 2018.
(Continued)

*Primary Examiner* — Nilufa Rahim
(74) *Attorney, Agent, or Firm* — Polygon IP, LLP

(57) ABSTRACT

Provided are interconnects for interconnecting a set of battery cells, assemblies comprising these interconnects, methods of forming such interconnects, and methods of forming such assemblies. An interconnect includes a conductor comprising two portions electrically isolated from each other. At least one portion may include two contacts for connecting to battery cells and a fuse forming an electrical connection between these two contacts. The interconnect may also include an insulator adhered to the conductor and mechanically supporting the two portions of the conductor. The insulator may include an opening such that the fuse overlaps with this opening, and the opening does not interfere with operation of the fuse. In some embodiments, the fuse may not directly interface with any other structures. Furthermore, the interconnect may include a temporary substrate adhered to the insulator such that the insulator is disposed between the temporary substrate and the conductor.

20 Claims, 49 Drawing Sheets

Related U.S. Application Data continuation of application No. 15/289,028, filed on Oct. 7, 2016, now Pat. No. 10,211,443, which is a continuation-in-part of application No. 14/836,946, filed on Aug. 26, 2015, now Pat. No. 9,545,010, which is a continuation of application No. 14/671,814, filed on Mar. 27, 2015, now Pat. No. 9,147,875.

(60) Provisional application No. 62/263,076, filed on Dec. 4, 2015, provisional application No. 62/238,827, filed on Oct. 8, 2015, provisional application No. 62/111,333, filed on Feb. 3, 2015, provisional application No. 62/080,971, filed on Nov. 17, 2014, provisional application No. 62/048,404, filed on Sep. 10, 2014.

(51) Int. Cl.
| | |
|---|---|
| *H01M 50/503* | (2021.01) |
| *H01M 50/522* | (2021.01) |
| *H01M 50/526* | (2021.01) |
| *H05K 1/11* | (2006.01) |
| *H05K 1/18* | (2006.01) |
| *H05K 3/40* | (2006.01) |
| *H01M 10/42* | (2006.01) |
| *H05K 1/02* | (2006.01) |

(52) U.S. Cl.
CPC ....... *H01M 50/522* (2021.01); *H01M 50/526* (2021.01); *H05K 1/118* (2013.01); *H05K 1/189* (2013.01); *H05K 3/4092* (2013.01); *H01M 10/4257* (2013.01); *H01M 2200/103* (2013.01); *H05K 1/0265* (2013.01); *H05K 2201/0397* (2013.01); *H05K 2201/056* (2013.01); *H05K 2201/09081* (2013.01); *H05K 2201/10037* (2013.01); *H05K 2201/10181* (2013.01); *Y02E 60/10* (2013.01)

(56) References Cited

U.S. PATENT DOCUMENTS

| | | | |
|---|---|---|---|
| 3,870,212 | A | 3/1975 | Polk |
| 4,047,457 | A | 9/1977 | Stubbings |
| 4,147,337 | A | 4/1979 | Bolza-Schunemann |
| 4,818,840 | A | 4/1989 | Booth et al. |
| 4,908,337 | A | 3/1990 | Treffer |
| 5,158,842 | A | 10/1992 | McHenry |
| 5,262,594 | A | 11/1993 | Edwin et al. |
| 5,354,629 | A | 10/1994 | Kuroda et al. |
| 5,622,652 | A | 4/1997 | Kucherovsky et al. |
| 5,645,932 | A | 7/1997 | Uchibori |
| 5,656,081 | A | 8/1997 | Isen et al. |
| 5,708,297 | A | 1/1998 | Clayton |
| 5,796,588 | A | 8/1998 | Machida et al. |
| 5,866,942 | A | 2/1999 | Suzuki et al. |
| 6,010,771 | A | 1/2000 | Isen et al. |
| 6,036,809 | A | 3/2000 | Kelly et al. |
| 6,042,966 | A | 3/2000 | Cheu |
| 6,214,444 | B1 | 4/2001 | Uchibori |
| 6,284,405 | B2 | 9/2001 | Kaido et al. |
| 6,331,678 | B1 | 12/2001 | Wang et al. |
| 6,332,909 | B1 | 12/2001 | Teshima et al. |
| 6,370,019 | B1 | 4/2002 | Matthies et al. |
| 6,383,616 | B1 | 5/2002 | Uchibori |
| 6,632,538 | B1 | 10/2003 | Yamazaki et al. |
| 6,787,732 | B1 | 9/2004 | Xuan et al. |
| 6,881,923 | B2 | 4/2005 | Battaglia |
| 6,972,544 | B2 | 12/2005 | Seman, Jr. et al. |
| 6,992,001 | B1 | 1/2006 | Lin |
| 7,497,004 | B2 | 3/2009 | Cote et al. |
| 7,633,035 | B2 | 12/2009 | Kirmeier |
| 7,686,853 | B2 | 3/2010 | Seman, Jr. et al. |
| 8,143,631 | B2 | 3/2012 | Crandell et al. |
| 8,236,443 | B2 | 8/2012 | Snyder et al. |
| 8,404,376 | B2 | 3/2013 | Snyder et al. |
| 8,414,308 | B1 | 4/2013 | Meyers |
| 8,426,063 | B2 | 4/2013 | Lin |
| 8,475,954 | B2 | 7/2013 | Ijaz et al. |
| 8,497,037 | B2 | 7/2013 | Hosoe et al. |
| 8,510,934 | B2 | 8/2013 | Brand et al. |
| 8,635,761 | B2 | 1/2014 | Wu |
| 8,913,368 | B2 | 12/2014 | Hosoe et al. |
| 8,920,955 | B1 | 12/2014 | Chuang et al. |
| 8,931,166 | B2 | 1/2015 | Marttila |
| 8,975,510 | B2 | 3/2015 | Coakley |
| 9,147,875 | B1 | 9/2015 | Coakley et al. |
| 9,214,607 | B1 | 12/2015 | Andrews |
| 9,343,595 | B2 | 5/2016 | Fu et al. |
| 9,466,777 | B2 | 10/2016 | Coakley et al. |
| 9,545,010 | B2 | 1/2017 | Coakley et al. |
| 9,671,352 | B2 | 6/2017 | Woo et al. |
| 9,692,030 | B2 | 6/2017 | Schüssler et al. |
| 9,730,333 | B2 | 8/2017 | Li et al. |
| 9,844,148 | B2 | 12/2017 | Coakley et al. |
| 10,008,403 | B2 | 6/2018 | Rumsby |
| 10,153,570 | B2 | 12/2018 | Coakley et al. |
| 10,211,443 | B2 | 2/2019 | Coakley et al. |
| 10,383,207 | B2 | 8/2019 | Coakley |
| 10,694,618 | B2 | 6/2020 | Coakley et al. |
| 10,842,025 | B1 | 11/2020 | Lane |
| 10,964,931 | B2 | 3/2021 | Coakley et al. |
| 11,108,175 | B2 | 8/2021 | Coakley et al. |
| 11,116,070 | B2 | 9/2021 | Coakley et al. |
| 11,545,773 | B2 | 1/2023 | Coakley et al. |
| 11,791,577 | B2 | 10/2023 | Coakley et al. |
| 11,888,180 | B2 | 1/2024 | Findlay et al. |
| 11,894,580 | B2 | 2/2024 | Coakley et al. |
| 12,040,511 | B2 | 7/2024 | Coakley et al. |
| 2001/0006766 | A1 | 7/2001 | O'Brien et al. |
| 2001/0012588 | A1 | 8/2001 | Kaido et al. |
| 2002/0025416 | A1 | 2/2002 | Uchibori |
| 2002/0046856 | A1 | 4/2002 | Alcoe |
| 2002/0050489 | A1 | 5/2002 | Ikegami et al. |
| 2003/0062347 | A1 | 4/2003 | Song et al. |
| 2003/0143958 | A1 | 7/2003 | Elias et al. |
| 2004/0261700 | A1 | 12/2004 | Edwards et al. |
| 2006/0032665 | A1 | 2/2006 | Ice |
| 2006/0213548 | A1 | 9/2006 | Bachrach et al. |
| 2007/0171129 | A1 | 7/2007 | Coleman et al. |
| 2007/0193027 | A1 | 8/2007 | Takakusaki et al. |
| 2008/0017971 | A1 | 1/2008 | Hollis |
| 2008/0083715 | A1 | 4/2008 | Kirmeier |
| 2008/0128397 | A1 | 6/2008 | Gandhi |
| 2008/0196930 | A1 | 8/2008 | Tuominen et al. |
| 2008/0216887 | A1 | 9/2008 | Hacke et al. |
| 2009/0007421 | A1 | 1/2009 | Chen et al. |
| 2009/0022885 | A1 | 1/2009 | Matsumoto et al. |
| 2009/0045964 | A1 | 2/2009 | Takeda et al. |
| 2009/0111015 | A1 | 4/2009 | Wood et al. |
| 2009/0139781 | A1 | 6/2009 | Straubel |
| 2009/0233237 | A1 | 9/2009 | Yoshiki et al. |
| 2009/0250104 | A1 | 10/2009 | Inoue et al. |
| 2010/0031996 | A1 | 2/2010 | Basol |
| 2010/0271223 | A1 | 10/2010 | Ohkura et al. |
| 2011/0001670 | A1 | 1/2011 | Coleman et al. |
| 2011/0089212 | A1 | 4/2011 | Schmid et al. |
| 2011/0177365 | A1 | 7/2011 | Yasui et al. |
| 2012/0088140 | A1 | 4/2012 | Kardasz et al. |
| 2012/0129014 | A1 | 5/2012 | Baek et al. |
| 2012/0164490 | A1 | 6/2012 | Itoi et al. |
| 2012/0171527 | A1 | 7/2012 | Hiroma |
| 2012/0183823 | A1 | 7/2012 | Borck et al. |
| 2012/0227907 | A1 | 9/2012 | Arakawa et al. |
| 2012/0240995 | A1 | 9/2012 | Coakley |
| 2012/0288757 | A1 | 11/2012 | Hosoe et al. |
| 2013/0004844 | A1 | 1/2013 | Hosoe et al. |
| 2013/0004856 | A1 | 1/2013 | Hosoe et al. |
| 2013/0055555 | A1 | 3/2013 | Forster et al. |
| 2013/0078485 | A1 | 3/2013 | Muis |
| 2013/0089769 | A1 | 4/2013 | Proctor et al. |
| 2013/0098424 | A1 | 4/2013 | Tsuda et al. |

(56) References Cited

U.S. PATENT DOCUMENTS

| | | | |
|---|---|---|---|
| 2013/0112233 A1* | 5/2013 | Coakley | H01L 31/0516 156/247 |
| 2013/0228890 A1 | 9/2013 | Eisele | |
| 2013/0260191 A1 | 10/2013 | Takahashi et al. | |
| 2013/0291375 A1 | 11/2013 | Virtanen et al. | |
| 2013/0307133 A1 | 11/2013 | Toba | |
| 2014/0061877 A1 | 3/2014 | Lin et al. | |
| 2014/0199562 A1 | 7/2014 | Kim et al. | |
| 2014/0212695 A1* | 7/2014 | Lane | H01M 50/509 429/7 |
| 2014/0234683 A1 | 8/2014 | Sweney | |
| 2014/0268780 A1 | 9/2014 | Wang et al. | |
| 2014/0285990 A1 | 9/2014 | Kim et al. | |
| 2014/0335705 A1 | 11/2014 | Fan et al. | |
| 2015/0023584 A1 | 1/2015 | Rudin | |
| 2015/0050525 A1 | 2/2015 | Ahn | |
| 2015/0079431 A1 | 3/2015 | Kim et al. | |
| 2015/0201489 A1 | 7/2015 | Foong et al. | |
| 2015/0207131 A1* | 7/2015 | Han | H01M 50/578 429/61 |
| 2015/0228956 A1 | 8/2015 | Schüssler et al. | |
| 2015/0244017 A1 | 8/2015 | Nishinaka et al. | |
| 2015/0270190 A1 | 9/2015 | Kim et al. | |
| 2016/0073506 A1 | 3/2016 | Coakley et al. | |
| 2016/0181579 A1 | 6/2016 | Geshi et al. | |
| 2016/0207287 A1 | 7/2016 | Kim | |
| 2016/0225969 A1 | 8/2016 | Coakley et al. | |
| 2016/0315304 A1 | 10/2016 | Biskup | |
| 2016/0366768 A1 | 12/2016 | Matsuda | |
| 2017/0012331 A1 | 1/2017 | Ng et al. | |
| 2017/0034902 A1 | 2/2017 | Coakley et al. | |
| 2017/0069940 A1 | 3/2017 | Goldstein et al. | |
| 2017/0077487 A1 | 3/2017 | Coakley et al. | |
| 2017/0094802 A1 | 3/2017 | Coakley et al. | |
| 2017/0214033 A1 | 7/2017 | Takano et al. | |
| 2018/0034023 A1 | 2/2018 | Newman et al. | |
| 2018/0190960 A1 | 7/2018 | Harris et al. | |
| 2018/0205048 A1 | 7/2018 | Enomoto et al. | |
| 2018/0294536 A1 | 10/2018 | Kruszelnicki | |
| 2019/0097204 A1 | 3/2019 | Liposky et al. | |
| 2019/0148707 A1 | 5/2019 | Coakley et al. | |
| 2019/0181419 A1 | 6/2019 | Suba et al. | |
| 2019/0218142 A1 | 7/2019 | Logunov et al. | |
| 2019/0296281 A1 | 9/2019 | Elsberry | |
| 2019/0312251 A1 | 10/2019 | Matthews | |
| 2019/0341585 A1 | 11/2019 | Shi et al. | |
| 2020/0020918 A1 | 1/2020 | Ichikawa et al. | |
| 2020/0220120 A1 | 7/2020 | Day et al. | |
| 2020/0295338 A1 | 9/2020 | Xiang et al. | |
| 2021/0066683 A1 | 3/2021 | Lane | |
| 2021/0091363 A1 | 3/2021 | Lane | |
| 2021/0092853 A1 | 3/2021 | Lane | |
| 2021/0092854 A1 | 4/2021 | Lane | |
| 2021/0092837 A1 | 6/2021 | Lane | |
| 2021/0092851 A1 | 6/2021 | Lane | |
| 2021/0175588 A1 | 6/2021 | Coakley et al. | |
| 2022/0109256 A1 | 4/2022 | Coakley et al. | |
| 2022/0311103 A1 | 9/2022 | Findlay et al. | |
| 2023/0361434 A1 | 11/2023 | Findlay et al. | |
| 2023/0369731 A1 | 11/2023 | Coakley et al. | |
| 2024/0154277 A1 | 5/2024 | Coakley et al. | |

FOREIGN PATENT DOCUMENTS

| | | |
|---|---|---|
| CN | 103988283 A | 8/2014 |
| CN | 107078263 A | 8/2017 |
| CN | 116897463 A | 10/2023 |
| EP | 2461408 A1 | 6/2012 |
| EP | 3192111 B1 | 12/2018 |
| EP | 3496180 A1 | 6/2019 |
| EP | 4256647 A1 | 10/2023 |
| JP | 2007508681 A | 4/2007 |
| JP | 2011233491 A | 11/2011 |
| JP | 20110233491 A | 11/2011 |
| JP | 2012198995 A | 10/2012 |
| JP | 20120198995 A | 10/2012 |
| JP | 2013037969 A | 2/2013 |
| JP | 20130037969 A | 2/2013 |
| JP | 6463550 B2 | 2/2019 |
| KR | 20120053809 A | 5/2012 |
| KR | 20150058939 A | 5/2015 |
| KR | 101829178 B1 | 2/2018 |
| WO | 2013063738 A1 | 5/2013 |
| WO | 2016040040 A1 | 3/2016 |
| WO | 2016126890 A1 | 8/2016 |
| WO | 2017062886 A1 | 4/2017 |
| WO | 2019150740 A1 | 8/2019 |
| WO | 2019182117 A1 | 9/2019 |
| WO | 2020081492 A2 | 4/2020 |
| WO | 2022204709 A1 | 9/2022 |

OTHER PUBLICATIONS

U.S. Appl. No. 16/227,472, Examiner Interview Summary Record (Ptol-413), Nov. 20, 2020, 1 pg.

U.S. Appl. No. 16/227,472, Non-Final Rejection, Jul. 2, 2020, 33 pgs.

U.S. Appl. No. 16/227,472, Notice of Allowance and Fees Due (Ptol-85), Nov. 20, 2020, 9 pgs.

U.S. Appl. No. 16/227,472, Office Action Appendix, Nov. 2, 2020, 2 pgs.

U.S. Appl. No. 16/227,472, Requirement for Restriction/Election, Apr. 3, 2020, 9 pgs.

U.S. Appl. No. 14/671,814, Notice of Allowance mailed Jun. 1, 2015, 12 pgs.

U.S. Appl. No. 14/836,946, Notice of Allowance mailed Sep. 28, 2016, 10 pgs.

U.S. Appl. No. 15/015,088, Examiner Interview Summary mailed Aug. 3, 2016, 1 pg.

U.S. Appl. No. 15/015,088, Notice of Allowance mailed Aug. 3, 2016, 14 pgs.

U.S. Appl. No. 15/015,088, Restriction Requirement mailed May 31, 2016, 8 pgs.

U.S. Appl. No. 15/259,518, Examiner Interview Summary mailed Jul. 18, 2017, 16 pgs.

U.S. Appl. No. 15/259,518, Notice of Allowance mailed Jul. 18, 2017, 16 pgs.

U.S. Appl. No. 15/259,518, Restriction Requirement mailed Mar. 22, 2017, 8 pgs.

U.S. Appl. No. 15/289,028, Examiner Interview Summary mailed Aug. 2, 2018, 3 pgs.

U.S. Appl. No. 15/289,028, Non Final Office Action mailed Apr. 4, 2018, 26 pgs.

U.S. Appl. No. 15/289,028, Notice of Allowance mailed Sep. 28, 2018, 10 pgs.

U.S. Appl. No. 15/289,028, Requirement for Restriction mailed Sep. 12, 2017, 13 pgs.

U.S. Appl. No. 15/379,177, Ex Parte Quayle Action mailed Jul. 11, 2017, 5 pgs.

U.S. Appl. No. 15/379,177, Notice of Allowance mailed Sep. 7, 2017, 8 pgs.

Application Serial No. PCT/US16/16469, Search Report and Written Opinion mailed May 17, 2016, 7 pgs.

Chinese Application Serial No. 201580056710.9, Office Action mailed Apr. 4, 2018, 6 pgs.

Chinese Application Serial No. 201580056710.9, Office Action mailed Oct. 31, 2018, 8 pgs.

Coakley, Kevin Michael., et al., Interconnect for Battery Pack, 101 pgs.

Coakley, Kevin Michael., et al., Interconnect for Battery Pack, 98 pgs.

European Application Serial No. 15840309.7, Search Report mailed Oct. 24, 2017, 4 pgs.

European Application Serial No. 17176834.4, Office Action mailed Nov. 24, 2017, 9 pgs.

(56) References Cited

OTHER PUBLICATIONS

International Application Serial No. PCT/US15/47821, International Preliminary Report on Patentability mailed Mar. 23, 2017, 6 pgs.
International Application Serial No. PCT/US16/56154, International Search Report and Written Opinion mailed Jan. 10, 2017, 12 pgs.
Int'l Application Serial No. PCT/US16/56154, IPRP mailed Apr. 19, 2018, 9 pgs.
Int'l Application Serial No. PCT/US2015/047821, Search Report and Written Opinion mailed Oct. 29, 2015, 9 pgs.
Korean Application Serial No. 10-2017-7009130, Office Action mailed Jul. 20, 2017, 13 pgs.
Schubert, Gunter, Adhesion of Aluminium Foil to Coating—Stick with it., 30 pgs.
Zhang, Shengde, et al., Mechanical Properties of Copper Thin Films Used in Electronic Devices, 6pgs.
"*Cellink Corp.* v. *Manaflex LLC*—Answer and Counterclaims", Case No. 4:23-cv-04231-HSG, Nov. 15, 2023.
"*Cellink Corp.* v. *Manaflex LLC*—Complaint for Patent Infringement and Trade Secret Misappropriation", Aug. 18, 2023.
"International Application Serial No. PCT/US2015/047821, Search Report and Written Opinion mailed Oct. 29, 2015".
"International Application Serial No. PCT/US2022/071318, Search Report and Written Opinion mailed Jul. 14, 2022, 9 pgs."
"Request for Quote (RFQ) email from CelLink, sent Oct. 30, 2015".
"Schubert, Gunter , "Adhesion of Aluminium Foil to Coating—Stick with it", Tappi 03/G. Schubert, http://www.tappi.org/content/enewsletters/eplace/2004/10-1schub1.pdf, May 14, 2003."

"European Application Serial No. 15840309.7, Search Report dated Oct. 24, 2017", 4 pgs.
"European Application Serial No. 17176834.4, Office Action dated Nov. 24, 2017", 9 pgs.
"International Application Serial No. PCT/US2015/047821, International Preliminary Report on Patentability dated Mar. 23, 2017", 6 pages.
"International Application Serial No. PCT/US2016/016469, Search Report and Written Opinion dated May 17, 2016", 7 pages.
"International Application Serial No. PCT/US2016/056154, International Preliminary Report on Patentability dated Apr. 19, 2018", 9 pages.
"International Application Serial No. PCT/US2016/056154, International Search Report and Written Opinion dated Jan. 10, 2017", 12 pages.
"Korean Application Serial No. 10-2017-7009130, Office Action dated Jun. 20, 2017", 13 pgs.
"Nagarajan Palavesam et al 2018 Flex. Print. Electron. 3 014002" mailed Nov. 2020.
U.S. Appl. No. 18/352,466, Notice of Allowance mailed Dec. 14, 2023, 13 pgs.
U.S. Appl. No. 18/352,584, Non Final Office Action mailed Oct. 26, 2023, 13 pgs.
U.S. Appl. No. 18/352,584, Notice of Allowance mailed Dec. 21, 2023, 9 pgs.
U.S. Appl. No. 18/414,170, Non Final Office Action mailed Apr. 10, 2024, 16 pgs.
U.S. Appl. No. 18/414,170, Notice of Allowance mailed May 24, 2024, 8 pgs.

* cited by examiner

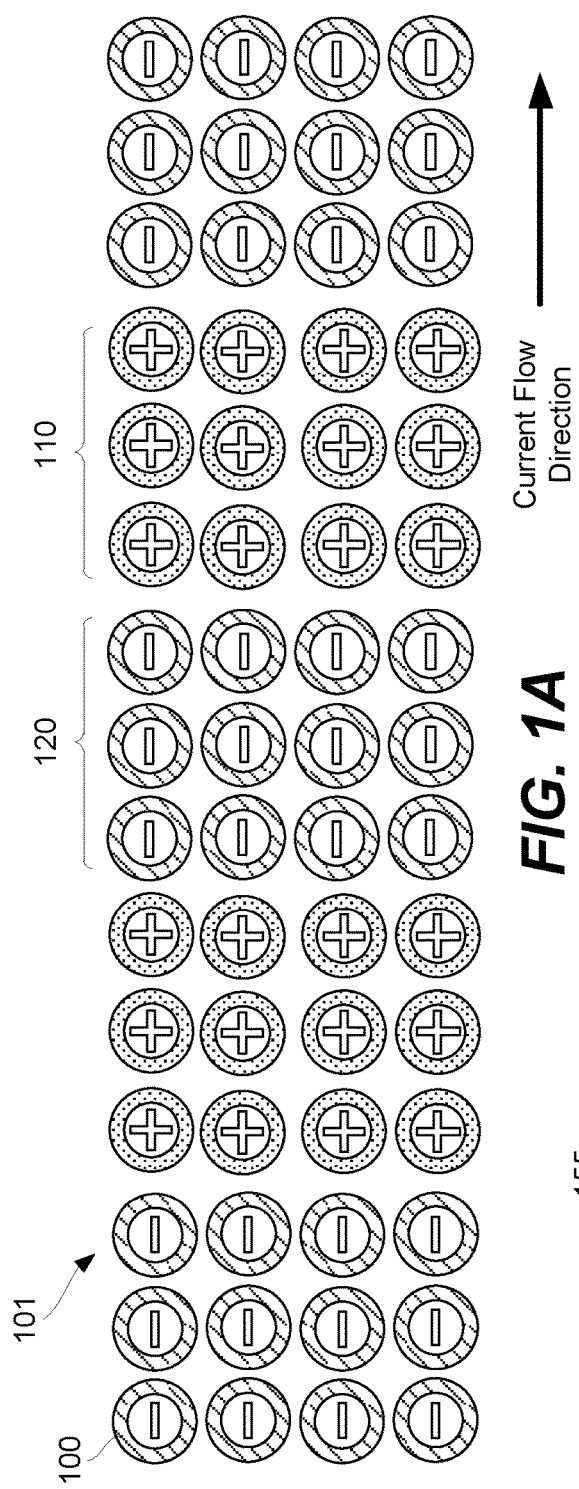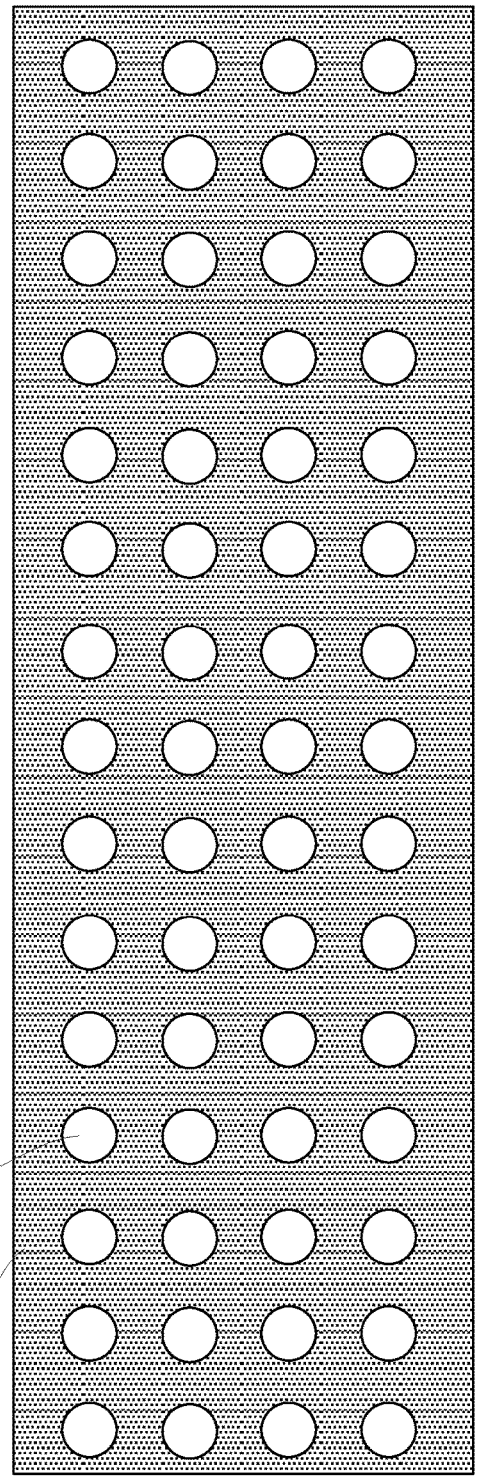

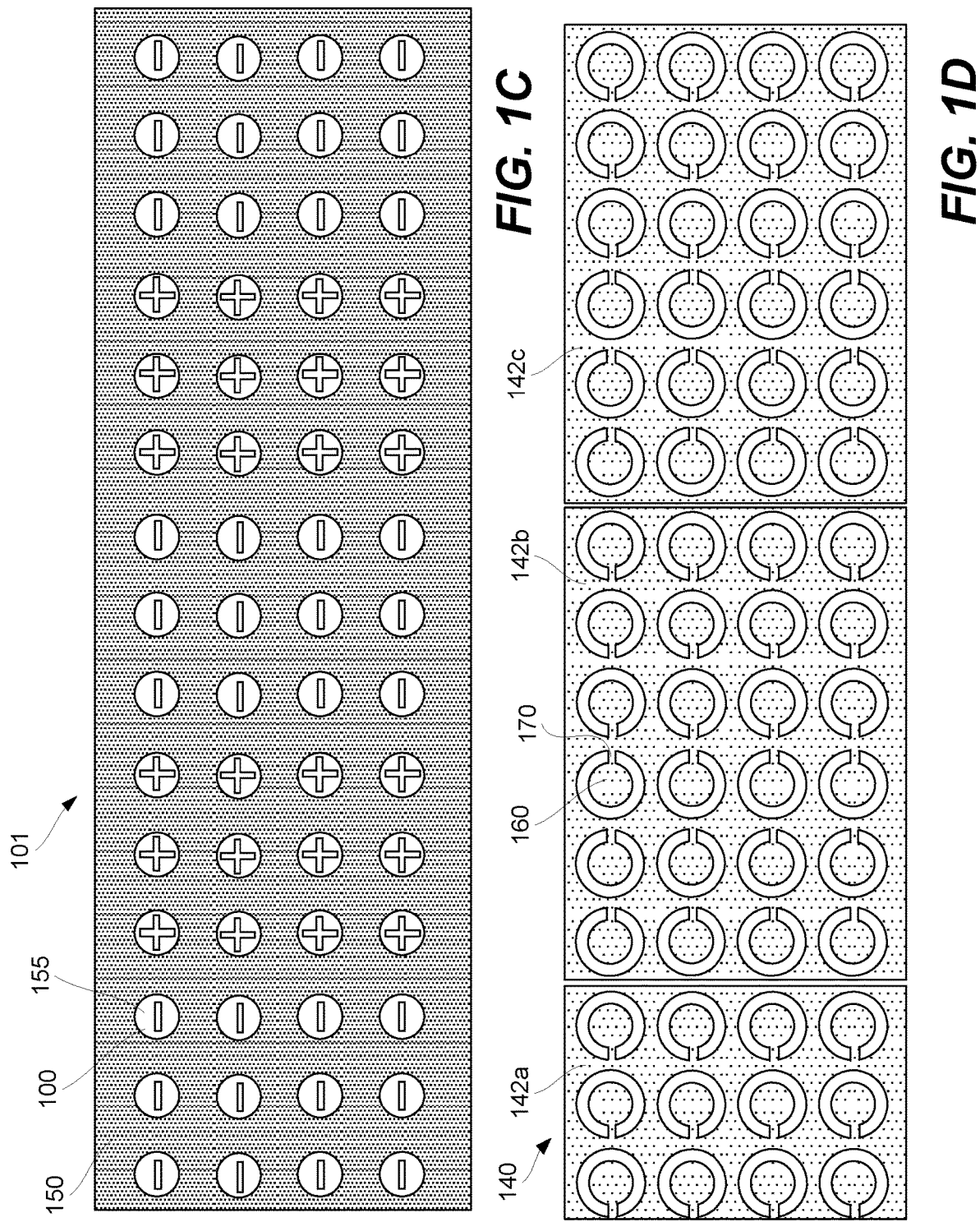

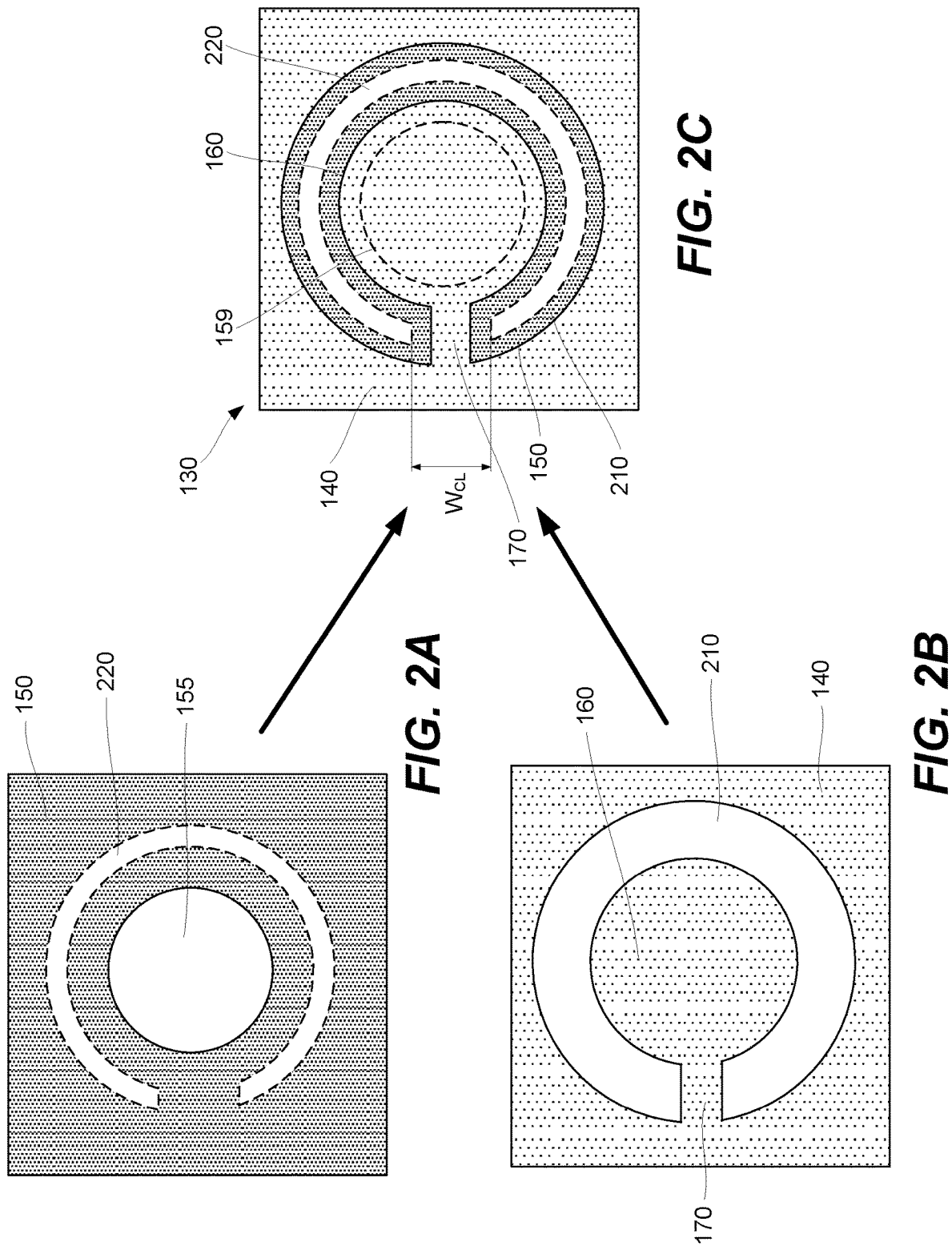

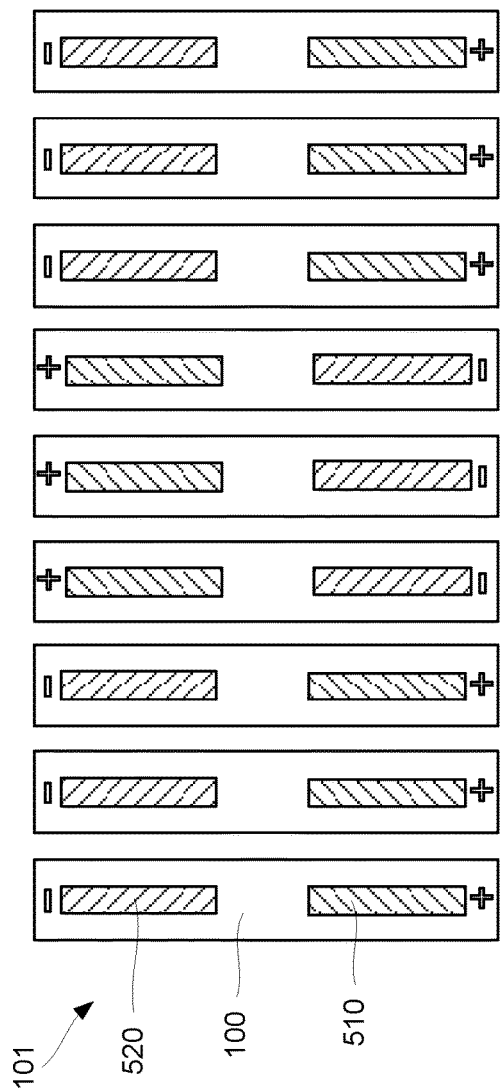
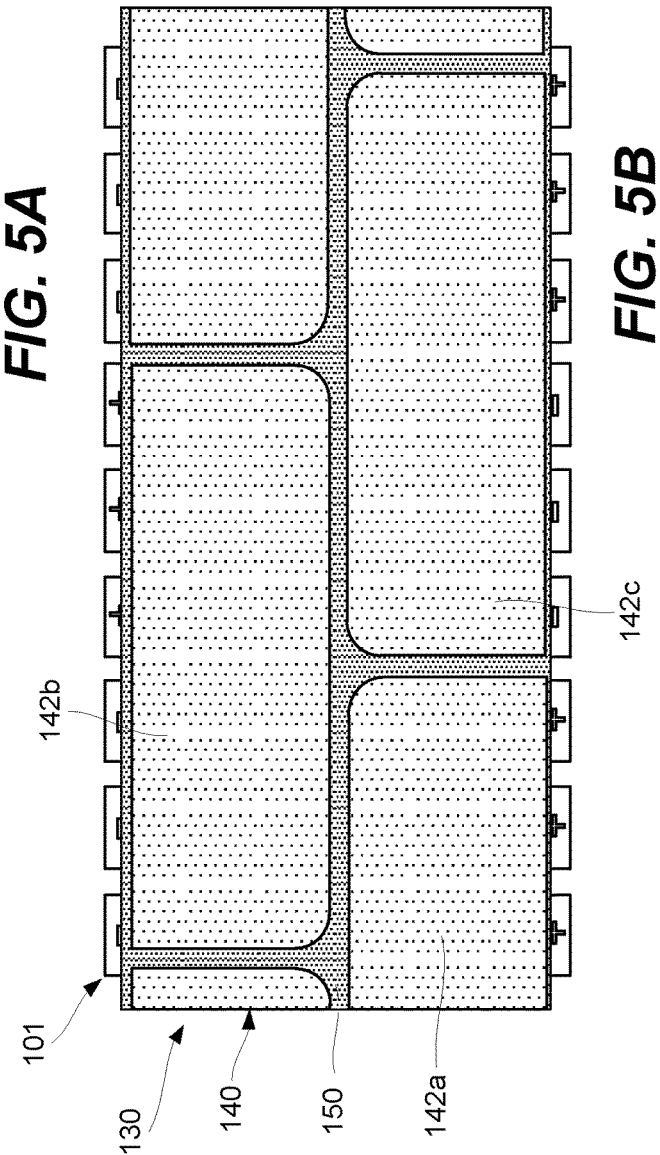
FIG. 5A
FIG. 5B

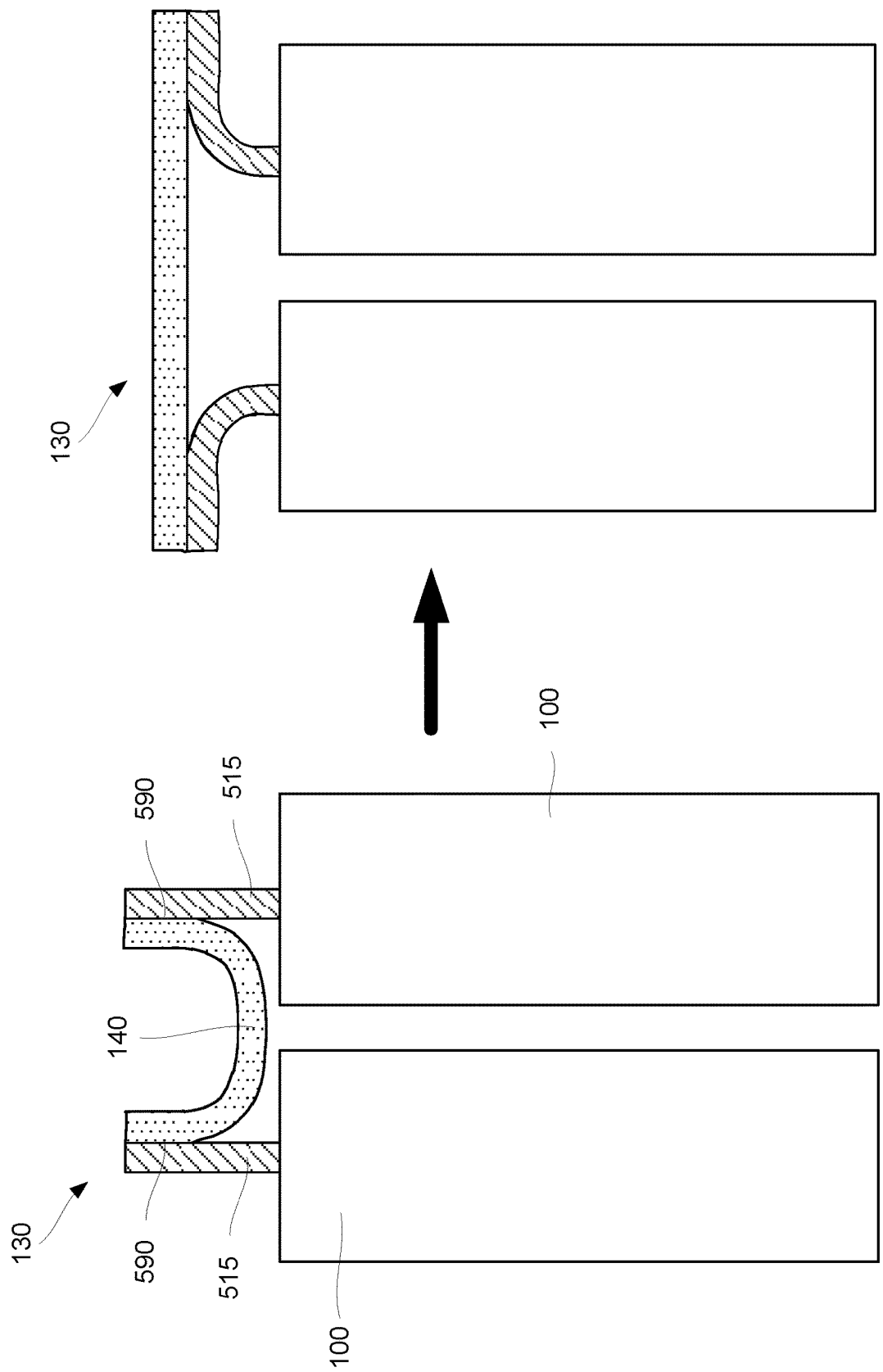

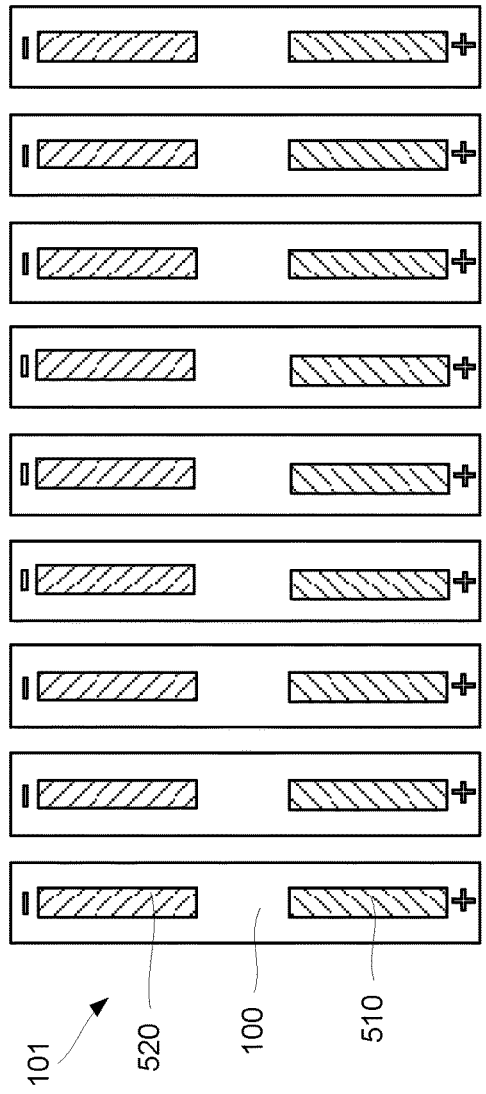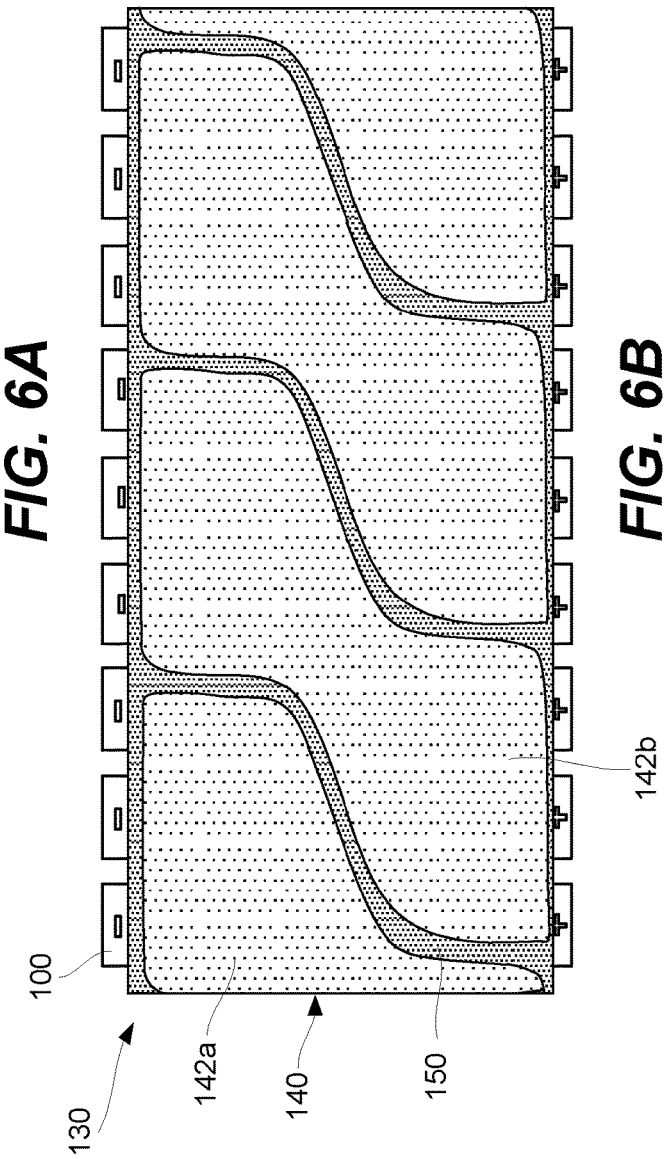

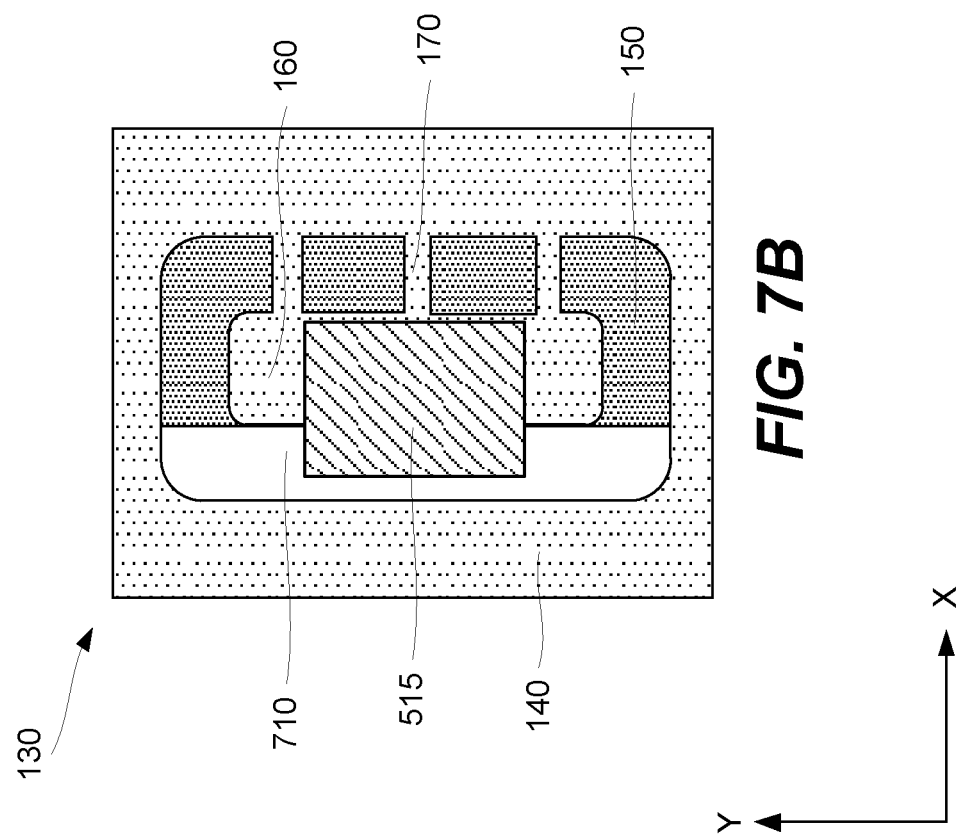
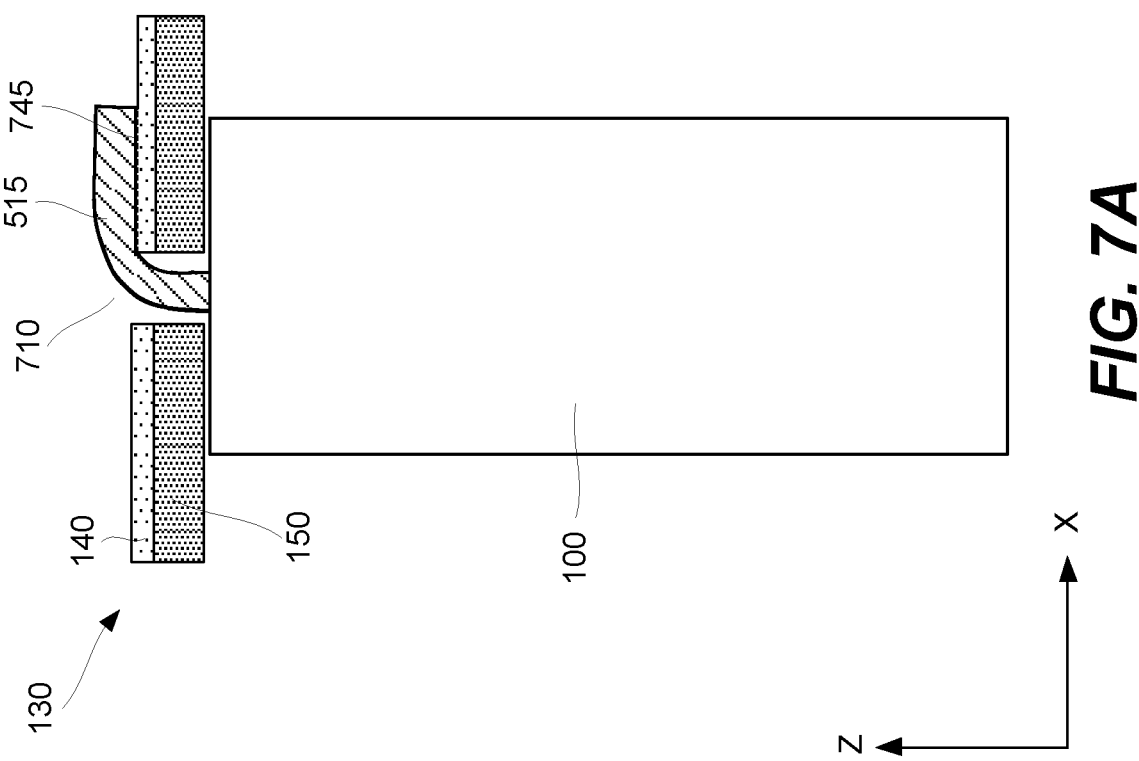
FIG. 7B
FIG. 7A

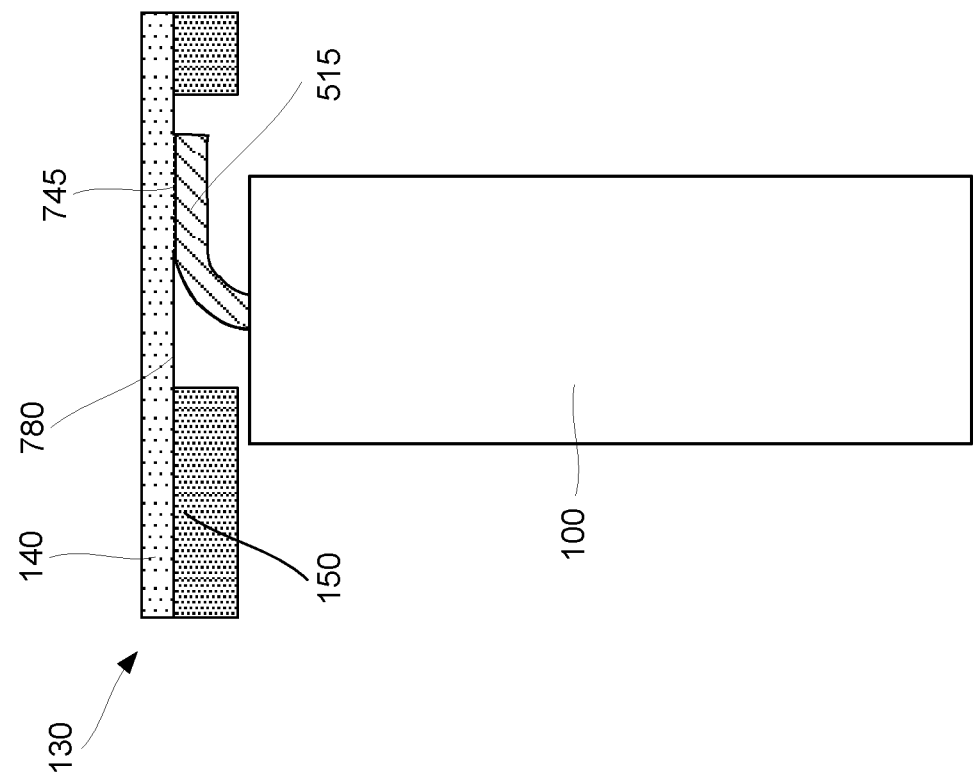
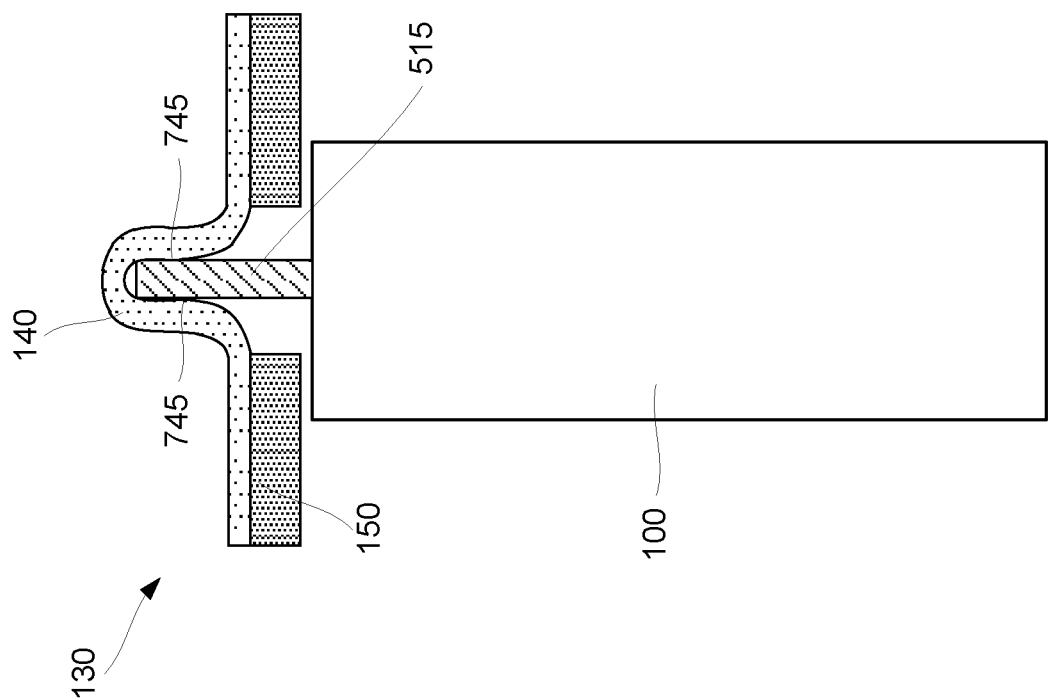

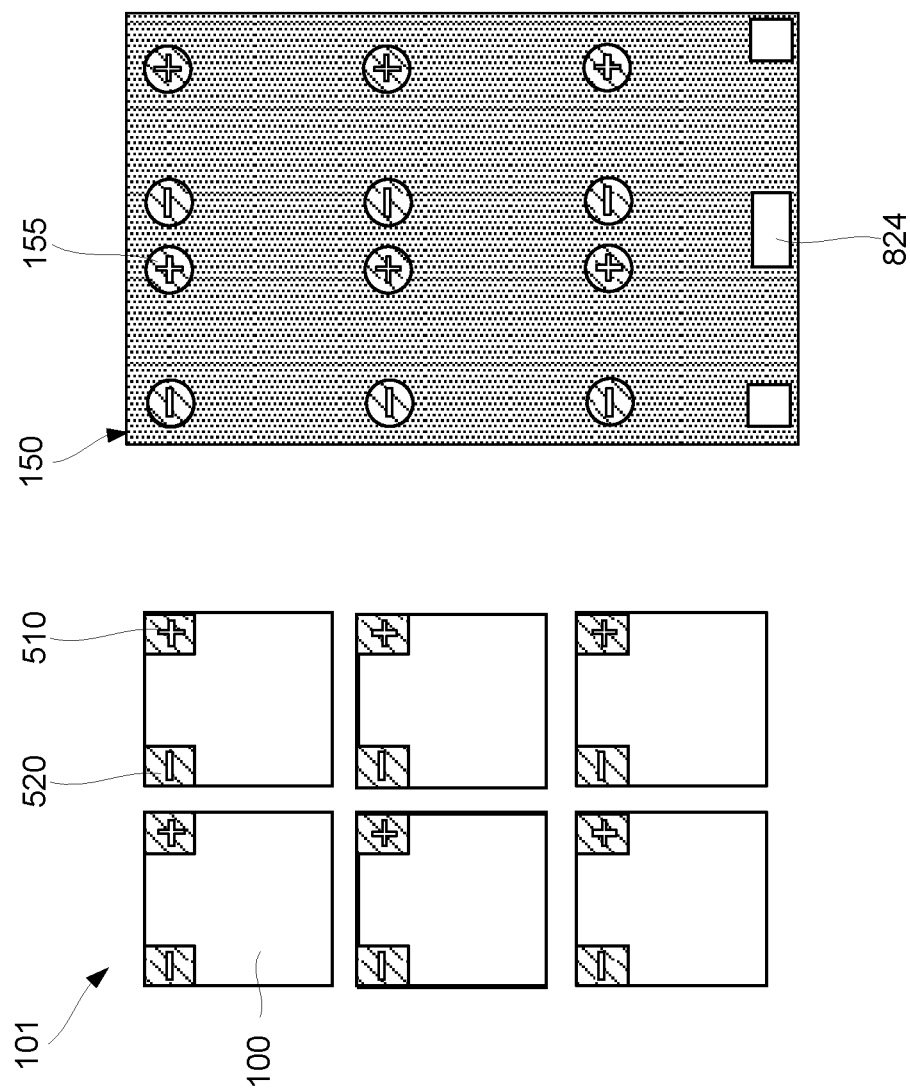

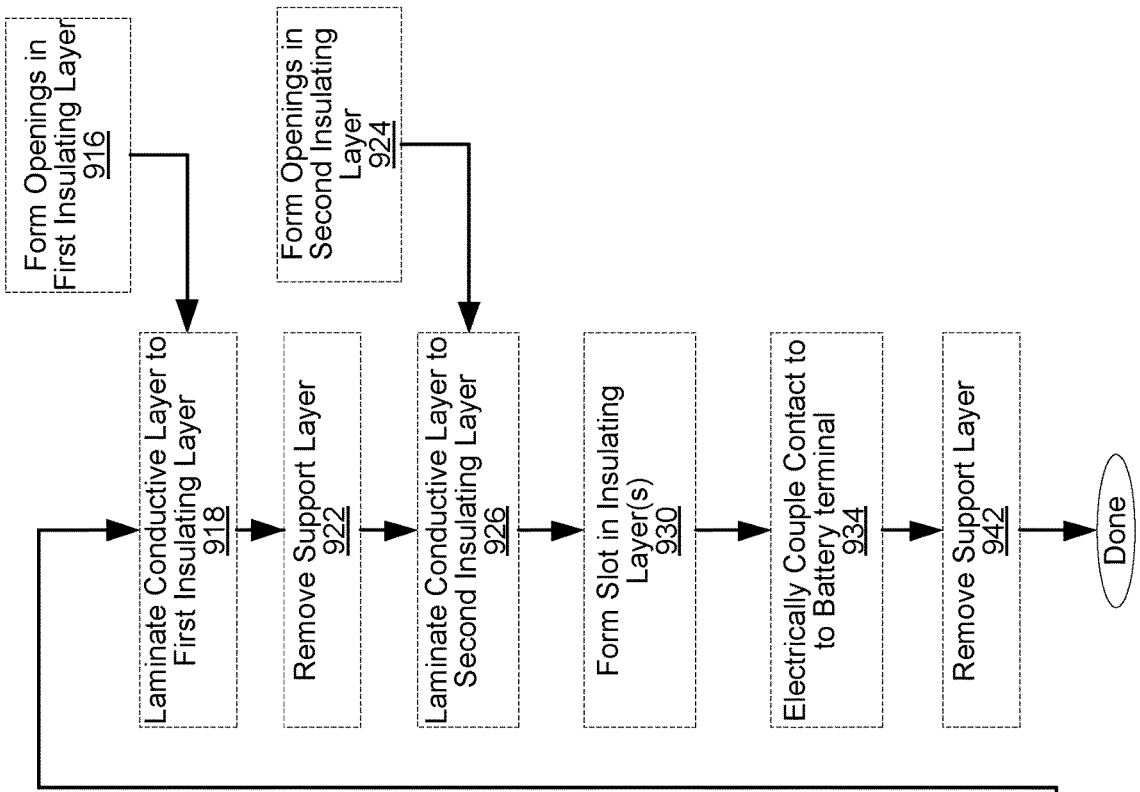
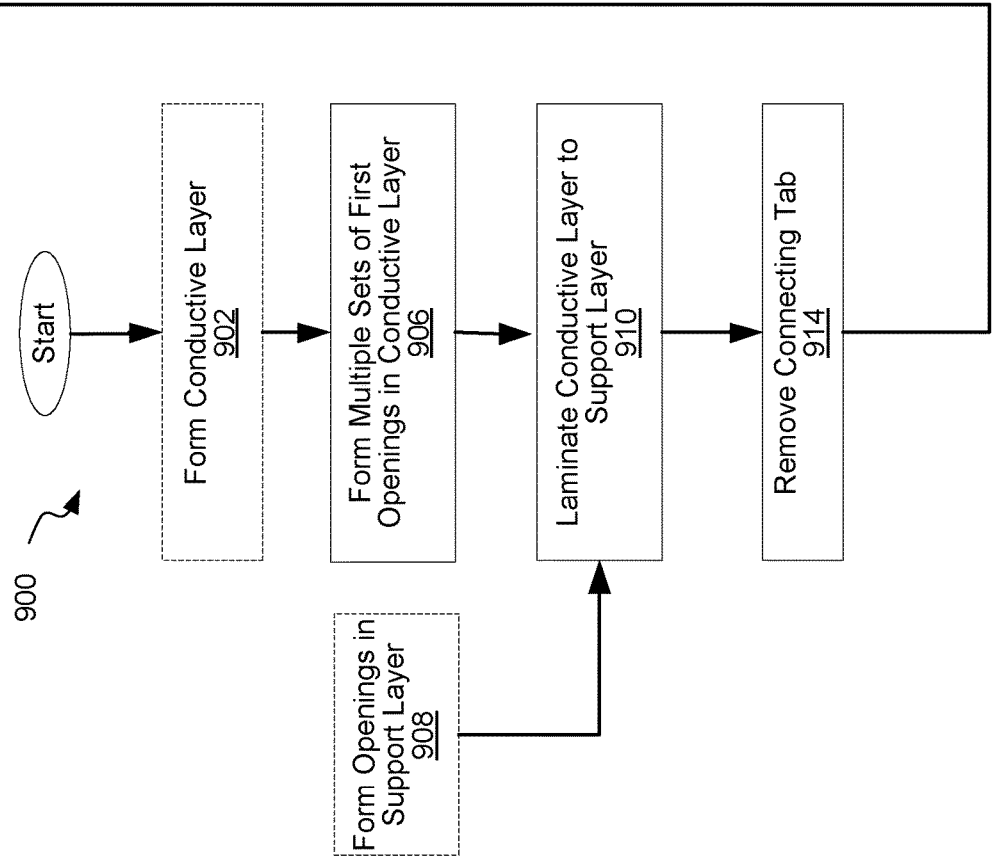
FIG. 9

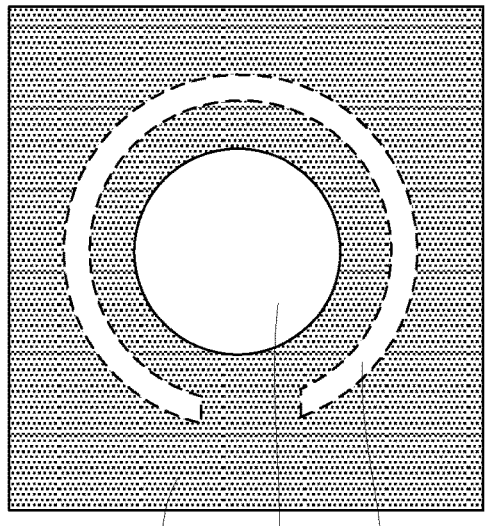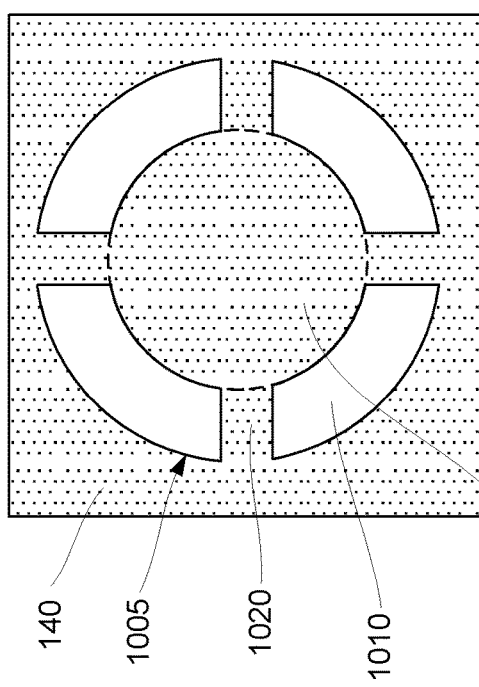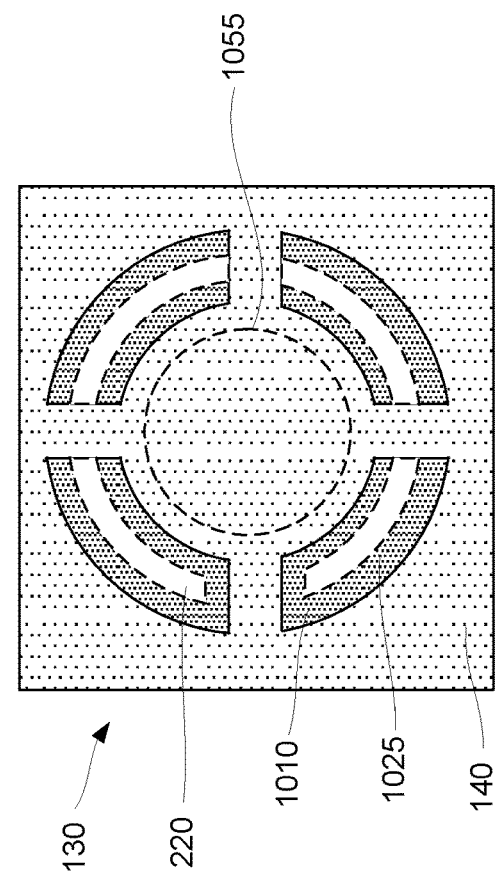
FIG. 11A
FIG. 11B
FIG. 11C

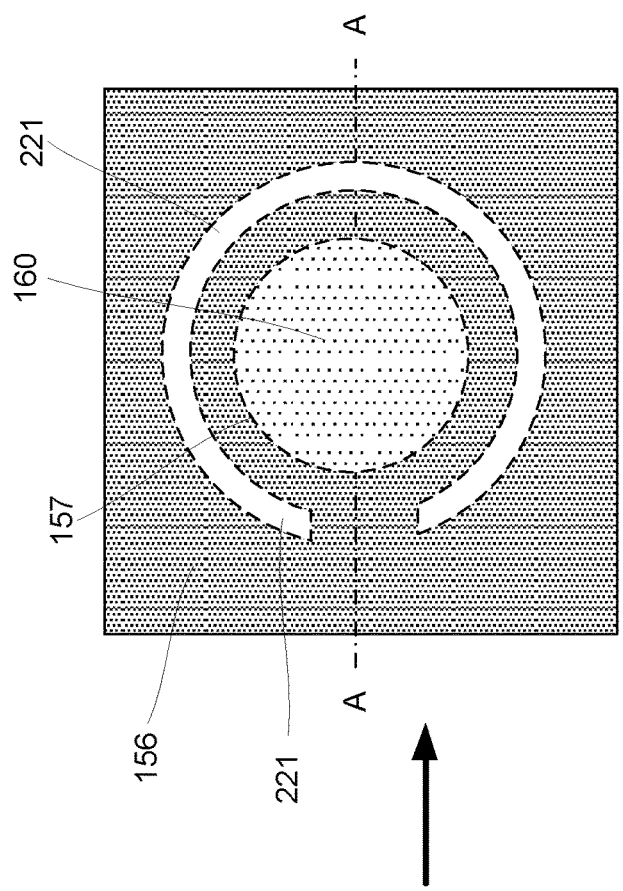
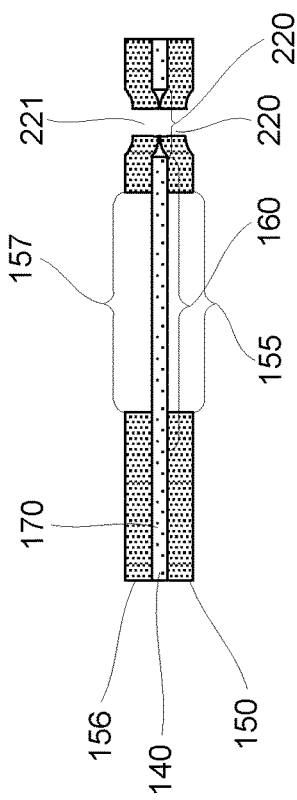
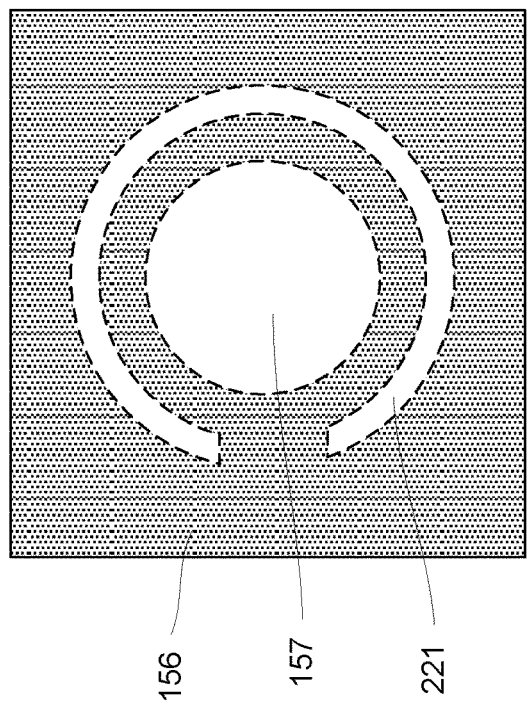
FIG. 13B
FIG. 14
FIG. 13A

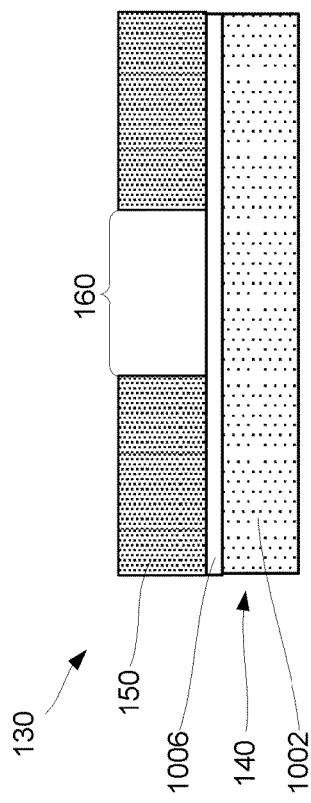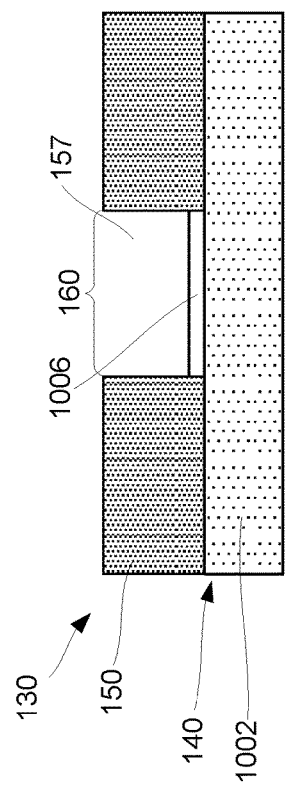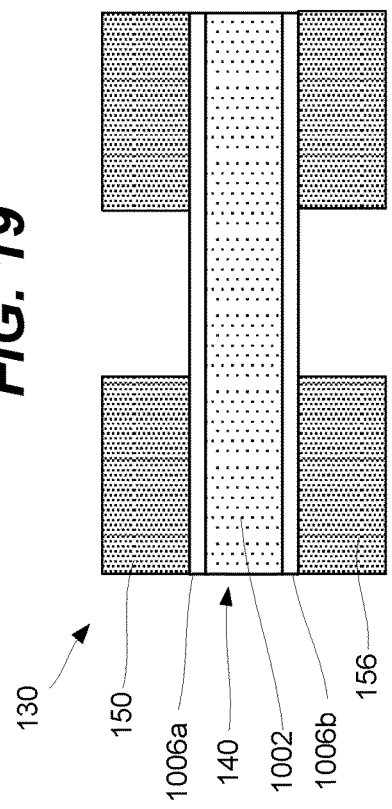

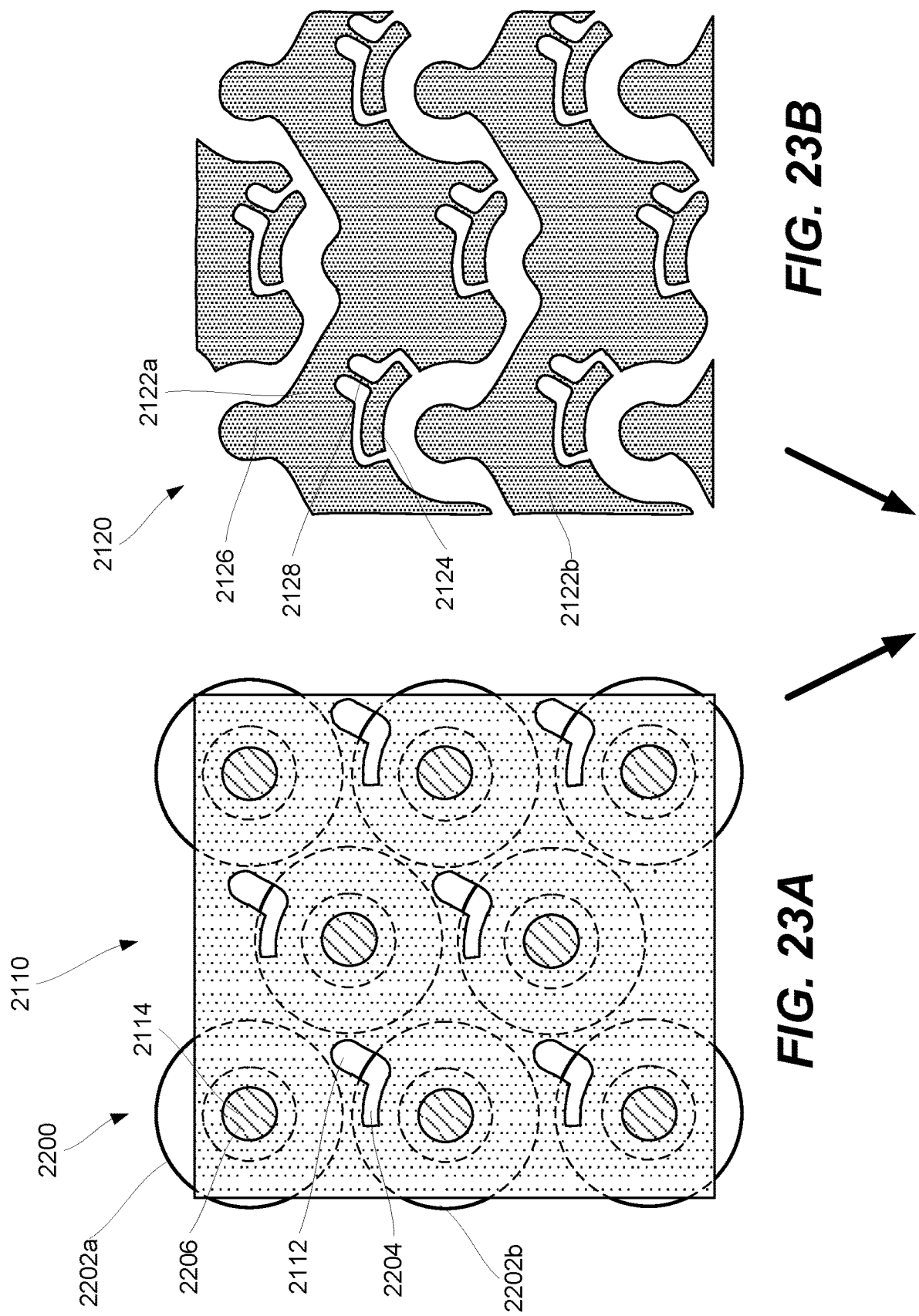

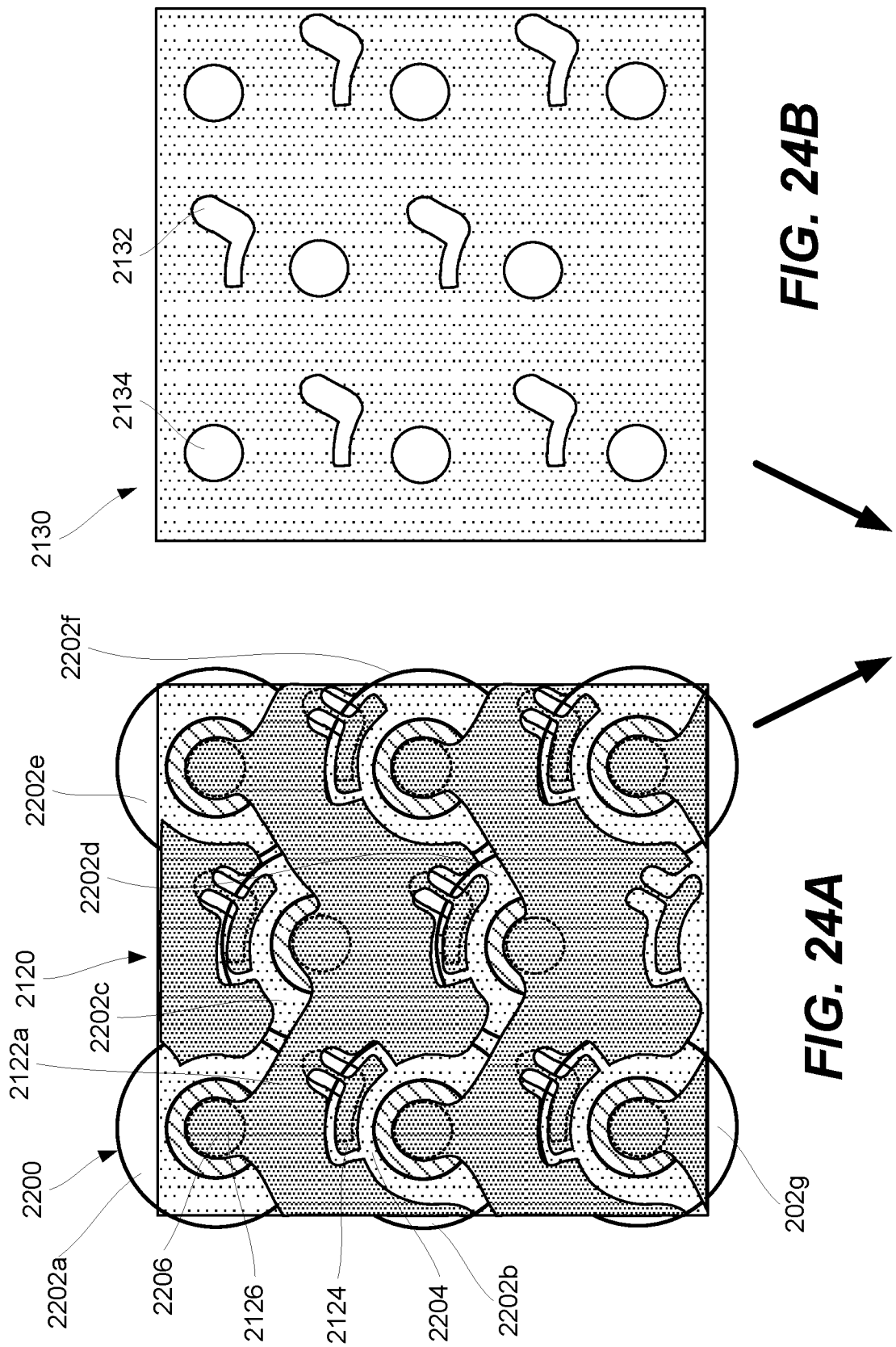

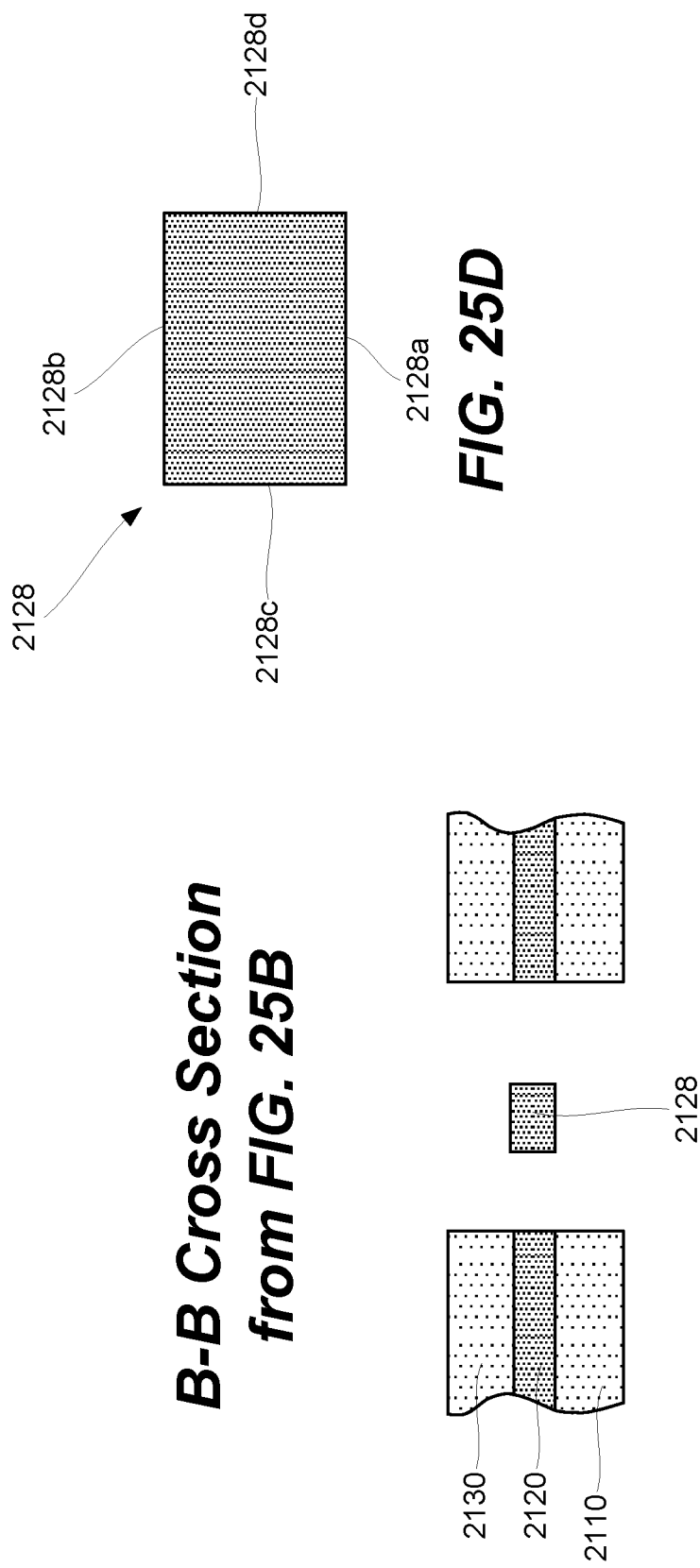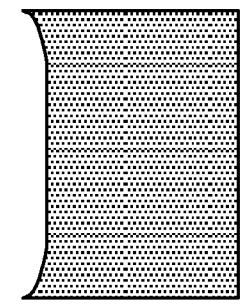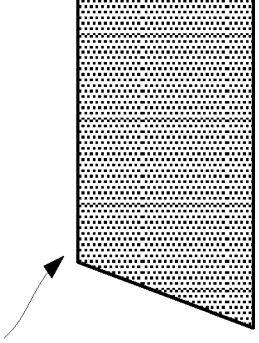

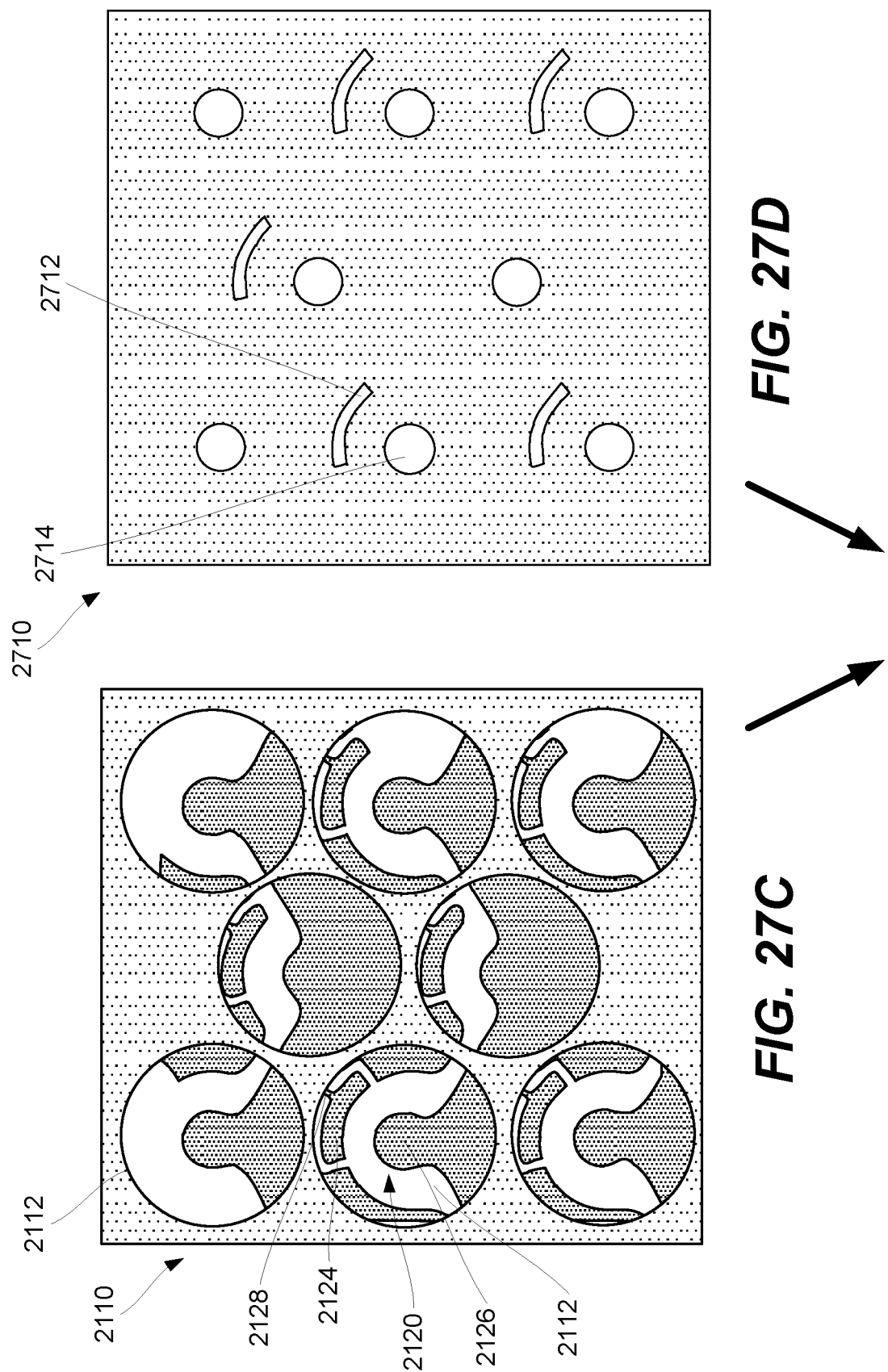

BATTERY INTERCONNECTS

CROSS-REFERENCE TO RELATED APPLICATIONS

This application is a continuation application claiming the benefit of U.S. patent application Ser. No. 16/227,472, entitled: "BATTERY INTERCONNECTS" filed on 2018 Dec. 20. U.S. application Ser. No. 16/227,472 is a continuation application claiming the benefit of U.S. patent application Ser. No. 15/289,028, entitled: "BATTERY INTERCONNECTS" filed on 2016 Oct. 7 and issued as U.S. Pat. No. 10,211,443 on 2019 Feb. 19, which claims the benefit under 35 U.S.C. § 119(e) of U.S. Provisional Patent Application 62/238,827, entitled: "BATTERY INTERCONNECTS" filed on 2015 Oct. 8 and U.S. Provisional Patent Application 62/263,076, entitled: "BATTERY INTERCONNECTS" filed on 2015 Dec. 4. Furthermore, U.S. patent application Ser. No. 15/289,028 is a continuation-in-part (CIP) application claiming the benefit of U.S. patent application Ser. No. 14/836,946, entitled: "INTERCONNECT FOR BATTERY PACKS" filed on 2015 Aug. 26 and issued as U.S. Pat. No. 9,545,010 on 2017 Jan. 10, which is a continuation of U.S. patent application Ser. No. 14/671,814, entitled: "INTERCONNECT FOR BATTERY PACKS" filed on 2015 Mar. 27 and issued as U.S. Pat. No. 9,147,875 on 2015 Sep. 29, which claims the benefit under 35 U.S.C. § 119(e) of U.S. Provisional Patent Application 62/048,404, entitled: "INTERCONNECT FOR BATTERY PACKS" filed on 2014 Sep. 10, U.S. Provisional Patent Application 62/080,971, entitled: "INTERCONNECT FOR BATTERY PACKS" filed on 2014 Nov. 17, and U.S. Provisional Patent Application 62/111,333, entitled: "INTERCONNECT FOR BATTERY PACKS" filed on 2015 Feb. 3. All of the above listed patent applications are incorporated herein by reference in their entirety for all purposes.

BACKGROUND

Rechargeable batteries represent a promising technology for providing energy storage for mobile and stationary applications. In order for the market penetration of this technology to increase, the cost of battery cells and battery packs must be decreased. While the battery cells (e.g., lithium-ion cells) have traditionally been and probably still are the most expensive components in battery packs, the cost of the battery cells is expected to decrease over time with economies of scale, new materials, and design improvements. Furthermore, the performance and lifetime of the battery cells is expected to increase, leading to new high-durability applications needing robust connections and conductors. This trend will place more emphasis on the cost, performance, and reliability of other components in battery packs, such as battery interconnects, as well as efficient methods of assembling battery packs using these components.

The electrical interconnects and battery monitoring systems (BMS) in battery packs are two areas in which performance and component costs will be focused on. Many conventional battery packs are assembled using bulky metal plates with complex features. These metal plates are used for interconnecting individual battery cells in packs and to carry current among these cells and/or terminals of the packs. The plates are frequently wired to the individual cells using separate fuse or connector wires, which are designed to protect the individual cells against over-currents and thermal runaway. These fuse wires are fragile and are prone to breakage under the stress and vibration conditions typically encountered in the field. Furthermore, each plate is typically attached to the cells as a freestanding component. This individualized assembly drives up costs and the overall complexity of manufacturing the pack, which in turn negatively impacts safety and robust performance of the battery packs.

SUMMARY

Provided are interconnects for interconnecting a set of battery cells (e.g., in battery packs), assemblies comprising these interconnects, methods of forming such interconnects, and methods of forming such assemblies using the interconnects. An interconnect includes a conductor comprising two or more portions electrically isolated from each other. At least one of these portions may optionally include two contacts for connecting to battery cells and a fuse forming an electrical connection between these two contacts. The interconnect may also include an insulator adhered to the conductor and mechanically supporting the two portions of the conductor. The insulator may include an opening such that the fuse overlaps with this opening, and the opening does not interfere with operation of the fuse (e.g., its thermal characteristics). In some embodiments, the fuse may not directly interface with any other structures thereby allowing for a more controlled operation of the fuse. Furthermore, the interconnect may include a temporary substrate adhered to the insulator such that the insulator is disposed between the temporary substrate and the conductor. The temporary substrate may be adhered to the contacts of the conductor through openings in the insulator and provide mechanical support to these contacts at least until the interconnect is used for interconnecting the battery cells, after which the temporary substrate is removed.

In some embodiments, an interconnect, used for interconnecting a set of battery cells comprises a conductor and a first insulator. The conductor comprises a first portion and a second portion electrically isolated from the first portion. The first portion optionally comprises a first contact, a second contact, and a fuse forming electrical connection between the first contact and the second contact. The first insulator is adhered to the conductor and mechanically supports the first portion and the second portion of the conductor. The first insulator optionally comprises a first opening such that the fuse overlaps with the first opening. In some embodiments, the fuse fully overlaps with the first opening.

In some embodiments, the first contact partially overlaps with the first opening. The portion of the first contact may adhere to and be supported by the first insulator. The first insulator may comprise a second opening partially overlapping with the second contact. The portion of the second contact may adhere to and be supported by the first insulator.

In some embodiments, the second portion optionally comprises a first contact, a second contact, and a fuse forming electrical connection between the first contact of the second portion and the second contact of the second portion. The fuse of the second portion may be substantially the same as the fuse of the first portion. The fuse of the second portion may overlap with an additional opening in the first insulator.

In some embodiments, the interconnect further comprises a second insulator adhered to the conductor and further mechanically supporting the first portion and the second portion of the conductor. The second insulator optionally comprises a first opening such that the fuse overlaps with the first opening. The first opening of the second insulator may overlap or even coincide with the first opening of the first insulator. In some embodiments, every opening of the second insulator coincides with a corresponding opening of the first insulator.

In some embodiments, the cross-sectional profile of the fuse with a plane normal to a principal axis of the fuse is substantially rectangular. Specifically, the angles between the top or bottom surfaces and side walls of the fuse may be between about 75° and 105°. The side walls may be substantially parallel to each other (e.g., deviating less than 15° from being absolutely parallel). In some embodiments, the surfaces and sidewalls of the fuse are exposed.

In some embodiments, the conductor comprises aluminum or, more specifically, the conductor consists essentially (e.g., greater than 95 atomic %) of aluminum. The conductor may comprise a surface coating overlapping with the first insulator. In some embodiments, a side of the conductor opposite of the first insulator is exposed.

In some embodiments, the interconnect further comprises a temporary substrate adhered to the first insulator such that the first insulator is disposed between the temporary substrate and the conductor. The temporary substrate is adhered to the first contact and the second contact of the conductor and mechanically supports the first contact and the second contact. In some embodiments, the temporary substrate comprises a first opening overlapping with the first contact and the second opening overlapping with the second contact. The surface of the first contact and the surface of the second contact of the conductor opposite of the temporary substrate may be fully exposed.

Also provided is an assembly comprising a set of battery cells and an interconnect. The interconnect comprises a conductor and a first insulator. The conductor comprises a first portion and a second portion electrically isolated from the first portion. The first portion optionally comprises a first contact, a second contact, and a fuse forming electrical connection between the first contact and the second contact. The first contact may be connected to a first terminal of a second battery of the set of battery cells. The second contact may be connected to a second terminal of a first battery of the set of battery cells. The first insulator is adhered to the conductor and mechanically supports the first portion and the second portion of the conductor. The first insulator may comprise a first opening such that the fuse overlaps with the first opening.

In some embodiments, the first insulator is disposed between the conductor and the set of battery cells. The first insulator may be adhered to the set of battery cells. The first contact may be connected to the first terminal of the second battery of the set of battery cells through the first opening in the first insulator. The second contact may be connected to the second terminal of the first battery of the set of battery cells through a first opening in the first insulator. The fuse may extend over a space between battery cells of the set and does not overlap with any of the battery cells of the set.

Also provided is a method of forming an assembly. The method comprises positioning an interconnect over a set of battery cells. The interconnect comprises a conductor, a first insulator adhered to the conductor, and a temporary substrate adhered to the first insulator such that the first insulator is disposed between the conductor and the temporary substrate. The conductor comprises a first portion and a second portion electrically isolated from the first portion. The first portion optionally comprises a first contact, a second contact, and a fuse forming electrical connection between the first contact and the second contact. The first contact and the second contact are adhered to the temporary substrate through the openings in the first insulator. The method proceeds with electrically coupling the first contact and the second contact to the set of battery cells. The first contact and the second contact may be separated from the temporary substrate while coupling the first contact and the second contact to the set of battery cells. The method also involves removing the temporary substrate from the first insulator.

In some embodiments, the set of battery cells mechanically supports the first contact and the second contact after electrically coupling the first contact and the second contact to the set of battery cells. Electrically coupling the first contact and the second contact to the set of battery cells may be performed through openings in the temporary substrate.

These and other embodiments are described further below with reference to the figures.

BRIEF DESCRIPTION OF THE DRAWINGS

FIG. 1A is a schematic illustration of battery cells arranged into a set, in accordance with some embodiments.

FIG. 1B is a schematic illustration of an insulating layer of an interconnect circuit, in accordance with some embodiments.

FIG. 1C is a hypothetical example of the insulating layer of FIG. 1B disposed over the set of the battery cells of FIG. 1A, in accordance with some embodiments.

FIG. 1D is a hypothetical example of a conductive layer (or a conductor), in accordance with some embodiments.

FIG. 2A is a schematic representation of a portion of an insulating layer having an insulating layer opening and a slot partially surrounding the insulating layer opening, in accordance with some embodiments.

FIG. 2B is a schematic representation of a portion of a conductive layer having a contact pad, in accordance with some embodiments.

FIG. 2C is a schematic representation of a portion of an interconnect circuit having the conductive layer of FIG. 1B and the insulating layer of FIG. 1A, in accordance with some embodiments.

FIG. 5A is a plan-view schematic diagram of a set of prismatic battery cells arranged into a linear array, in accordance with some embodiments.

FIG. 5B is a plan-view schematic diagram of the set of prismatic battery cells of FIG. 5A further illustrating an interconnect circuit disposed over the cells, in accordance with some embodiments.

FIGS. 5F and 5G are side-view schematic diagrams of adjacent battery cells interconnected using interconnects, in accordance with some embodiments.

FIG. 6A is a plan-view schematic diagram of a set of prismatic battery cells arranged into a linear array, in accordance with some embodiments.

FIG. 6B is a plan-view schematic diagram of the set of prismatic battery cells of FIG. 6A further illustrating an interconnect circuit disposed over the cells, in accordance with some embodiments.

FIG. 7A is a side-view schematic diagram of an interconnect circuit including a slot with a battery terminal protruding through the slot for making an electrical connection to the opposite side of the interconnect circuit, in accordance with some embodiments.

FIG. 7B is a plan-view schematic diagram of the interconnect circuit and the battery terminal of FIG. 7A, in accordance with some embodiments.

FIG. 7C is a side-view schematic diagram of another interconnect circuit with a conductor folding around a battery terminal for making an electrical connection between the two, in accordance with some embodiments.

FIG. 7D is a side-view schematic diagram of another interconnect circuit with a conductor forming an electrical connection to a battery terminal, in accordance with some embodiments.

FIG. 8A is a plan-view schematic diagram illustrating a set of battery cells arranged into two columns, in accordance with some embodiments.

FIG. 8B is a plan-view schematic diagram illustrating an insulating layer disposed over the set of battery cells of FIG. 8A, in accordance with some embodiments.

FIG. 9 is a process flowchart corresponding to a method of forming an interconnect circuit for interconnecting battery cells in a battery pack, in accordance with some embodiments.

FIG. 11A is a schematic representation of a portion of a conductive layer having a contact pad, in accordance with some embodiments.

FIG. 11B is a schematic representation of a portion of a support layer having openings, in accordance with some embodiments.

FIG. 11C is a schematic representation of a portion of an interconnect circuit having the conductive layer of FIG. 11A and the support layer of FIG. 11B, in accordance with some embodiments.

FIG. 13A illustrates a top schematic view of an example of a second insulating layer prior to laminating this insulating layer to a conductive layer.

FIG. 13B illustrates a top schematic view of an example of a second insulating layer after to laminating this layer to a conductive layer.

FIG. 14 illustrates a side cross-sectional schematic view of an interconnect circuit having two insulating layers and a conductive layer disposed between these insulating layers.

FIGS. 18-20 are side-view schematic diagrams illustrating different examples of interconnects having different positions of conductor's surface sublayers relative to insulators, in accordance with some embodiments.

FIG. 23A illustrates a hypothetical orientation of an insulator of an interconnect (the insulator still shown as a standalone component) relative to the battery cell set of FIG. 22A, in accordance with some embodiments.

FIG. 23B illustrates a conductor (shown as a standalone component), in accordance with some embodiments.

FIG. 24A illustrates a stack of first insulator and a conductor disposed over the battery cell set, in accordance with some embodiments.

FIG. 24B illustrates an additional insulator (shown as a standalone component), in accordance with some embodiments.

FIG. 25C is a cross-sectional view of the assembly portion of FIG. 25B illustrating position of the fuse relative to other components, in accordance with some embodiments.

FIGS. 25D-25F are cross-sectional views of different examples the fuse, in accordance with some embodiments.

FIG. 27C illustrates an example of a stack of the conductor and the insulator, in accordance with some embodiments.

FIG. 27D illustrates an example of a temporary substrate having openings for accessing the conductor during installation of the interconnector, in accordance with some embodiments.

DETAILED DESCRIPTION

Figure 1E:
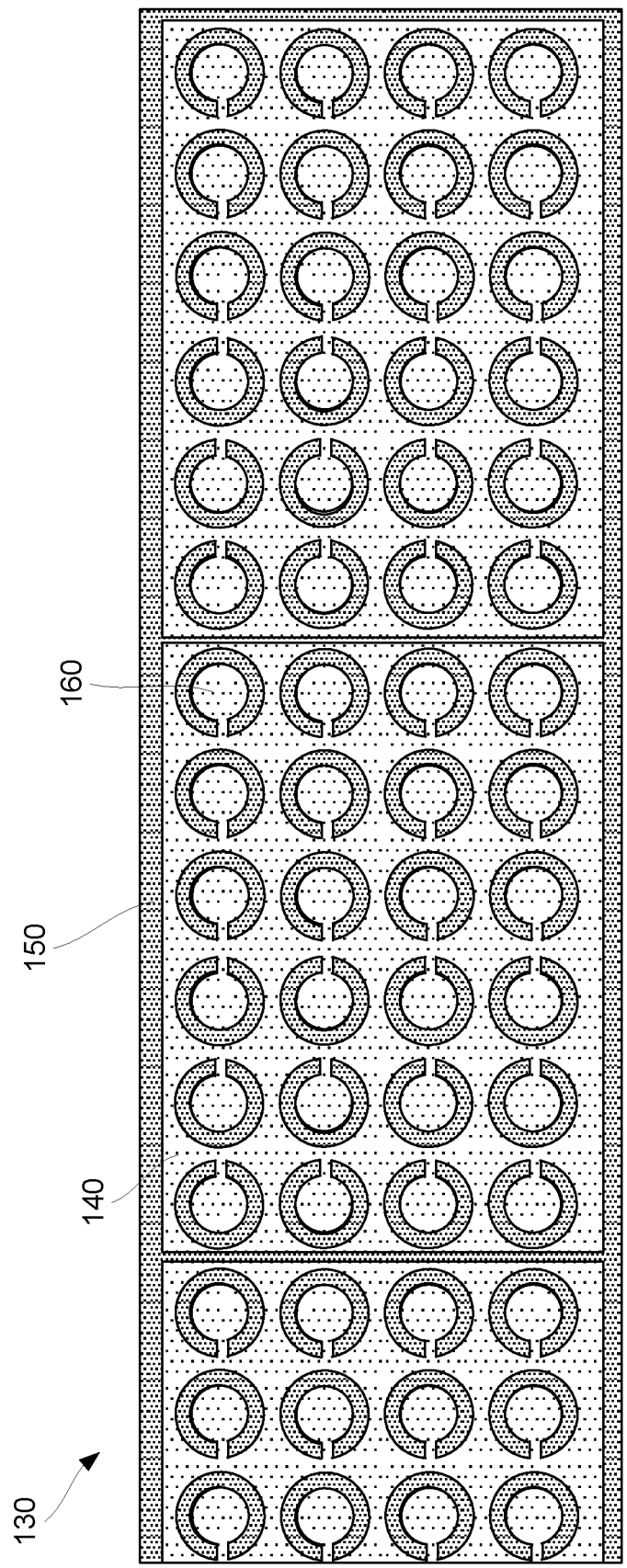
FIG. 1E is a schematic illustration of an interconnect circuit showing the conductive layer of FIG. 1D disposed over the insulating layer of FIG. 1B, in accordance with some embodiments.

The ensuing detailed description of embodiments of this disclosure will be better understood when read in conjunction with the appended drawings. As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

Introduction

Many modern battery packs include multiple cells that need to be interconnected. For example, the Model S (manufactured by Tesla Corporation in Palo Alto, CA) has thousands of cylindrical battery cells (e.g., 18650 cells). The success of many battery applications often depends on robust, reliable, and inexpensive interconnects between battery cells in such packs. Some interconnects use rigid metal plates connected to cell terminals and that extend across multiple battery cells. While these plates can transmit large currents and can be used for mechanical support, these plates can be expensive to manufacture and to connect to the battery cell terminals. Furthermore, the rigidity of these plates may often interfere with relative motion between the battery cells and plates, potentially resulting in the loss of electrical connections between these components.

Flexible interconnect circuits can provide more reliable electrical connections and, in some cases, may be easier to manufacture, connect to cell terminals, and fit into battery packs. The flexible circuits may also provide electrical current fusing functionality as further described below. Yet, some flexible circuits have other limitations. For example, printed circuits are generally limited to low current applications because of small conductive layer thicknesses. In these circuits, the thickness of conductive elements is limited by mask-and-etch capabilities, which are generally not suitable for high aspect ratio features and thick conductors. Furthermore, the prolonged etching needed for thicker layers drives up the production cost of the flexible circuit. At the same time, many modern battery cells and packs are capable of operating at currents on the order of 10-200 A, such as during a rapid charge or a rapid discharge. This, in turn, necessitates the use of thick conductive layers (e.g., a thickness of between 70-1000 micrometers) to provide sufficient conductivity.

In addition, the extra conductor thickness (required to carry large currents) makes it difficult to form fuses or fusible links from these conductors with controlled cross-sectional areas. A fusible link may be used to break the electrical connection to a battery cell when the current through the link exceeds a certain threshold controlled, in part, by the dimensions of this fusible link. When forming a fusible link by etching a thick conductor, it may be difficult to mask and etch a controlled narrow trace and maintain a uniform width of the fuse (the width being measured within a principal plane of conductor). For etching, the minimum width-to-thickness ratio (which may be referred to an aspect ratio) is typically four or even five, to avoid excessive undercutting associated with etching. For example, when a 140-micrometer thick conductive layer is used to form fusible links using etching, the resulting width of about 560-700 micrometers may be excessive for some fusing applications. Furthermore, forming a fusible link that does not contact any other components is generally not possible with etching sine the back side has to be protected from etchant. At the same time, any physical contact with the fusible link (other than with remaining portions of the conductor) is not desirable and interferes with thermal characteristics of the fusible link.

Interconnects described herein address various deficiencies of conventional interconnects described above. In some embodiments, an interconnect, described herein, includes a conductor and one or more insulators. For purposes of this disclosure, the term "interconnect" is used interchangeably with "interconnect circuit", "conductor" with "conductive layer", and "insulator" with an "insulating layer." One or both insulators may have openings for coupling the conductor to battery cell terminals. The conductor may be patterned with openings defining contact pads or some other features. Each contact pad may be used for connecting to a different battery cell terminal. In some embodiments, each contact pad is attached to the rest of the conductive layer by a fusible link. The fusible link is formed from the same conductive layer as the contact pad (e.g., each portion of the conductor including the first and second contacts and the fusible link may monolithic). The fusible link controls the current flow to and from this contact pad and breaks when the current exceeds a set threshold.

In some embodiments, the conductor may include a base sublayer and a surface sublayer. It should be noted that the base sublayer and the surface sublayer may extend the entire surface of the conductor and be a part of the first and second contacts and the fusible link. The composition of the surface sublayer may be selected such that it is more capable of forming mechanical connections (e.g., to battery cell terminals and insulating layers) and electrical connections (e.g., to battery cell terminals) than the base sublayer. The base sublayer may be used for mechanical support and conducting most of the electrical current through the conductive layer. As such, the thickness of the base sublayer may be substantially greater (e.g., between about 5 and 10000 times greater) than the thickness of the surface sublayer. For example, the base sublayer may include aluminum, while the surface sublayer may include tin, lead, zinc, nickel, silver, palladium, platinum, gold, indium, tungsten, molybdenum, chrome, copper, and alloys thereof.

Also provided are methods of forming interconnect circuits as well as connecting these circuits to the battery cells. The method may involve forming a conductive layer, such as forming a surface sublayer on a base sublayer. The method may also involve forming one or more first openings in the conductive layer. It should be noted that different openings in the conductive layers may be formed during two different operations. Specifically, first conductive layer openings are formed during the first operation, while second conductive layer openings are formed during a separate operation. In between these two operations, a support layer may be laminated to the conductive layer to provide support to and maintain registration between various features of the conductive layer, for example, when the second conductive layer openings are formed. If the support layer is later removed, then this support layer may be referred to as a temporary support layer. Otherwise, the support layer may become a permanent component of the interconnect. It should also be noted that when the first conductive layer openings are formed, these structures are well supported by connecting tabs that remain in the conductive layer following the formation of the first conductive layer openings. Some or all of these connecting tabs are later removed during the second operation.

Examples of Interconnect Circuits and Battery Packs

In some embodiments, an interconnect circuit described herein may be used to electrically connect a set of battery cells having different terminals on opposing sides of the cells. For example, a cylindrical battery cell may have one terminal (e.g., a positive terminal) on one end of the cylindrical shape and another terminal on the opposite end. The connections between batteries in the set may be in series, parallel, or various combinations of series and parallel connections. Furthermore, the same interconnect circuit may be used to interconnect different sets of battery cells.

An example of battery cells 100 arranged into set 101, which may be also referred to as an array or a group, is shown in a plan view in FIG. 1A. Specifically, FIG. 1A illustrates battery cells 100, which may be cylindrical cells having different polarities on their top sides and bottom sides of cells 100. These sides may be referred to as positive sides and negative sides. Depending on the orientation of each cell 100 in set 101, the top surface of set 101 may be formed all positive sides, all negative sides, or various combinations of positive sides and negative sides. In some embodiments, set 101 may include two or more subsets such that orientation of cells 100 in each subset is the same. For example, FIG. 1A illustrates set 101 having five subsets with twelve cells in each subset. Subsets 110 and 120 are specifically identified in this figure. In subset 110, all cells have their positives sides facing up. On the other hand, in subset 120, all cells have their negative sides facing up. When arranged into a battery pack, cells 100 in each of subsets 110 and 120 may be connected in parallel (at least within the respective subset). At the same time, subsets 110 and 120 may be interconnected in series. These connections may be formed by the same interconnect circuit as further described below. One having ordinary skill in the art would understand that various other orientations of the cells and interconnection schemes are possible. In some embodiments, battery cells 100 are lithium-ion, lithium polymer, nickel metal hydride, nickel cadmium, lead acid, or other rechargeable cells. The form factor of battery cells 100 may be 10180, 10280, 10440 ("AAA cells"), 14250, 14500 ("AA cells"), 14650, 15270, 16340, 17340 ("R123 cells"), 17500, 17670, 18350, 18500, 18650, 19670, 25500 ("C cells"), 26650, and 32600 ("D cells"), or custom-geometry cells. Other types of battery cells are also within the scope. Some additional examples are described below with reference to FIGS. 5A, 8A, and 8H.

Battery cells 100 arranged as set 101 may be interconnected by the same interconnect circuit. An interconnect circuit includes at least a conductive layer and insulating layer. FIG. 1B illustrates insulating layer 150 of the interconnect circuit, in accordance with some embodiments. Insulating layer 150 includes insulating layer openings 155, which may be aligned with the terminals of the battery cells when the interconnect circuit is connected to these cells. As such, the locations of openings 155 may depend on the locations of the cells in the battery pack or, more specifically, on the locations of the cell terminals. The size of openings 155 may be sufficient for the cell terminals to protrude into openings 155 in order to make electrical connections to the conductive layer. In some embodiments, the size of openings 155 is between 25% and 250% of the diameter of cells 100 or, more specifically, between 50% and 150%. The shape of openings 155 may be similar to the shape of the cell terminals protruding through openings. Openings 155 may be formed prior to laminating insulating layer 150 to the conductive layer as further described below. Openings 155 may be formed using techniques including, but not limited to, punching, flat bed die cutting, match-metal die cutting, male/female die cutting, rotary die cutting, laser cutting, laser ablation, waterjet cutting, machining, or etching. In some embodiments, insulating layer 150 has additional openings that are used to improve the flexibility of insulating layer 150, e.g., bending in particular directions. These additional openings may be in the form of slots, slits, and the like, for example, as further described below with reference to FIGS. 2C and 2D.

The thickness of insulating layer 150 may be between 1 micrometer and 500 micrometers or, more specifically, between 10 micrometers and 125 micrometers. In some embodiments, insulating layer 150 includes an adhesive sublayer disposed on one or both surfaces. For example, the adhesive sublayer may form a surface of insulating layer 150 that is later laminated to the conductive layer. In some embodiments, the surface of insulating layer 150 facing battery cells includes an adhesive sublayer for bonding to the battery cells.

Insulating layer 150 provides electrical isolation and mechanical support to the conductive foil layer and, in some embodiments, other layers of the interconnect circuit. In some embodiments, insulating layer 150 may initially be processed in sheet or roll form and may subsequently be laminated to the conductive layer using, for example, adhesive material. Insulating layer 150 may include, but is not limited to, polyimide (PI), polyethylene naphthalate (PEN), polyethylene terephthalate (PET), polymethyl methacrylate (PMMA), ethyl vinyl acetate (EVA), polyethylene (PE), polyvinyl fluoride (PVF), polyamide (PA), or polyvinyl butyral (PVB). The composition and thickness of insulating layer 150 may be chosen to minimize distortion of openings 155 and features of the conductive layer further described below (such as contact pads). This distortion may occur during fabrication of the interconnect circuit, during connection of the interconnect circuit to the battery cells, and/or during operation of the battery pack. Specifically, insulating layer 150 may help ensure that each contact pad of the conductive layer is properly aligned with a battery cell.

In some embodiments, the interconnect circuit includes a second insulating layer as further shown and described with reference to FIGS. 13A-13B and FIG. 14 as well as other figures. In these embodiments, the conductive layer is disposed between the two insulating layers. When connected to battery cells, the first insulating layer may be disposed between the cells and conductive layer. The second insulating layer, if present, may be used provide the electrical isolation of the conductive layer from the other elements of the battery pack and separated from the batter cells by the conductive layer. In some embodiments, the second insulating layer may be patterned with openings to allow electrical, optical, and/or mechanical access to the top of the contact pads or other outer surfaces of the conductive layer. For example, the second insulating layer may be patterned with openings above the contact pads to provide access to the contact pads during the attachment of the contact pads to terminals of the battery cells as shown in FIG. 14 and further described below with reference to this figure. This access may help simplify mechanical joining processes including, but not limited to, laser, resistive, or ultrasonic welding.

Furthermore, the second insulating layer may include an adhesive sublayer or, more specifically, a patterned adhesive sublayer in order to bond the interconnect circuit to other components of the battery pack, such as a supporting frame of the battery cells, heat sink, and the like. In some embodiments, this adhesive sublayer uses mechanical pressure, heat, UV activation, and the like. In addition, adhesive sublayer and/or second insulating layer may be thermally conductive so as to promote heat transfer from (or to) the battery cells. In some embodiments, the second insulating layer is an adhesive layer, such as a thermally conductive pressure sensitive adhesive (PSA). In this embodiments, the second insulating layer provides both mechanical (adhesive) connection, electrical insulation, and thermal conductivity.

FIG. 1C is a hypothetical example of insulating layer 150 disposed over set 101 of cells 100. The conductive layer is not show in FIG. 1C to provide better understanding of the orientation between insulating layer 150 and cells 100. Specifically, each cell terminal is aligned with one of insulating layer openings. The example is hypothetical because insulating layer 150 is generally laminated to the conductive layer before the interconnect circuit is connected to cells 100. After the connection is made, insulating layer 150 is disposed between cells 100 and the conductive layer. The electrical connections are made (between cells 100 and the conductive layer) through insulating layer openings 155.

FIG. 1D is a hypothetical example of conductive layer 140. The example is hypothetical because conductive layer 140 having formed features, such as contact pads 160 and fusible links 170, is generally supported by a support layer. The support layer be a temporary support layer, (e.g., a releasable liner that is later removed) or an insulating layer (that becomes a part of the interconnect). As shown in FIG. 1D, conductive layer 140 includes contact pads 160. In some embodiments, contact pads 160 have a shape of electrically-isolated areas connected to the rest of conductive layer 140 by fusible link 170. Fusible links 170 may be configured to minimize the path length for electrical current traversing the foil islands. For example, fusible links 170 may be oriented towards the subset to which it is connected in series. FIG. 1D illustrates one example of orientations of fusible links 170. One having ordinary skill in the art would understand that various other orientations are possible, such as an orientation to achieve the most uniform distribution of the current within conductive layer 140.

FIG. 1D illustrates conductive layer 140 having three different portions or islands 142a, 142b, and 142c, which are electrically isolated from each other. However, all components of each island 142a, 142b, or 142c are electrically interconnected within this islands. In fact, all components of each island 142a, 142b, or 142c may be monolithic.

Each of 142a, 142b, and 142c may be electrically connected to battery pack terminals through leads and/or through the battery cells. While conductive foil islands 142a, 142b, and 142c are depicted having a rectangular shape in FIG. 1D, in practice these islands may take any shape that allows the battery cells to be properly interconnected. One reason for varying the shape of these islands is reducing the resistive power loss across conductive layer 140. Another reason may be improving yield by increasing the area of contact pads 160. Another reason may be maximizing or optimizing the density of battery cells in the pack. Yet another reason may be reducing the mechanical stress within the overall interconnect circuit and/or simplifying the fabrication process of the interconnect circuit.

Conductive layer 140 may be formed from any conductive material that is sufficiently conductive (e.g., a conductivity being greater than $10^6$ S/m or even greater than $10^7$ S/m) to allow for current flow through the foil with low power loss. As a percentage of the total power output from the battery pack, the resistive power loss incurred within conductive layer tends to increase in proportion to the square of the number of columns (as shown FIG. 1A) of battery cells in each subset. To minimize this power loss while allowing for a sufficiently large number of cell columns (as may be determined by other design constraints of the battery pack), in some embodiments conductive layer 140 includes copper and has a thickness of between approximately 35 and 350 micrometers. Alternatively, to reduce cost and weight relative to copper (e.g., for an equivalent conductance), conductive layer 140 may include aluminum or aluminum alloy with a thickness ranging from 50 to 2000 micrometers. The use of aluminum instead of copper may also help with lowering the minimum achievable fuse current rating due to the higher resistivity and lower melting temperature of aluminum relative to copper. As such, forming fusible links in an aluminum conductive layer may allow for more precise control of the fusible parameters.

In some embodiments, conductive layer 140 may be a relatively thick layer in order to minimize resistive power loss. For example, for cylindrical cells which may have a maximum short duration current of 20 A, a cell column-to-column spacing of about 30 millimeters, and in which it is desirable to connect six columns of cells in parallel by a single aluminum portion of conductive layer, the thickness of this layer maybe at least 250 micrometers to prevent the maximum power loss in the layer from exceeding 1% of the total array power. When copper is used for conductive layer 140 in otherwise the same example, the thickness may be about 160 micrometers. Similarly, for prismatic battery cells which may have a maximum short duration current of 300 A, a cell column-to-column spacing of 8 millimeters, and with three prismatic cells connected in parallel using a single aluminum portion of conductive layer 140, the thickness of conductive layer may be about 250 micrometers to prevent the maximum power loss in the bus from exceeding 1% of the total array power.

In some embodiments, multiple layers of conductive foil may be used to provide the desired conductance between the terminals of battery cells. A single island of a thicker foil may be substantially less flexible than multiple layers of thinner foils with the same overall cross-sectional area. As such, a conductor may be a stack of multiple conductive sheets and at least unconnected portions of these sheets may be move independently from each other.

In some embodiments, conductive layer 140 may include a surface sublayer or coating for providing a low electrical contact resistance and/or improving corrosion resistance. The surface sublayer may assist with forming electrical interconnections using techniques/materials including, but not limited to, soldering, laser welding, resistance welding, ultrasonic welding, bonding with conductive adhesive, or mechanical pressure. Surface sublayers that may provide a suitable surface for these connection methods include, but are not limited to, tin, lead, zinc, nickel, silver, palladium, platinum, gold, indium, tungsten, molybdenum, chrome, copper, alloys thereof, organic solderability preservative (OSP), or other electrically conductive materials. Furthermore, the surface sublayer may be sputtered, plated, cold welded, or applied via other means. In some embodiments, the thickness of the surface sublayer may range from 0.05 micrometers to 10 micrometers or, more specifically, from 0.1 micrometers to 2.5 micrometers. Furthermore, in some embodiments the addition of a coating of organic solderability preservative (OSP) on top of the surface sublayer may help prevent the surface sublayer itself from oxidizing over time.

The surface sublayer may be used when a base sublayer of conductive layer 140 includes aluminum or its alloys. Without protection, exposed surfaces of aluminum tend to form a native oxide, which is insulating. The oxide readily forms in the presence of oxygen or moisture. To provide a long-term stable surface in this case, the surface sublayer may be resistant to the in-diffusion of oxygen and/or moisture. For example, zinc, silver, tin, copper, nickel, chrome, or gold plating may be used as surface layers on an aluminum containing base layer.

In some embodiments, conductive layer 140 is solderable. When conductive layer 140 includes aluminum, the aluminum may be positioned as the base sublayer, while the surface sublayer may be made from a material having a melting temperature that is above the melting temperature of the solder. Otherwise, if the surface sublayer melts during circuit bonding, oxygen may penetrate through the surface sublayer and oxidize aluminum within the base sublayer. This in turn may reduce the conductivity at the interface of the two sublayers and potentially cause a loss of mechanical adhesion. Hence for many solders which are applied at temperatures ranging from 150-300 C, a surface sublayer may be formed from zinc, silver, palladium, platinum, copper, nickel, chrome, tungsten, molybdenum, or gold. Additional features of various sublayers of conductive layer 140 are further described below with reference to FIG. 10A-10C.

FIG. 1E is a schematic illustration of interconnect circuit 130 showing both conductive layer 140 and insulating layer 150 disposed underneath conductive layer 140 in this view. Portions of insulating layer 150 extend outside of the boundary of conductive layer (e.g., in between the islands). Furthermore, portions of insulating layer 150 are visible through the openings in conductive layer 140 that partially surround contact pads 160.

Figure 1F:
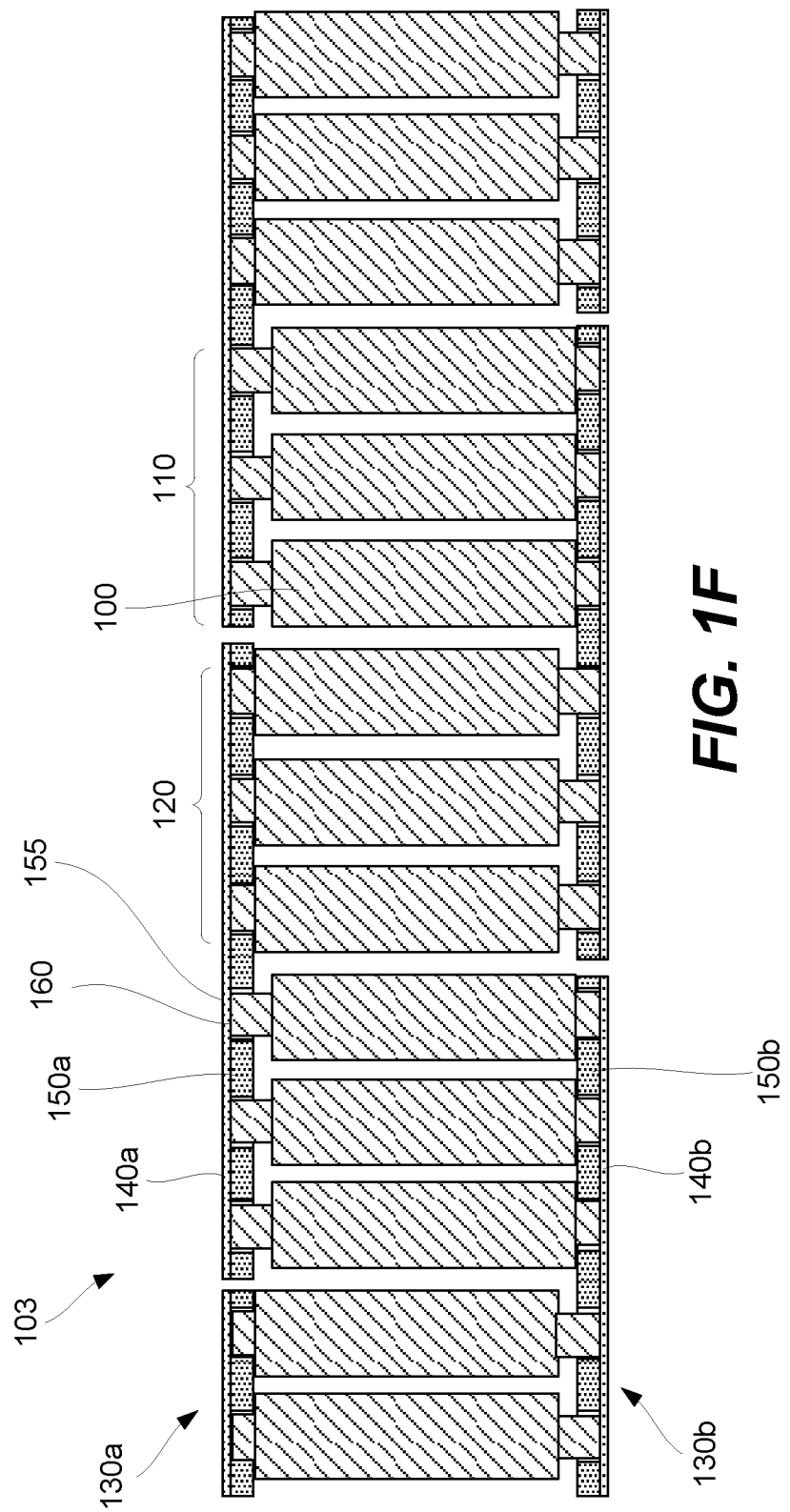
FIG. 1F is a side schematic view of a battery pack assembly including battery cells arranged into a set and two interconnect circuits connected to the battery cells, in accordance with some embodiments.

FIG. 1F is a side schematic view of battery pack assembly 103 including two interconnect circuits 130a and 130b, in accordance with some embodiments. Battery cells 100 are interconnected in parallel by interconnect circuit 130a within each one of subsets 110 and 120. Furthermore, subsets 110 and 120 are interconnected in series by interconnect circuit 130b. Interconnect circuits 130a and 130b are disposed on different sides of cells 100 and connected to different terminals of cells 100. Interconnect circuit 130a may be laterally shifted, or may have an adjusted pattern, relative to interconnect circuit 130b to allow for electrical connections within and among subsets 110 and 120. As such, a battery pack formed by a single layer of battery cells having different polarities on opposite sides may utilize two interconnect circuits, e.g., one on each side of that cell layer. As shown in FIG. 1F, insulating layer 150a is disposed between cells 100 and conductive layer 140a in interconnect circuit 130a. In a similar manner, insulating layer 150b is disposed between cells 100 and conductive layer 140b in interconnect circuit 130b. While insulating layers 150a and 150b allow forming electrical connections between cells 100 and conductive layers 140a and 140b through openings in insulating layers 150a and 150b, respectively, insulating layers 150a and 150b may protect conductive layers 140a and 140b, respectively, from contacting other parts of cells, which may be at different potentials. Alternatively, in some embodiments, battery cells may have both terminals on the same side (e.g., the side adjacent to the top cover of the battery pack). In this case, the same interconnect circuit may be used for interconnecting this layer of battery cells.

Figure 1G:
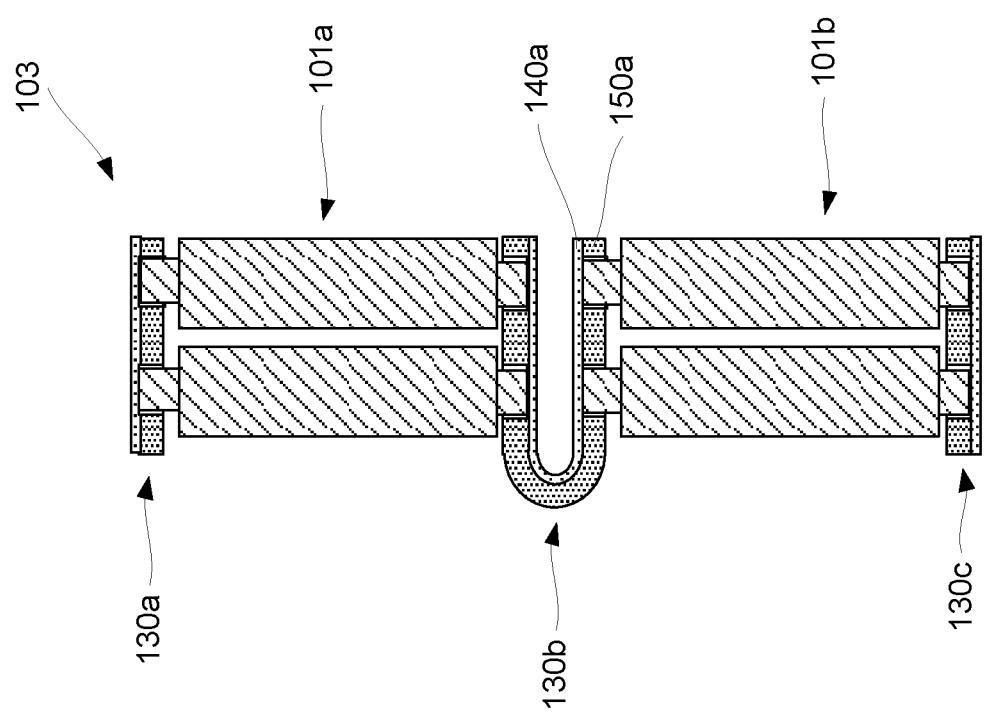
FIG. 1G is a schematic representation of another example of a battery pack assembly including two sets of battery cells interconnected using interconnect circuit, in accordance with some embodiments.

FIG. 1G is a schematic representation of another example of battery pack assembly 103 including two sets 101a and 101b of interconnected battery cells using interconnect circuit 130b. It should be noted that interconnect circuit 130b not only interconnects two sets 101a and 101b but also interconnects cells within each set. Specifically, the battery cells in set 101a are interconnected using interconnect circuit 130b and interconnect circuit 130a, while the battery cells in set 101b are interconnected using interconnect circuit 130b and interconnect circuit 130c.

Examples of Contact Pad Areas of Interconnecting Circuits

Figure 2E:
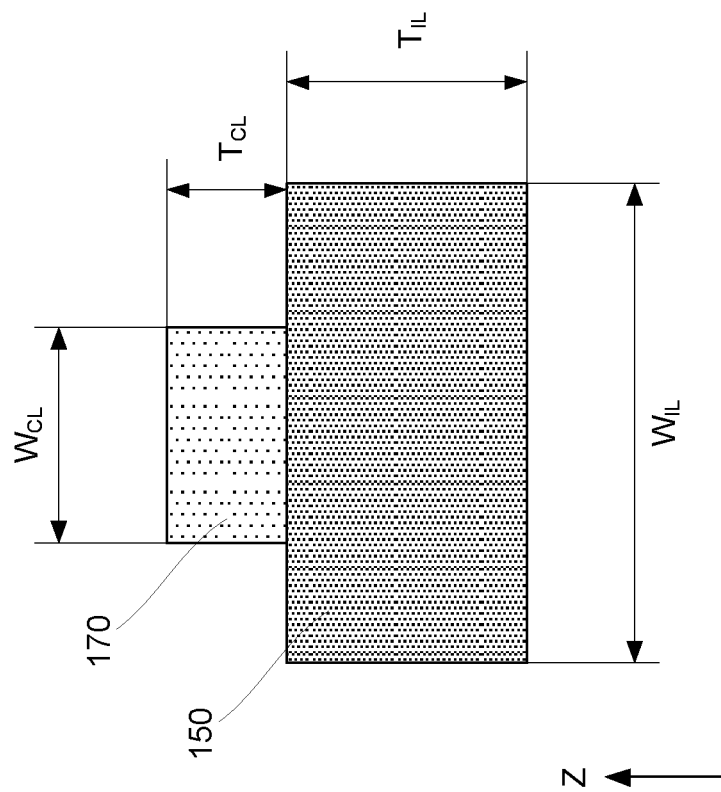
FIG. 2E is a partial cross-sectional view of a fusible link supported by an insulating layer, in accordance with some embodiments.

Specific features of conductive and insulating layers near contact pads will now be described with reference to FIGS. 2A-2H. FIG. 2A illustrates a portion of insulating layer 150 having insulating layer opening 155 and slot 220. As described above, insulating layer opening 155 is used to access the contact pad aligned with this opening during fabrication of the interconnecting circuit. Slot 220 is an optional feature and, as such, is shown with a dashed line. Slot 220 may be used to improve flexibility of a portion of insulating layer 150 around opening 155. In some embodiments, other features are used to improve this flexibility as further described below with reference to FIG. 2D.

FIG. 2B illustrates a portion of conductive layer 140 having contact pad 160, in accordance with some embodiments. In these embodiments, contact pad 160 is partially surrounded by conductive layer channel 210 that defines the boundaries of contact pad 160. Conductive layer channel 210 has a shape of a partially open ring structure. The ends of conductive layer channel 210 are separated by fusible link 170 which connects contact pad 160 with the remaining portion of conductive layer 140. Conductive layer channel 210 and fusible link 170 are optional features and, in some embodiments, contact pad 160 is not specifically defined on conductive layer as, for example, shown in FIGS. 5A-5B and further described below.

FIG. 2C illustrates a portion of interconnect circuit 130 having conductive layer 140 and insulating layer 150, in accordance with some embodiments. In this schematic plan view, conductive layer 140 is shown above insulating layer 150. A part of insulating layer 150 is visible through conductive layer channel 210. It should be noted that when slot 220 is used in insulating layer 150, this slot 220 may be disposed within the boundaries of conductive layer channel 210 as shown in FIG. 2C. This view also illustrates contact pad 160 being supported by insulating layer 150. In fact, a portion of insulating layer 150 protrudes beyond the boundaries of contact pad 160, up to slot 220 in this example. Furthermore, a portion of insulating layer 150 extends under contact pad and up to the insulating layer opening (represented by insulating layer boundary 159 shown with a dashed line in FIG. 2C since the insulating layer opening is not visible in this view).

The degree of overlap between the insulating layer opening and contact pad 160 may be such that the sufficient mechanical support is provided to the contact pad while maintaining a sufficiently large region of exposed conductive layer 140 at contact pad 160 to form electrical contacts with battery cells 100. For example, for a contact pad 160 that is 10-20 millimeters in diameter, the insulating layer boundary 159 may be located approximately 1-5 millimeters from the edge of contact pad 160.

In some embodiments, the thickness of insulating layer 150 is such that contact pad 160 can be pressed and protrude into the insulating layer opening and directly contact the battery cell terminals. In other words, a portion of contact pad 160 takes a curved (non-planar) shape that allows it to protrude into the openings. For example, insulating layer 150 may be 10-50 micrometers thick, while contact pad 160 may be about 5-20 millimeters in diameter. With dimensions in these respective orders of magnitude, it is possible for conductive layer 140 to be protruded to the plane of the battery cell terminals without tearing conductive layer 140. It should be noted that in these embodiments, the edges of contact pad 160 may remain attached to a portion of insulating layer 150 surrounding the insulating layer opening. Insulating layer 150 may also be deformed when contact pad 160 protrudes into the insulating layer opening.

In some embodiments, the insulating layer opening is sufficiently large that it does not to come into contact with the battery cell terminal. Instead, the battery cell terminal protrudes into the opening and made contact with contact pad 160. Contact pad 160 may remain substantially planar in these embodiments. For example, the size of insulating layer opening 155 may be 101-120 percent of the diameter of the terminals of the battery cells.

The shape and patterning of contact pad 160, fusible link 170, and insulating layer 150 may be modified to reduce the mechanical stress on and, in some cases, to improve the vibration resistance of fusible link 170 and electrical contacts to the battery cell terminal. For example, as shown in FIG. 2E, a portion of insulating layer 150 may be located near fusible link 170 to provide mechanical support when fusible link 170 has a small cross-sectional area (e.g., when a low fuse current rating is desired). This may help ensure that fusible link 170 remains intact during fabrication, installation, and operation. A ratio of the width of conductive layer channel 210 (the distance between the ends of slot 220-$W_{CL}$ as shown in FIG. 2E) to the width of fusible link 170 may be between about 1.5 and 100 or, more specifically, between 1.5 and 5. In other embodiments, no portion of insulating layer 150 is attached to fusible link 170 and fusible link 170 remains freestanding.

As noted above, slot 220 may be used to add flexibility to the portion of insulating layer 150 around contact pad 160. In other words, slot 220 may provide a degree of freedom of vertical and/or lateral motion of contact pad 160 relative to surrounding portions of interconnect circuit 130. This additional flexibility may help facilitate the electrical connection of contact pad 160 to the battery cell terminals and, in some cases, to reduce the level of stress on the connection.

Figure 2D:
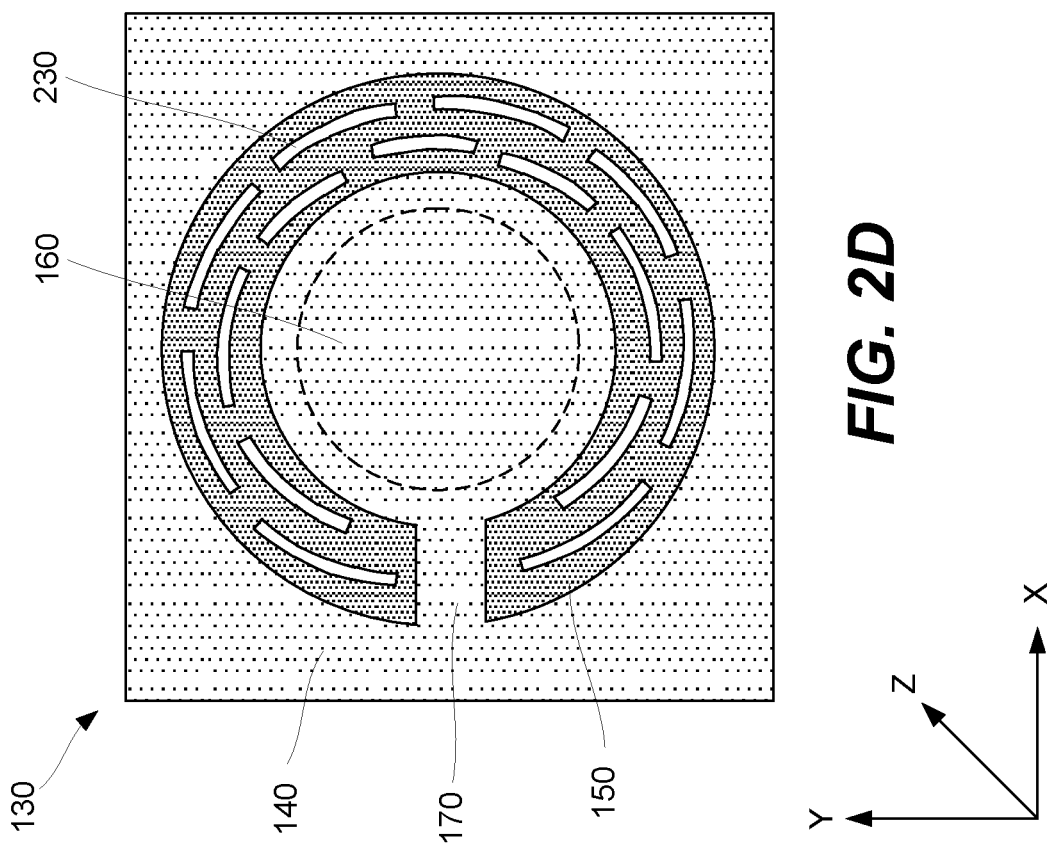
FIG. 2D is a schematic representation of another example the interconnect circuit having the conductive layer of FIG. 1B and an insulating layer having a set of slits, in accordance with some embodiments.
Figure 2G:
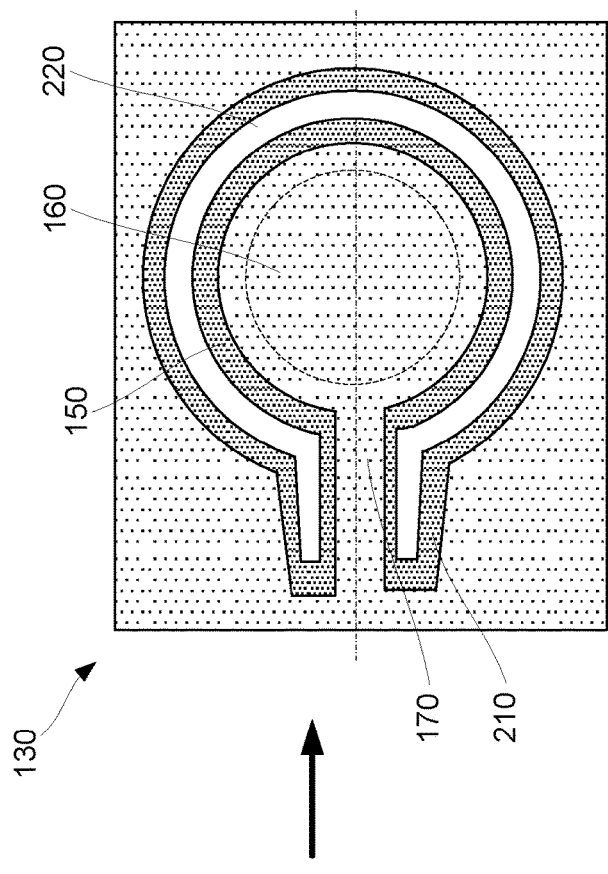
FIG. 2G is a schematic representation of the interconnect circuit of FIG. 2F at a later fabrication stage with the slot tab removed, in accordance with some embodiments.
Figure 2H:
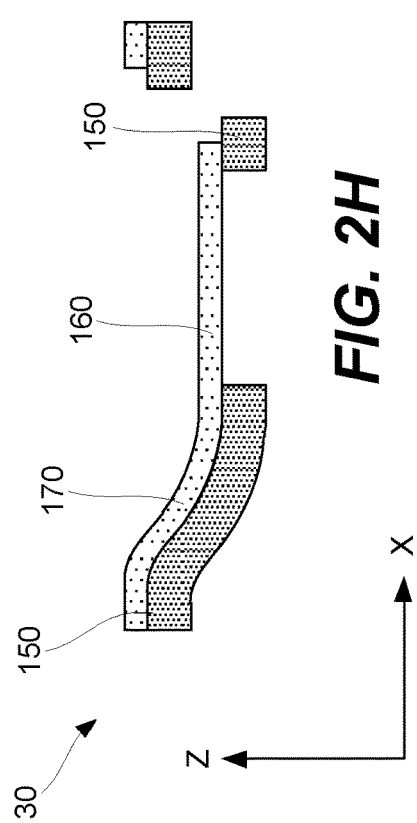
FIG. 2H is a schematic cross-sectional side view of the interconnect circuit of FIG. 2G illustrating an additional freedom for moving the contact pad, in accordance with some embodiments.

Slot 220 is an optional feature. In some embodiments, flexibility may instead be provided by a set of slits 230 that are patterned into insulating layer 150 as shown in FIG. 2D. Slits 230 may allow a sufficient degree of vertical and/or lateral motion of contact pad 160 while still maintaining proper alignment of contact pad 160 to the battery cell during fabrication of the battery pack (e.g., before the electrical connections are formed). In some embodiments, the area occupied by slits 230 may be between about 1-40% of the area of insulating layer 150 that occupies conductive layer channel 210, or more specifically, between about 5-10% of the area of insulating layer 150 that occupies conductive layer channel 210.

Figure 2F:
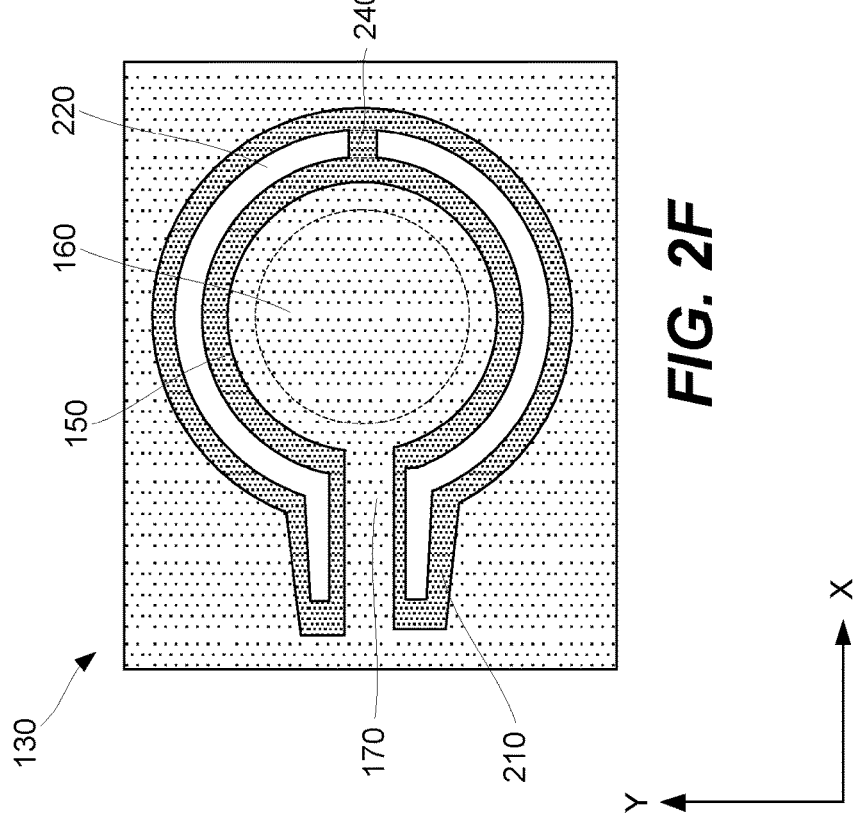
FIG. 2F is a schematic representation of an interconnect circuit during a fabrication stage with a slot tab separating two portions of the slot in the insulating layer, in accordance with some embodiments.

In some embodiments, the length (the dimension along the X axis) of fusible link 170 may be increased to provide additional freedom of relative motion between contact pad 160 and the surrounding portions of interconnect circuit 130, as shown in FIG. 2F. This provides more flexibility to contact pad 160.

FIG. 2F is a schematic illustration of interconnect circuit in a partially fabricated state with slot tab 240 separating two portions of slot 220. Slot tab 220 may be also referred to as a tearable tab as it is later removed during further processing such as using a punch. Slot tab 220 provides support to a portion of insulating layer 150, for example, while aligning contact pad 160 with respect to the battery cell terminal and even forming the electrical connection between contact pad 160 and terminal. Slot tab 220 may be removed thereafter. In some embodiments, slot tab 240 may be removed while pressing contact pad 160 toward the terminal. In fact, forcing contact pad 160 toward the terminal may tear off or through slot tab 240. Removal of slot tab 240 provides additional freedom of moving contact pad 160 as, for example, shown in FIG. 2H.

Examples of Interconnect Circuits with Voltage Monitoring Traces

Figure 3A:
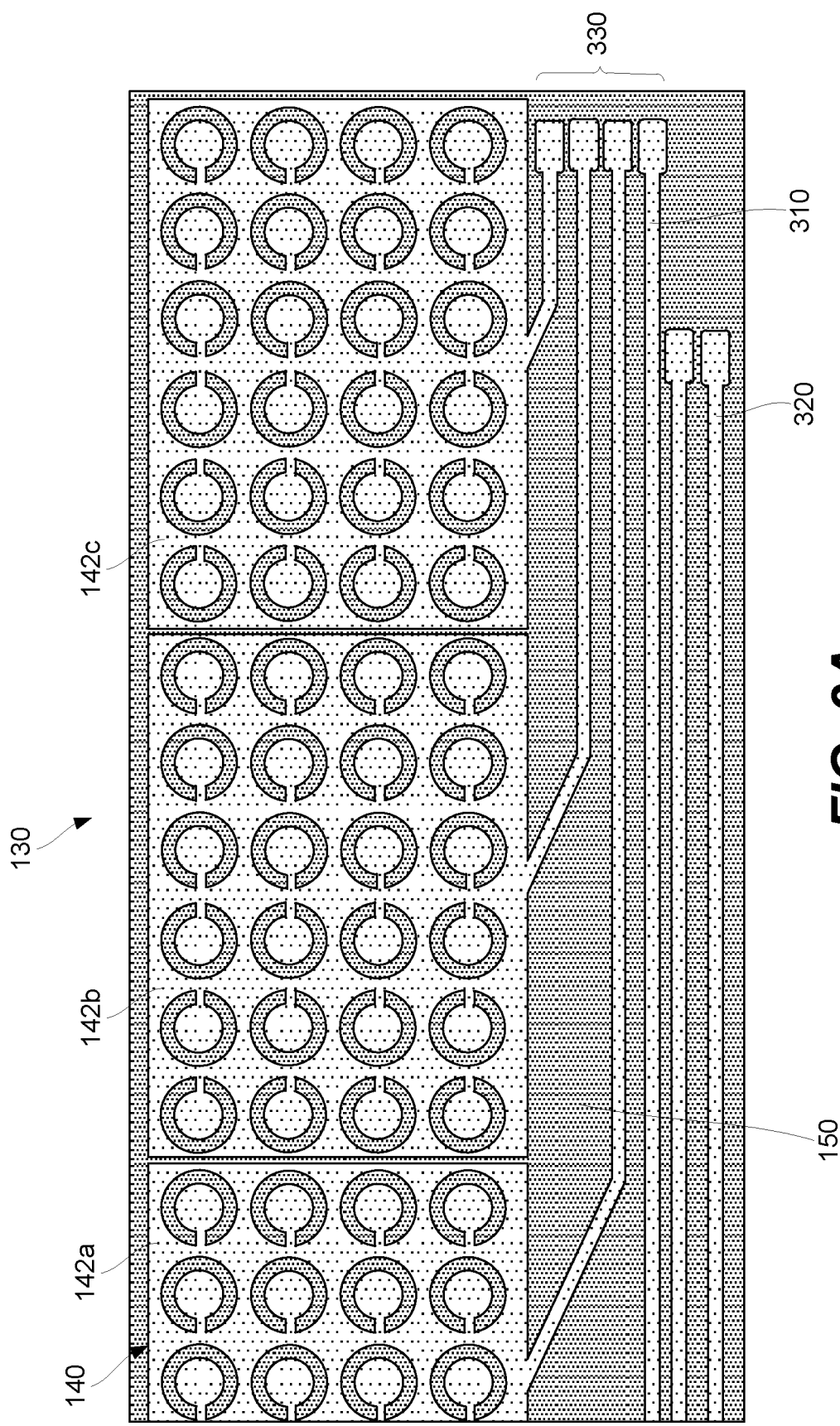
FIG. 3A is a schematic representation of one example of an interconnect circuit including voltage monitoring traces, in accordance with some embodiments.

FIG. 3A illustrates an example of interconnect circuit 130 including voltage monitoring traces 310, in accordance with some embodiments. Voltage monitoring traces 310 are also parts of conductive layer 140. Also shown are ancillary traces 320, which may be connected to other components of the battery pack, such as other islands of conductive layer, temperature monitoring devices, safety devices, and the like.

Each of voltage monitoring traces 310 is connected to a different one of islands 142*a*, 142*b*, and 142*c* of conductive layer 140. More specifically, each of voltage monitoring traces 310 and a corresponding one of islands 142*a*, 142*b*, and 142*c* form a monolithic structure. All voltage monitoring traces 310 and all islands 142*a*, 142*b*, and 142*c* may be formed from the same initial layer. Voltage monitoring traces 310 may be used to probe the voltage of islands 142*a*, 142*b*, and 142*c* during, for example, charging and discharging of the battery pack. Alternatively, voltage monitoring traces 310 may be used for any other electrical purpose involving an independent connection to individual islands 142*a*, 142*b*, and 142*c*.

Voltage monitoring traces 310 may be terminated in contact points 330 for connection to wire harnessing, fuses, surface mount components, integrated circuits, or other devices. Similarly, ancillary traces 320 may be used to connect surface mount components or other devices to interconnect circuit 130 without directly wiring the components to the power transfer circuitry. These connections may be useful for devices such as thermistors or other sensors. Voltage monitoring traces 310 and/or ancillary traces 320 may include a narrow region along the trace that is capable of acting as a built-in fuse.

In some embodiments, voltage monitoring traces 310 may be made sufficiently conductive (e.g., by modifying the trace length, width, and/or thickness) to provide a degree of power transmitting capability. Voltage monitoring traces 310 may be patterned from the same conductive sheet as islands 142*a-c* and may form monolithic structures with corresponding islands 142*a-c*. Voltage monitoring traces 310 may be used for precise control of the charge and discharge states of the battery cell sub-sets. For example, in cases of imbalanced charging or undercharging between different cell sets in the same power pack, a power IC or floating capacitors may be used to selectively route charging current through voltage monitoring traces 310 to individual sub-sets of battery cells. Electrical disconnects may optionally be provided at the battery module level to ensure the power IC is not exposed to excessively high voltage during the selective charging process. Similarly, in cases of overcharging, a power IC or shunt resistor may be used to selectively bleed charge from individual battery sub-sets via voltage monitoring traces 310.

In some embodiments, the flexible nature of interconnect circuit 130 allows folding one or more portions of the circuitry. For example, voltage monitoring traces 310 and ancillary traces 320 as shown in FIG. 3A may be folded to the side of the battery cell array within the battery pack. This folding may help to maintain or even to increase the overall energy density of the pack. Insulating layer 150 may be used to provide electrical isolation between the folded portion of interconnect circuit 130 and the packaging of the battery cells.

In some embodiments, interconnect circuit 130 may be attached or bonded to a housing or heat sink on one side of the circuit in addition to being attached to battery cells on the opposite side. For example, interconnect circuit 130 may be attached to a 0.5-5-mm-thick aluminum island to help reduce the temperature rise during operation due to joule heating in interconnect circuit 130 and/or battery cells 100. In addition, the housing and/or heat sink may be used to provide mechanical support to interconnect circuit 130. The housing and/or heat sink may be patterned with an array of holes to allow access to the battery cells (e.g., for welding or to provide ventilation paths). To provide electrical isolation between interconnect circuit 130 and the heat sink and/or housing, as described elsewhere a second insulating layer may be disposed on the opposite side of conductive layer 140 from insulating layer 150. The second insulating layer may include an adhesive sublayer to facilitate the attachment of interconnect circuit 130 to the heat sink and/or housing.

Figure 3B:
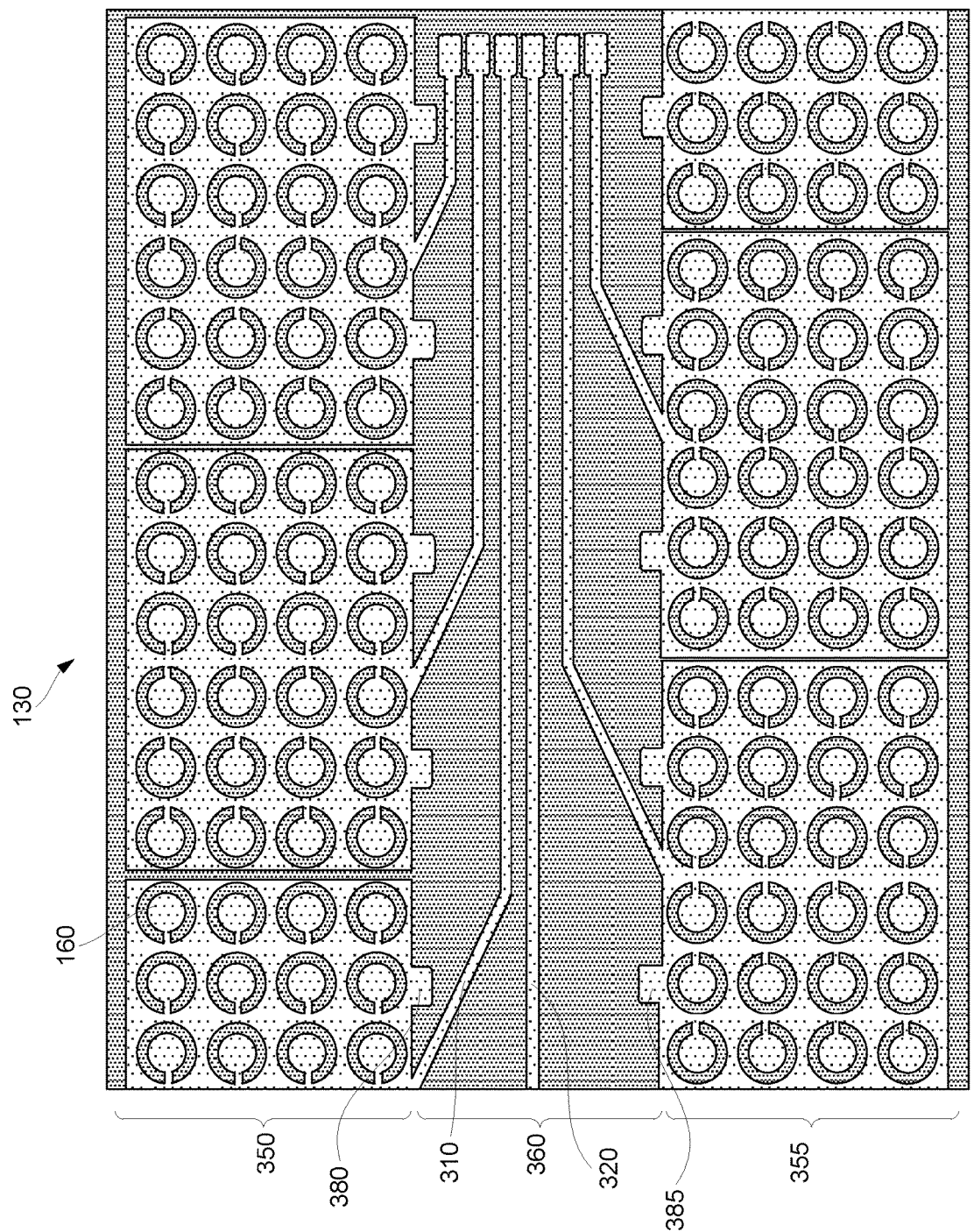
FIG. 3B is a schematic representation of another example of an interconnect circuit including voltage monitoring traces, in accordance with some embodiments.

FIG. 3B shows another example of interconnect circuit 130 that may be folded, wrapped, and/or bent, in accordance with some embodiments. This interconnect circuit 130 may be used, for example, to form electrical connection to both the positive and negative terminals of the same battery cells, when these terminals are disposed on different ends of the cells. Interconnect circuit 130 may include two sets 350 and 355 separated by middle region 360. Middle region 360 may have a width (e.g., the distance between sets 350 and 355) corresponding approximately to the length of the battery cells (e.g., 65 mm for 18650 battery cells). The patterns of contact pads 160 in each of two sets 350 and 355 may be the same. However, two sets 350 and 355 may be offset from each other to allow for a completed series-parallel connection once interconnect circuit 130 has been connected to the battery cells.

Middle region 360 of interconnect circuit 130 may be used to carry voltage monitoring traces 310 and, in some embodiments, ancillary traces 320. In some embodiments, the conductance of voltage monitoring traces 310 may be sufficiently high so as to provide a degree of power transfer capability along with monitoring capability. In addition, a mechanical separator may be used to provide space between middle region 360 and battery cells once interconnect circuit 130 has been folded into place.

Probe points 380 and 385 may be used for connecting surface mount components, such as bypass diodes or power transistors with optional extension leads, or other devices directly across the terminals of individual sub-set of battery cells. For example, surface mount components may be connected vertically across middle region 360 with one terminal on probe points 380 and the other terminal on corresponding probe points 385. In some embodiments, surface mount bypass diodes may be connected across probe points 380 and 385 to provide a bypass path for charging current if the voltage across a sub-set of battery cells exceeds a certain threshold level during battery charging.

Interconnect circuit 130 shown in FIG. 3B includes all circuitry components used for interconnecting battery cells having positive and negative terminals on opposing sides. Integrating all components into the same interconnect circuit may simplify the battery pack assembly process. More specifically, fewer assembly operations may be needed when interconnect circuit 130 shown in FIG. 3B is used in a battery pack than many conventional interconnects and/or wire harnesses. Furthermore, the number of discrete electrical connections used to interconnect cells in the same battery pack is reduced, thereby potentially improving yield and reliability.

Examples of Battery Packs Including Interconnect Circuits

Figures 4A, 4B, 4C:
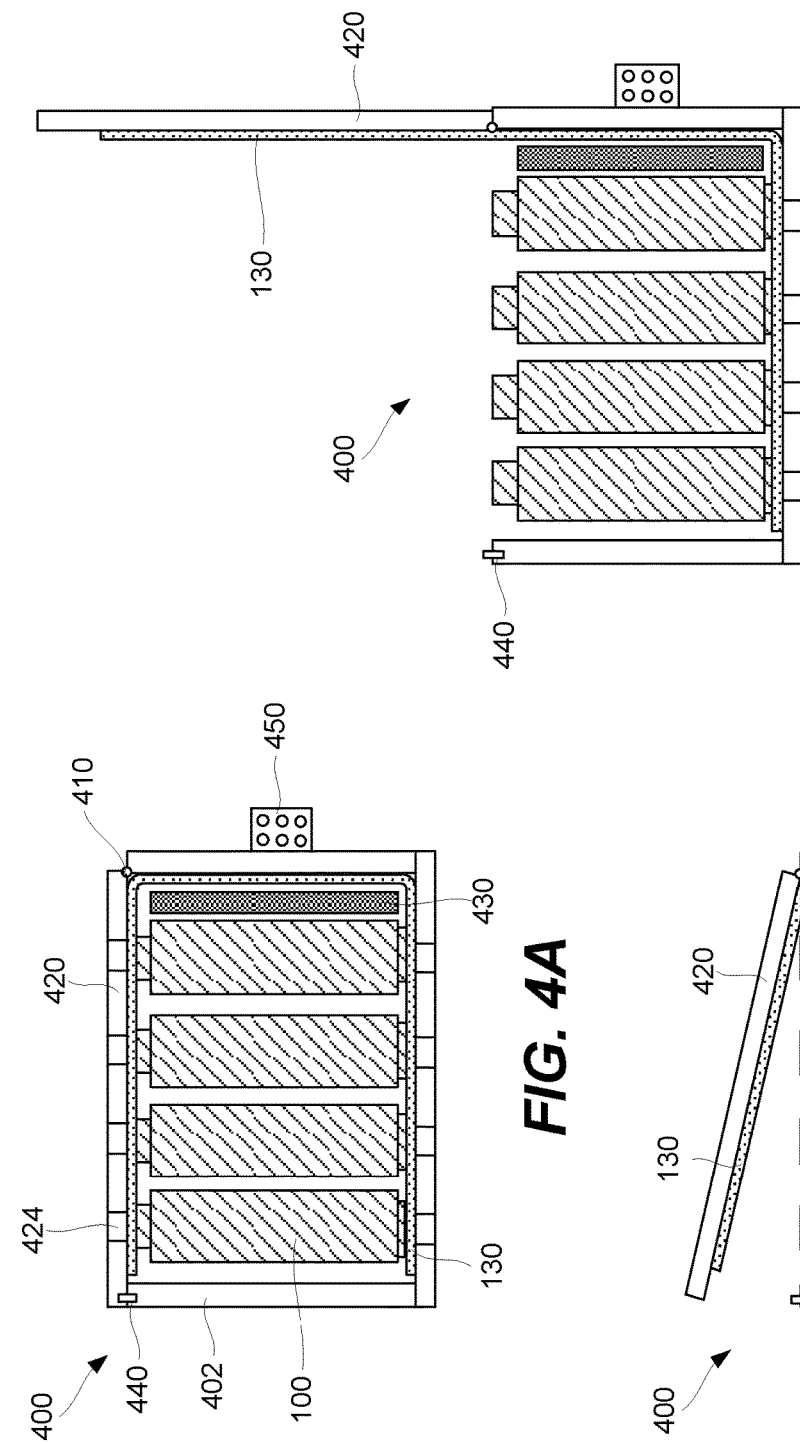
FIGS. 4A-4C are cross-sectional schematic representations of a battery pack including a housing, an interconnect circuit, and battery cells, in accordance with some embodiments.

FIGS. 4A-4C are schematic cross-sectional side views of battery pack 400 including housing 402, interconnect circuit 130, and battery cells 100, in accordance with some embodiments. Specifically, FIG. 4A illustrates fully closed housing 402, while FIG. 4B illustrates open housing 402 that allows loading battery cells 100 into housing 402. FIG. 4C illustrates partially closed housing 402. Collectively, FIGS. 4A-4C illustrates flexibility of interconnect circuit 130 and, in some embodiments, ability of interconnect circuit 130 to conform to various shapes and surfaces of housing 402.

Interconnect circuit 130 may optionally be similar to the one shown in FIG. 3B and described above. In some embodiments, interconnect circuit 130 may be pre-laminated to housing 402 using an adhesive, which may be a part of interconnect circuit 130 or housing 402. For example, the adhesive may be a sublayer of the second insulating layer. For purposes of this disclosure, a first insulating layer may be disposed between a conductive layer and battery cells, while a second insulating layer may be positioned such that the conductive layer is disposed between the first and second insulating layers. In some embodiments, adhesive may be disposed on the interconnect circuit surface, the housing surface, or through a separate adhesive coating/application step. Housing 402 may have one or more hinges 410 that allows cover 420 to move with respect to the rest of housing and, more specifically, with respect to battery cells 100. In some embodiments, cover 420 is foldable without a need for a hinge. In general, cover 420 allows placement of battery cells 100 into housing prior to completing the electrical connection of cells 100 to interconnect circuit 130. Cover 420 may also simplify the attachment of interconnect circuit 130 to housing 402 by allowing straightforward access to the inside surfaces of housing 402 during lamination of interconnect circuit 130 to housing 402.

Housing 402 may also accommodate a cooling device to, for example, control the temperature of battery cells 100 during their operation in battery pack 400. Alternatively, housing 402 may itself be or may include a heat sink that is capable of withdrawing heat from interconnect circuit 130 and/or battery cells 100 during battery pack operation. For example, the walls and lid of housing 402 may be built from 0.5-5 mm thick aluminum (or another thermally conductive material) to provide a heat sink for interconnect circuit 130 and/or battery cells 100. As described above, in some embodiments, a second insulating layer may be incorporated into interconnect circuit 130 to provide electrical isolation between interconnect circuit 130 and housing 402. Housing 402 may also accommodate mechanical racking to, for example, hold battery cells 100 in place during their operation in battery pack 400. These devices may be placed into housing 402 during various stages of assembly of battery pack 400. In some embodiments, battery pack 400 may include electromagnetic shield 430 disposed inside housing 402. Electromagnetic shield 430 may be used to prevent electromagnetic noise from affecting the monitoring and control circuitry of interconnect circuit 130. In some embodiments, electromagnetic shield 430 is a part of interconnect circuit 130. For example, electromagnetic shield 430 may be formed by laminating a second conductive layer to the opposite side of the insulating layer such that the insulating layer is disposed between the second conductive layer and the original conductive layer, which is used for interconnecting battery cells 100.

Prior to interconnecting battery cells 100 using interconnect circuit 130, a disconnected version of battery pack 400 may be assembled. For example, a sheet of insulating material may be placed between interconnect circuit 130 and battery cells 100. This feature may help facilitate the storage and/or transport of battery pack 400 with battery cells 100 being disconnected, thus ensuring that battery cells 100 do not lose energy or become unsafe during storage and/or transport. In addition, housing latch 440 may have a built-in safety feature which allows the latch to be blown open in response to an external signal, thereby resulting in an instant disconnect of all battery cells 100 in the pack/module.

In some embodiments, housing 402 may include an array of openings 424 to provide access to interconnect circuit 130 and, for example, form electrical connections between interconnect circuit 130 and battery cells 100. These electrical connections may be made using, for example, laser welders, resistance welders, ultrasonic welders, and soldering equipment. These connections may be formed, for example, after cover 420 is lowered to the rest of housing 402. In addition, openings 424 may be used to pass electrical current or signals outside battery pack 400, such as through electrical connector 450. Electrical connector 450 may be then connected to a wire harness.

Figure 4D:
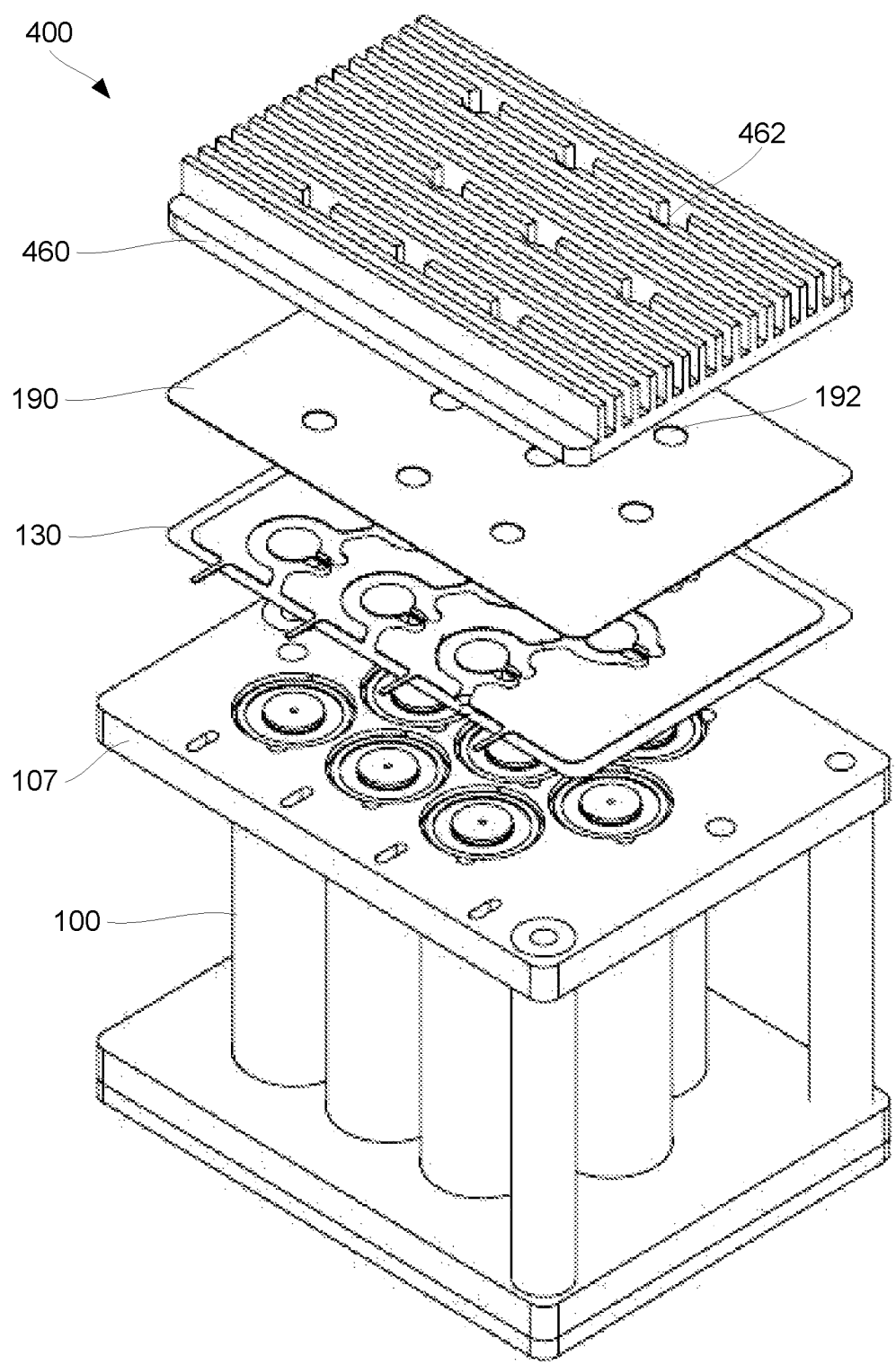
FIGS. 4D-4E are schematic exploded views of battery packs including different types of heat sinks, in accordance with some embodiments.
Figure 4E:
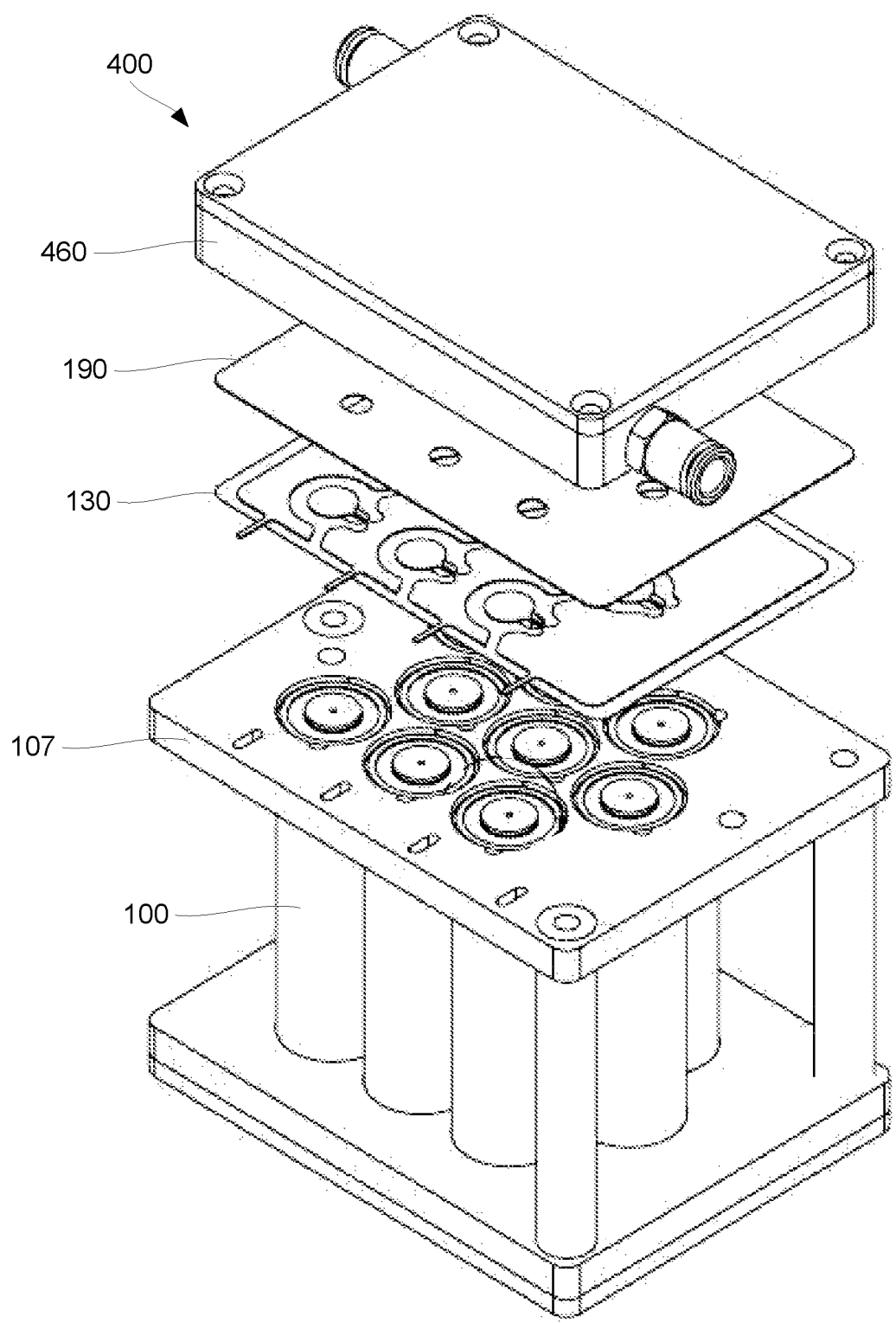

FIGS. 4D-4E are schematic exploded views of battery packs 400 including heat sinks 460, in accordance with some embodiments. Heat sinks 460 are used to remove the heat from battery cells 100 and preventing overheating of these cells. It should be noted that interconnect circuit 130 and adhesive 190 are disposed between and provide thermal coupling between heat sinks 460 and battery cells 100. Thermal transfer aspects of interconnect circuit 130 are provided primarily by the conductor. Adhesive 190 may be thermally conductive (e.g., having a thermal conductivity of at least about 0.1 W/mK), such as an inorganic particle-filled dielectric film or a thermally conductive pressure-sensitive adhesive (PSA) film. Furthermore, adhesive 190 may be electrically insulating (e.g., having an electrical conductivity of less than 10 S/cm), which allows for adhesive 190 to be in direct physical contact with a conductor of interconnect circuit 130 and electrically conductive portions of heat sinks 460. For example, adhesive 190 may comprise thermally conductive but electrically insulating particles to facilitate heat transfer between interconnect circuit 130 and heat sink 460.

Heat sink 460 may be also operable as a support structure for interconnect circuit 130, e.g., prior for connections to battery cells 100. Additional support may be provided by battery cells 100 (e.g., after the connections are formed). Furthermore, after interconnect circuit 130 is electrically connected to battery cells 100, interconnect circuit 130 may mechanically support heat sink 460 and battery cells 100 with respect to each other. In some embodiments, heat sink 460 may be bolted of otherwise attached to cell supporting structure 107 or other components of battery pack 400.

Heat sink 460 may be formed from a thermally conductive material, such as a metal. Furthermore, heat sink 460 may include various heat dissipating features, such as cooling fins (as, for example, shown in FIG. 4D), circulation of heat transfer fluid (as, for example, shown in FIG. 4E), phase change materials, etc.

Heat sink 460 may include openings 462 corresponding to contact pads of the connector of interconnect circuit 130. Similar openings 192 may be provided in adhesive 190. Heat sink openings 462 and adhesive openings 192 allow the formation of an assembly including interconnect circuit 130, adhesive 190, and heat sink 460 prior to connecting interconnect circuit 130 to battery cells 100. Specifically, heat sink openings 462 and adhesive openings 192 provide access to the contact pads of interconnect circuit 130.

Examples of Interconnect Circuits for Interconnecting Prismatic Battery Cells

In some embodiments, interconnect circuits may be used as an electrical interconnect for cells having both terminals on the same side. Some examples of such cells include rectangular cells, prismatic cells, pouch cells, and other like cells. FIG. 5A shows a plan view schematic diagram of set 101 of cells 100 arranged into a linear array, in accordance with some embodiments. Cells 100 have both positive terminals 510 and negative terminals 520 on the top surfaces of battery cells 100. Note that while battery cells 100 are depicted as only having two terminals in FIG. 5A, in practice interconnect circuits may be used to interconnect and/or monitor battery cells 100 with any number of terminals, such as terminals and/or electrodes for measuring reference potentials within cells 100 (e.g., terminals connected to lithium reference electrodes in lithium ion cells). Terminals 510 and 520 may optionally include contact pads, rigid bumps, or flexible foil tabs. In the example shown in FIG. 5A, battery cells 100 have been oriented with a 180 degree rotation of the terminals on every fourth cell. An arrangement of battery cells 100 may have gaps in between pairs of adjacent cells to, for example, accommodate cooling fins in between the cells and/or thin sheets of foam to accommodate expansion (and, for example, some maintain a contact pressure on the cells). In some embodiments, the cooling fins may be thermally coupled to the conductive layer of an interconnect circuit.

Interconnect circuit 130 capable of interconnecting cells 100 is shown schematically in plan view in FIG. 5B. Interconnect circuit 130 includes conductive layer 140 and insulating layer 150, such that insulating layer 150 is positioned between conductive layer 140 and cells 100. Conductive layer 140 includes a set of electrically-isolated islands 142a, 142b, and 142c. Insulating layer 150 is patterned with openings to provide connections between the battery cell terminals and conductive layer 140 or, more specifically, between the battery cell terminals and the set of electrically-isolated islands 142a, 142b, and 142c. As described above, each of islands 142a, 142b, and 142c may include an array of contact pads, which may be parts of a continuous layer or may be partially surrounded by conductive layer openings and connected to the rest of islands 142a, 142b, and 142c by fusible links.

Figure 5C:
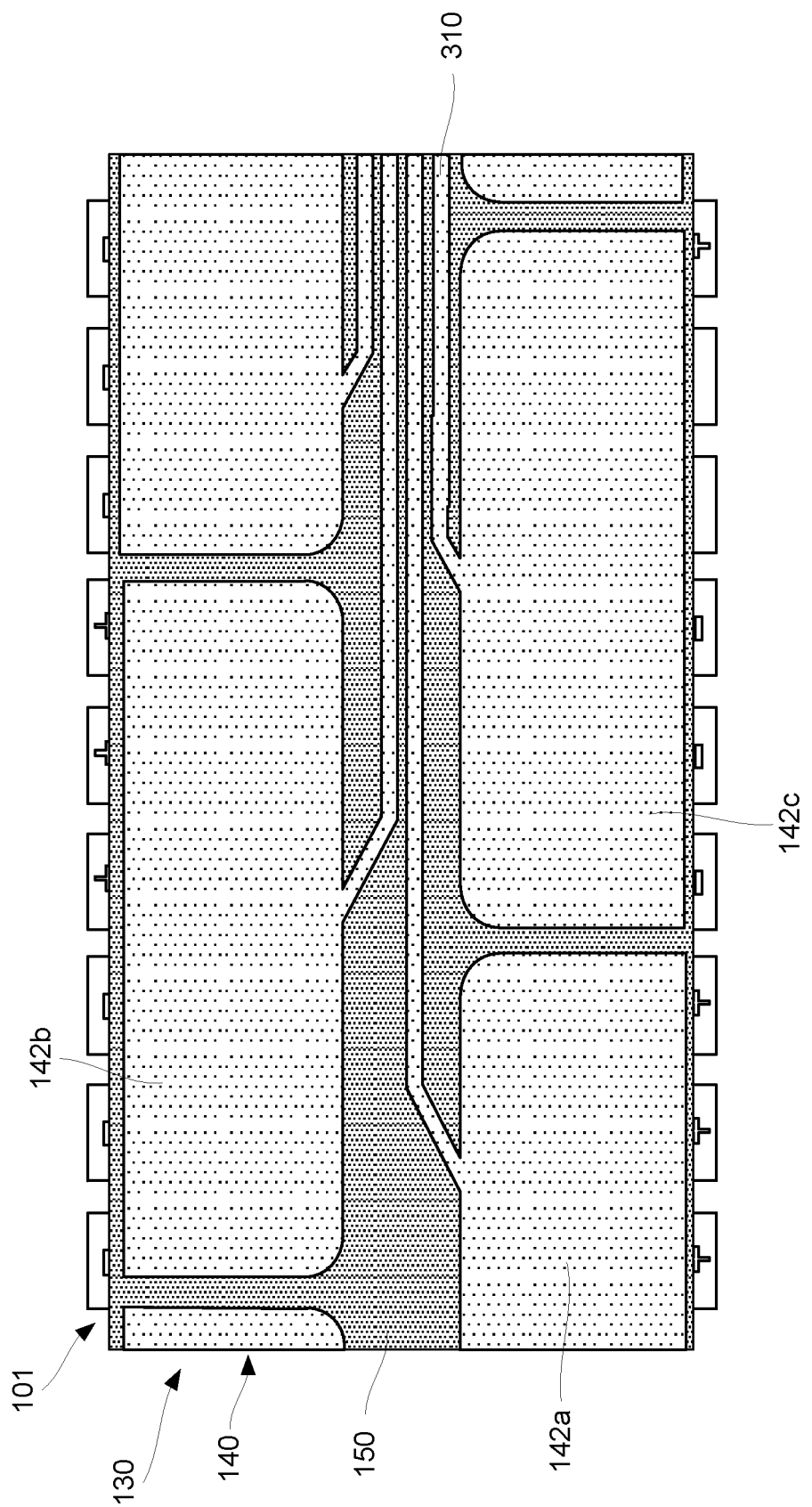
FIG. 5C is a plan-view schematic diagram of the set of prismatic battery cells of FIG. 5A further illustrating another interconnect circuit having voltage monitoring traces, in accordance with some embodiments.

In some embodiments, interconnect circuit 130 includes voltage monitoring or other circuitry, as shown schematically in plan view in FIG. 5C. Voltage monitoring traces 310 may be included within conductive layer 140. Voltage monitoring traces 310 may occupy the center portion of interconnect circuit 130 in between two rows of islands 142a, 142b, and 142c. Islands 142a, 142b, and 142c may be sufficiently thick so as to provide low resistive power loss within conductive the foil islands. Alternatively, islands 142a, 142b, and 142c (and, consequently, the edges of interconnect circuit 130) may be extended beyond the edges of battery cells 100 to provide sufficient conductance between the terminals of battery cells 100. This may have the effect of increasing the conductance of islands 142a, 142b, and 142c by increasing their width. Interconnect circuit 130 may optionally be folded along the sides of battery cells 100 to minimize the area of the battery pack occupied by interconnect circuit 130 (e.g., for high energy density applications). In some embodiments, insulating layer 150 may be patterned to ensure that interconnect circuit 130 does not short to the packaging of battery cells 100 after interconnect circuit 130 has been folded. Furthermore, the outer surface of the packaging of battery cells 100 may be electrically insulating to prevent an electrical short from taking place.

Figure 5D:
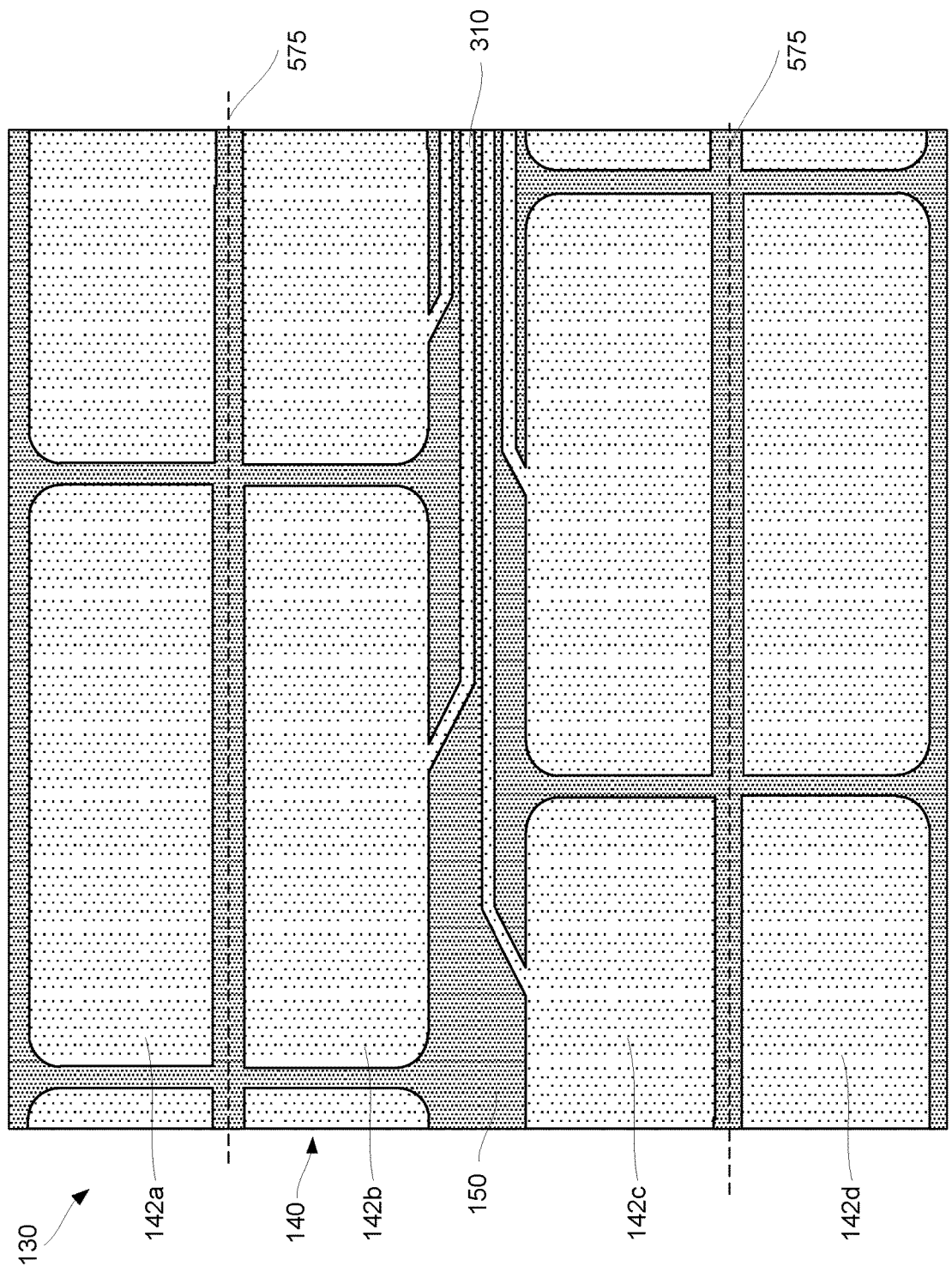
FIG. 5D is a plan-view schematic diagram of an interconnect circuit including four rows of islands (conductor portions) and voltage traces, in accordance with some embodiments.

FIG. 5D depicts another example of interconnect circuit 130 including four rows of islands 142a-142d. Each of islands 142a-142d may optionally be attached at its edges to insulating layer 150. Furthermore, insulating layer 150 may include openings, or windows, that overlap portions of islands 142a-142d. Alternatively, insulating layer 150 may be designed to extend over voltage monitoring traces 310. In this case, the registration between adjacent rows of islands 142a-142d may be maintained through the conductive layer itself, for example, through tabs or other connecting features within the layer of conductive foil. Specifically, metal connecting tabs could be left in place near lines 575 in order to maintain alignment between islands 142a and 142b (and between islands 142c and 142d). In some embodiments, a pair of adjacent islands may be electrically connected to each other. As such, there is no need for removing the connecting tabs. This design would eliminate the need for extending the insulating layer 150 beyond the middle region of the interconnect circuit. Either prior to, during, or after the attachment of interconnect circuit 130 to battery cells, interconnect circuit 130 may be folded along folding lines 575 (identified with dotted lines in FIG. 5D). This folding may be used to form overlapping islands 142a-142d. Islands 142a-142d may then be electrically joined together using various bonding techniques, such as laser welding, ultrasonic welding, soldering, and the like, to achieve the desired conductance. Note that although four rows of islands 142a-142d are shown in FIG. 5D, in other embodiments any number of islands may be folded on top of one another to provide the desired conductance.

Figure 5E:
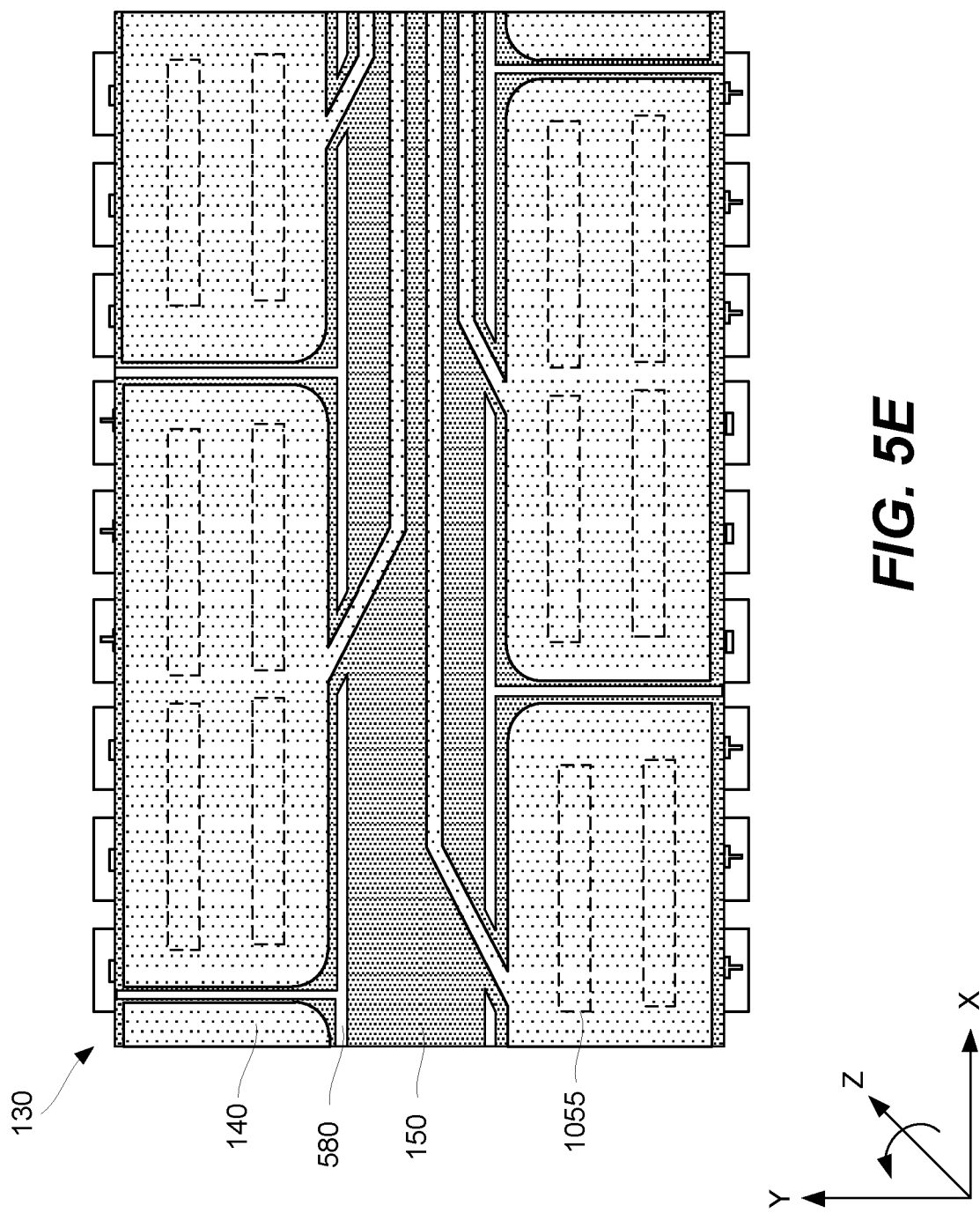
FIG. 5E is a plan-view schematic diagram of the set of prismatic battery cells of FIG. 5A further illustrating yet another interconnect circuit having voltage monitoring traces, in accordance with some embodiments.

In some embodiments, insulating layer 150 may be patterned with a series of slits 580, as shown schematically in plan view in FIG. 5E. Slits 580 may allow a degree of mechanical de-coupling between the individual islands of conductive layer 140 (as well as the regions of insulating layer 150 in the vicinity of these islands) and the remainder of interconnect circuit 130. Openings in insulating layer 150 are not visible in this view and are represented by dotted lines (insulating layer opening boundaries 1055). As shown schematically in side view in FIGS. 5F and 5G, a potential function of slits 580 is to allow islands of conductive layer 140 to be folded during the formation of electrical connections to terminals 515 of battery cells 100. In some embodiments, this may simplify the implementation of various methods of electrical interconnection, such as ultrasonic welding, laser welding, resistance welding, soldering, attachment with electrically conductive adhesive (ECA), crimping, and the like. Following the formation of electrical interconnects 590, conductive layer 140 and/or terminals 515 may subsequently be folded back to an approximate state of co-planarity with the remainder of interconnect circuit 130. This may have the benefit of reducing the total volume occupied by a battery pack (and, therefore, increasing the energy density of the pack).

In some embodiments, battery cells may be oriented in the same direction in the set. FIG. 6A shows a plan view schematic diagram of such set 101 of battery cells 100. Positive terminals 510 are located on one side (bottom of FIG. 6A) and negative terminals 520 are located on the opposite side (top of FIG. 6A). Interconnect circuit 130 configured to interconnect such set 101 is shown schematically in plan view in FIG. 6B. Specifically, interconnect circuit 130 comprises a set of electrically-isolated islands 142a and 142b, which are parts of conductive foil. Patterned insulating layer 150 is disposed between conductive layer 140 and battery cells 100.

Figure 6C:
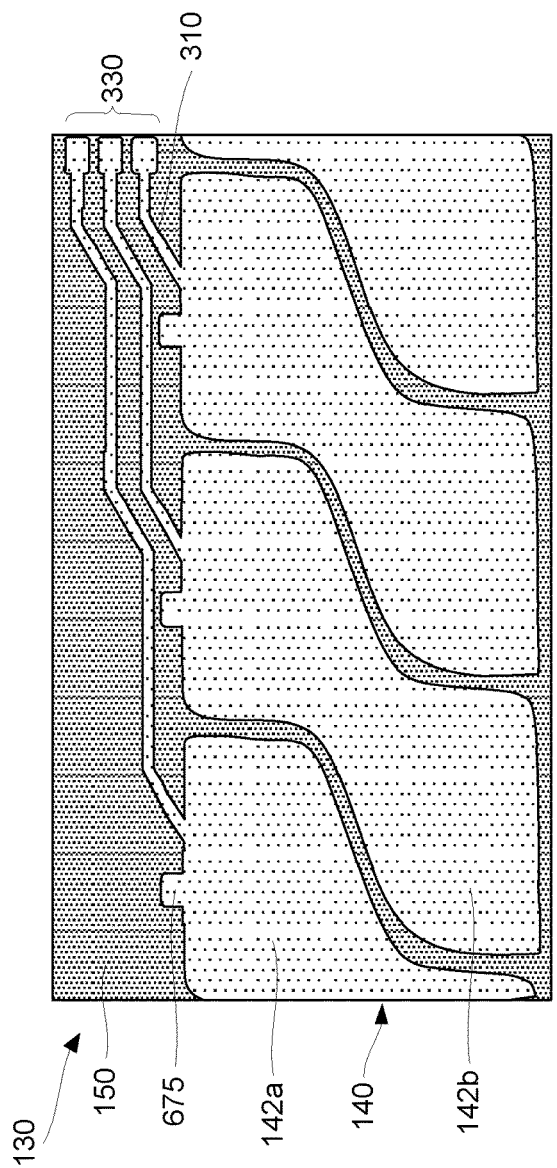
FIG. 6C is a plan-view schematic diagram of another interconnect circuit having voltage monitoring traces, in accordance with some embodiments.

FIG. 6C is a schematic plan view diagram of interconnect circuit 130 having voltage monitoring traces 310 and contact points 330. The region of interconnect circuit 130 that is not disposed directly above the battery cells may optionally be folded along the side of the cells during battery module or pack assembly to preserve space within the module/pack.

Figure 6D:
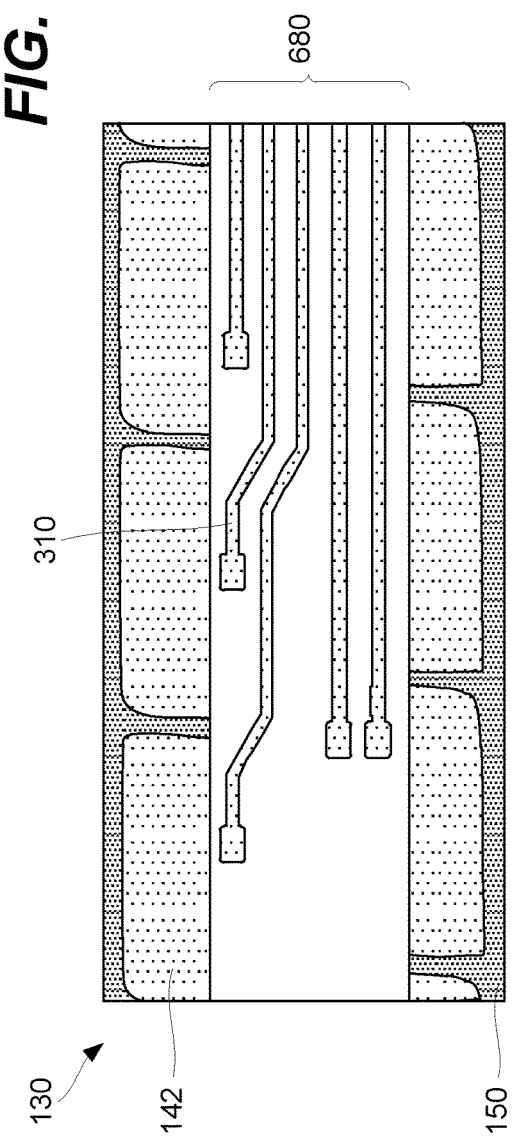
FIG. 6D is a plan-view schematic diagram of a stacked flexible circuit over an interconnect circuit, in accordance with some embodiments.

Alternatively, voltage monitoring traces 310 and possibly other devices may be parts of stacked flexible circuit 680 positioned next to interconnect circuit 130, as shown schematically in a plan view in FIG. 6D. Voltage monitoring traces 310 may be routed to openings in an insulating layer of stacked flexible circuit 680, through which electrical connections may be made to underlying islands 142 of conductive layer 140. In some embodiments, the thickness of islands 142 in interconnect circuit 130 and the thickness of voltage monitoring traces 310 of stacked flexible circuit 680 may be individually varied to achieve the desired electrical conductance of each layer. Furthermore, voltage monitoring traces 310 may terminate in relatively large contact pads (for example, terminating in pads whose area is a significant fraction of the area of the underlying island of conductive foil), thereby allowing for a relatively large-area electrical contact to be formed between the two circuits. As compared to a small-area contact, this may reduce the contact resistance and provide greater electrical contact redundancy. For example, the area of the contact pads on the end of voltage monitoring traces 310 may be at least 10, 20, 50, or 80 percent of the area of the corresponding islands of conductive layer 140. Stacked flexible circuit 680 may reduce the space taken up by interconnect circuit 130 within the battery pack relative, for example, to an example of the interconnect circuit shown in FIG. 6C. Furthermore, stacked flexible circuit 680 may simplify the routing and attachment of surface mount components and/or other electrical devices to the interconnect circuit assembly.

In some embodiments, battery cells may include terminals made out of thin tabs or foil. Some examples of such cells are prismatic, rectangular, and/or pouch battery cells. One distinctive characteristic of such tabs is that these tabs cab be easily bent. FIGS. 7A-7D depict examples of various configurations of the electrical connections that may be formed between interconnect circuit 130 and such terminal 515 of battery cell 100.

In the side view schematic diagram shown in FIG. 7A, interconnect circuit 130 includes slot 710 that has been patterned into conductive layer 140 and insulating layer 150 of interconnect circuit 130. Terminal 515 of battery cell 100 may extend through slot 710 and folded down onto the surface of conductive layer 140 that faces away from insulating layer 150 and battery cell 100. Terminal 515 and conductive layer 140 form electrical connection 745.

As shown schematically in a plan view in FIG. 7B, conductive layer 140 may optionally include contact pad 160 and one or more fusible links 170 that electrically connect contact pad 160 to the rest of conductive layer 140. The number, cross-sectional area, and length of fusible links 170 depend on current ratings and fuse current threshold.

Alternatively, interconnect circuit 130 may be folded to form an electrical connection 745 to both sides of terminal 515 of battery cell 100 as, for example, depicted schematically in side view in FIG. 7C. The layout of interconnect circuit 130 may be designed to incorporate sufficient space for a portion of interconnect circuit 130 to be folded while still maintaining appropriate registration with battery cell 100 and other components of the battery pack. In addition, insulating layer 150 may be patterned with openings to allow terminal 515 of battery cells 100 to be placed into contact with the folded portion of conductive layer 140. Once physical contact has been established, an electrical connection may be formed using techniques and materials described previously. In embodiments in which multiple battery cells are connected in parallel, this connection scheme may reduce the electrical resistance associated with current flow through interconnect circuit 130 in the vicinity of terminal 515 of battery cell 100, since conductive layer 150 remains continuous.

In some embodiments, terminal 515 of battery cell 100 may be folded and connected to the bottom surface of conductive layer 140 as shown in FIG. 7D. This bottom surface faces battery cell 100 and insulating layer 150. Conductive layer 140 may be continuous in the area of electrical connection as shown in FIG. 7D. Terminal 515 extends through an opening in insulating layer 150. Techniques including, but not limited to, soldering, laser welding, resistance welding, ultrasonic welding, or bonding with electrically conductive adhesive may be used to form electrical connection 745.

Figure 7E:
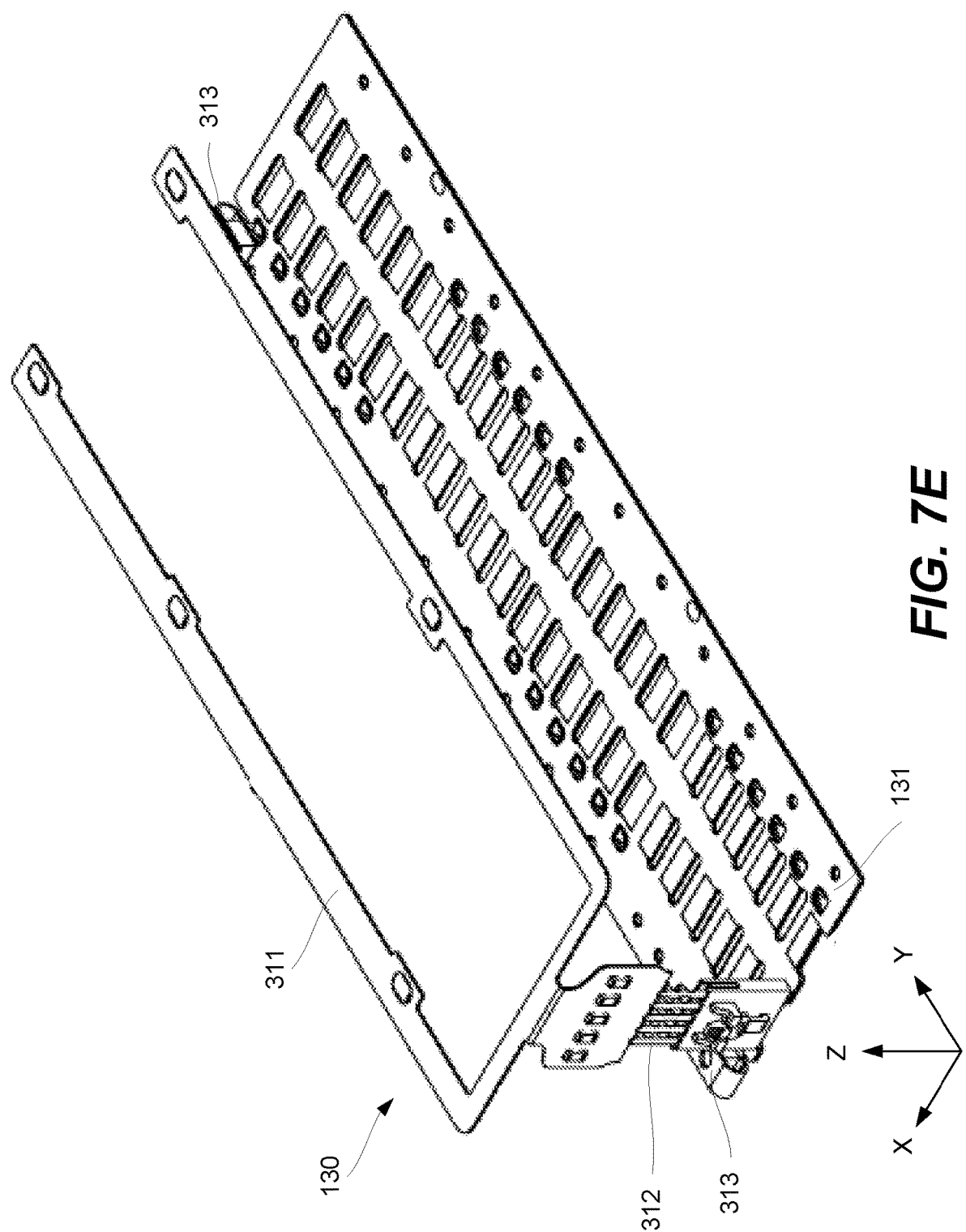
FIG. 7E is a schematic diagram of another interconnect circuit having a voltage trace assembly and a conductor assembly, in accordance with some embodiments.
Figure 7F:
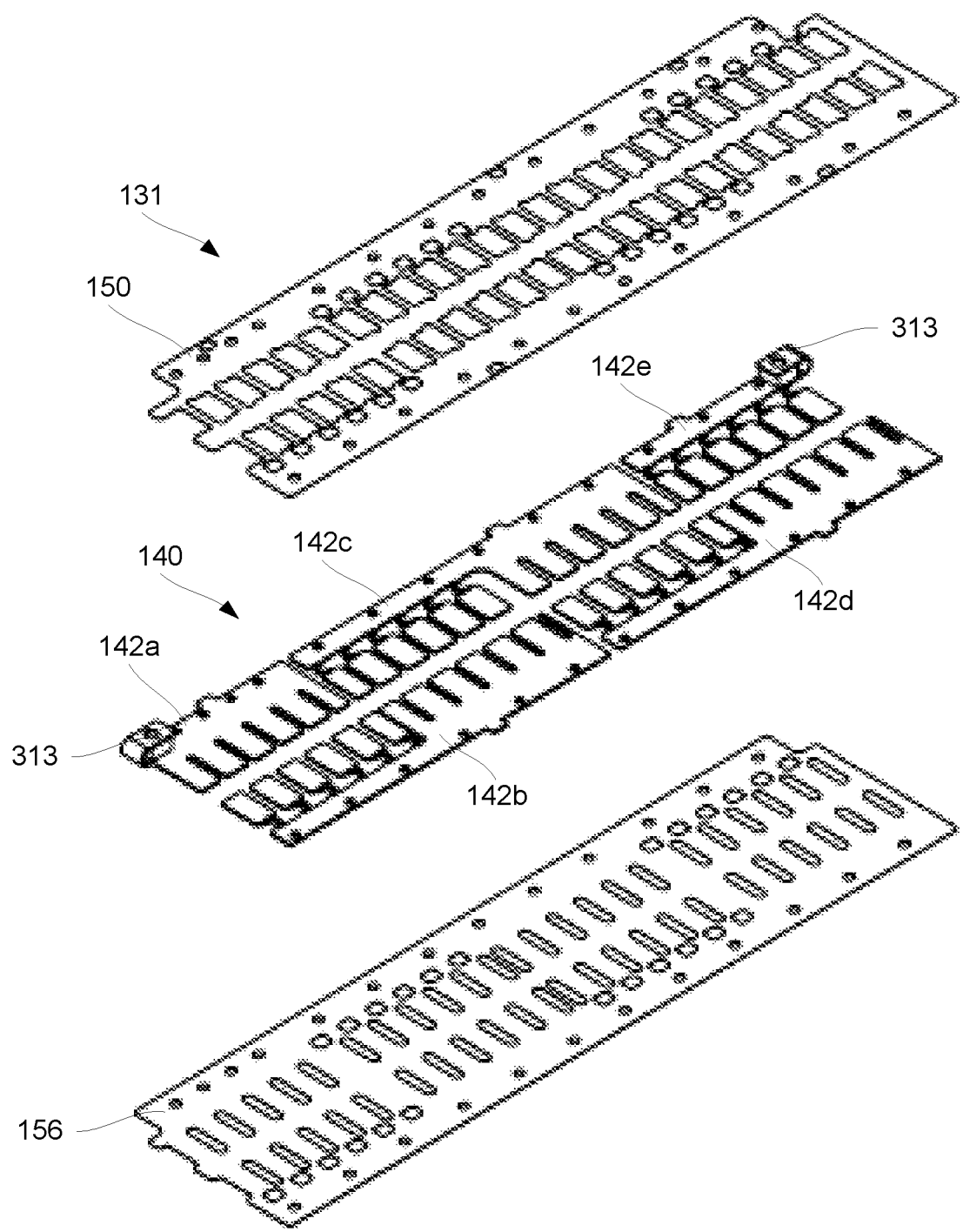
FIG. 7F is a schematic exploded view of the conductor assembly of the interconnect circuit in FIG. 7E, in accordance with some embodiments.

FIG. 7E is a schematic exploded view of another interconnect circuit 130 including voltage trace assembly 311 and conductor assembly 131, in accordance with some embodiments. In the assembled state, trace assembly 311 and conductor assembly 131 reside within the approximately the same plane. External connectors 312 to this interconnect circuit 130 may be positioned out of plane. For example, external connectors 312 may include a voltage sense connector that allows this interconnect circuit 130 to be connected to a battery management unit/battery management system (not shown). Power connectors 313 may be part of conductor 140 as, for example, shown in FIG. 7F. In this example, conductor 140 includes five different islands (or portions) 142a-142e that are electrically isolated from each other. It should be noted that once interconnect circuit 130 is connected to battery cells, islands 142a-142e become interconnected through these battery cells. Conductor 140 is disposed between two insulators 150 and 156, which collectively form conductor assembly 131.

Figure 7G:
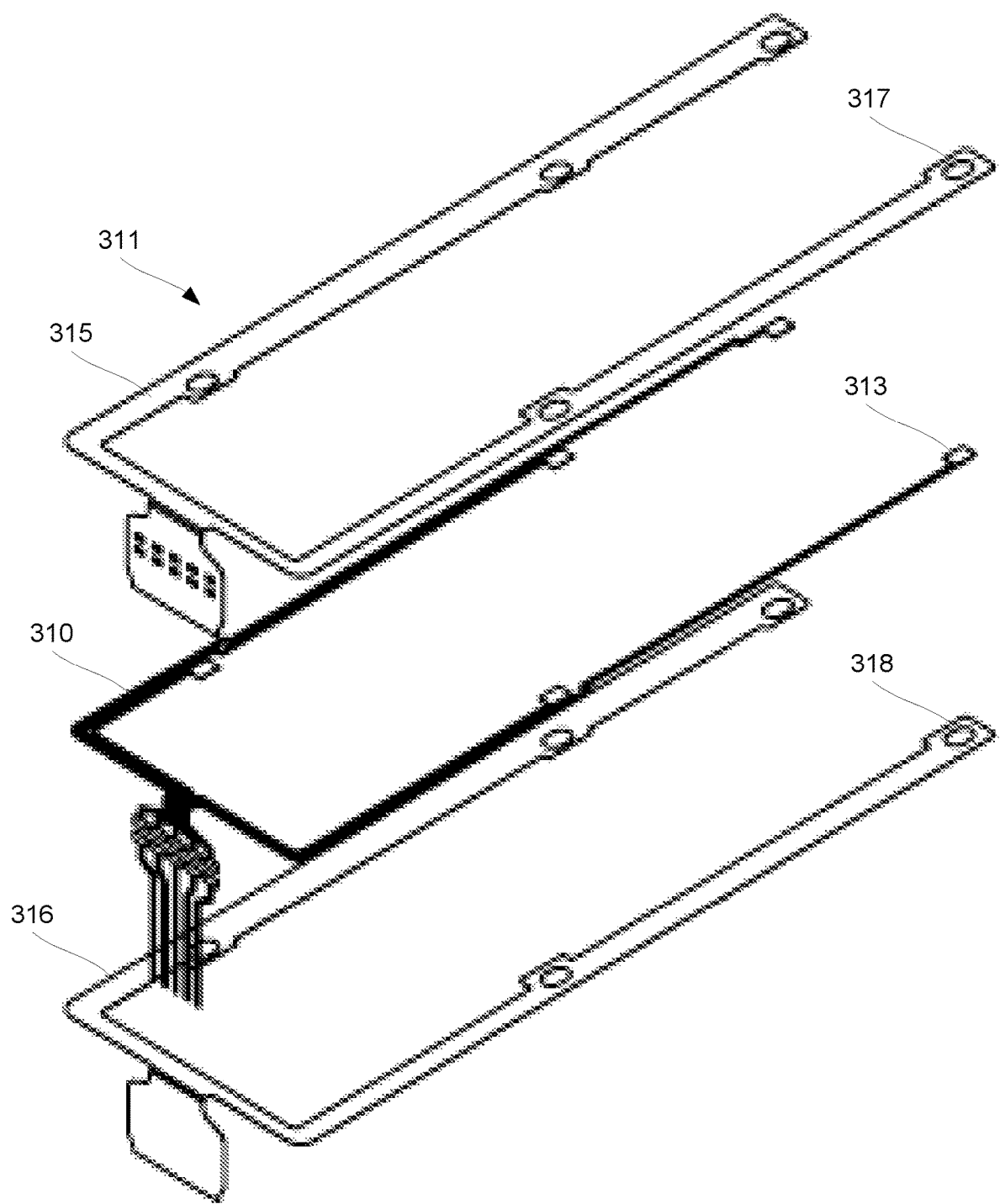
FIG. 7G is a schematic exploded view of the voltage trace assembly of the interconnect circuit in FIG. 7E, in accordance with some embodiments.

FIG. 7G is a schematic exploded view of voltage trace assembly 311 of interconnect circuit 130 in FIG. 7E, in accordance with some embodiments. Voltage trace assembly 311 may include voltage monitoring traces 310 disposed between two insulating layers 315 and 316. In this example, insulating layers 315 and 316 are different from two insulators 150 and 156 of conductor assembly 131. This allows for separate fabrication of conductor assembly 131 and voltage trace assembly 311 and even separate connection of conductor assembly 131 and voltage trace assembly 311 to battery cells. For example, conductor assembly 131 may be connected to the battery cells first, and then voltage trace assembly 311 may subsequently be connected to the battery cells and/or to conductor assembly 131. To form these latter connections, insulating layers 315 and 316 may have openings 317 and 318 to access power connectors 313 of voltage monitoring traces 310.

Examples of Battery Packs with Flat Form Factor for Prismatic Cells

Figure 8D:
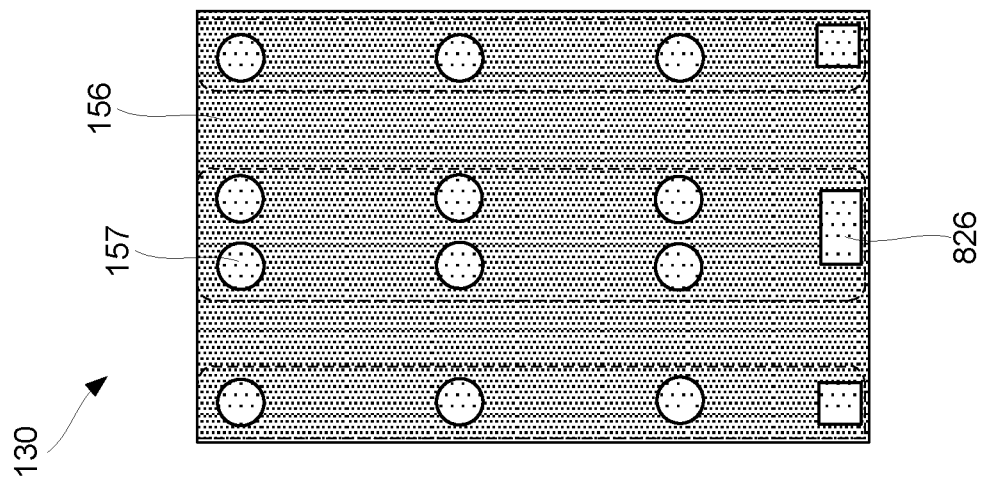
FIG. 8D is a plan-view schematic diagram illustrating another interconnecting circuit comprising a conductor and an insulating layer, in accordance with some embodiments.

Interconnect circuits may also be used to interconnect prismatic battery cells in a planar or tiled array as shown in FIGS. 8A-8H. For the purposes of this disclosure, a tiled array refers to an array in which the largest faces of the prismatic cells are approximately coplanar. Specifically, FIG. 8A is a sequential cutaway plan view diagram of set 101 of battery cells 100 arranged into two columns. Each cell 100 has a positive terminal 510 and a negative terminal 520. In later figures, set 101 of battery cells 100 is interconnected using interconnect circuit 130. In order to better understand the features and orientation of the main components of the interconnect circuit a few hypothetical examples are shown. For example, FIG. 8B is a sequential cutaway plan view diagram of insulating layer 150 disposed over the set of battery cells. The terminals of the cells are aligned with and visible through insulating layer openings 155. Insulating layer 150 also includes monitoring point openings 824 that need not be aligned with any terminals and, in fact, may be clear from set 101 of cells 100.

Figure 8C:
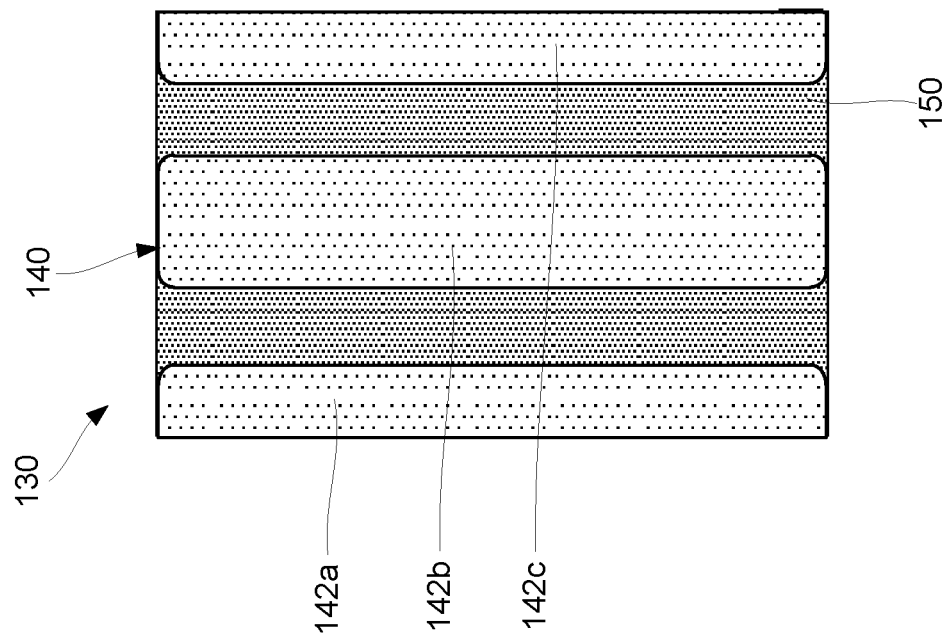
FIG. 8C is a plan-view schematic diagram illustrating an interconnecting circuit comprising a conductor and an insulating layer, in accordance with some embodiments.

FIG. 8C is a sequential cutaway plan view diagram of one example of interconnecting circuit 130 having conductive layer 140 disposed over insulating layer 150. Conductive layer 140 is shown to include three islands 142a, 142b, and 142c. Each of islands 142a, 142b, and 142c covers a separate set of insulating layer openings 155 and monitoring point openings 824. Furthermore, in this example, island 142b interconnects six battery terminals by electrical connections made through the corresponding insulating layer openings 155.

FIG. 8D is a sequential cutaway plan view diagram of one example of interconnecting circuit 130 having second insulating layer 156 disposed over conductive layer 140. In this example conductive layer 140 is disposed between two insulating layers, such that one insulating layer, insulating layer 150, is disposed between conductive layer 140 and cells 100. This insulating layer is not visible in FIG. 8D. The other insulating layer, second insulating layer 156, is disposed on top of conductive layer 140 such that conductive layer 140 is disposed between second insulating layer 156 and cells 100. Second insulating layer 156 may include second insulating layer openings 157 that may be aligned with openings in the first insulating layer. Second insulating layer openings 157 may be used to access the conductive layer, which is visible in FIG. 8D through second insulating layer openings 157, when making electrical connections between the conductive layer and battery cell terminals.

The composition of insulating layers 150, 156 of interconnect circuit 130 may be selected from any of the electrically insulating dielectric and/or adhesive materials described in other embodiments. As noted above, the layers may include openings corresponding to the locations of the cell terminals. For example, the insulating layer 150 disposed between battery cells 100 and conductive layer 140 may include an upper adhesive sublayer for mechanically coupling and/or attaching the interconnect circuit 130 to the cells or, more specifically, to the packaging of the battery cells 100. This coupling may help reduce mechanical stress at the connection points between the terminals and conductive layer. In some embodiments, the thickness of the first insulating layer 150 and second insulating layer 156 may be relatively low to help promote heat transfer through the interconnect circuit 130. For example, the thickness of the first and second insulating layers may range from 10 to 125 micrometers.

Alternatively, the first insulating layer 150 may include additional openings for the direct attachment (via welding, soldering, adhesive, PSA, etc.) of the packaging of battery cells to the conductive layer. In these embodiments, the packaging of the battery cells may be electrically isolated from the terminals of the battery cells (e.g., the packaging may be electrically neutral). Furthermore, the conductive layer may be optionally patterned to electrically isolate islands of the conductive layer that interconnect the terminals from other regions of the conductive layer that bond to the packaging of the battery cells. This arrangement may facilitate the removal of heat from the battery cells (for example, by exposing the rear side of the interconnect circuit to a heat removal element, or by transferring heat across the length of interconnect circuit). In general, the battery cells 100 and their terminals 510, 520 may be electrically and/or mechanically connected to interconnect circuit 130 using techniques including, but not limited to, laser welding, resistance welding, ultrasonic welding, reflow soldering, wave soldering, attachment with ECA, or (in the case of the battery housing) attachment with non-conductive adhesives. The insulating layer may also include openings corresponding to monitoring points as described above. The monitoring points may be used for the monitoring of sub-array voltage, the attachment of surface mount devices, selective charge/discharge, etc. Alternatively, in some embodiments, the interconnect circuit 130 may extend beyond the bottom row of the battery cells and incorporate additional monitoring and/or control circuitry into the circuit, as described in other embodiments.

The patterned conductive layer (e.g., the layer having electrically isolated islands) may be used for electrical connections of the terminals. Referring to FIGS. 8A and 8C, island 142b interconnects positive terminals of battery cells 100 in the left column with negative terminals of battery cells in the right column. While FIG. 8C depicts conductive layer 140 having a one-dimensional array of islands 142a, 142b, and 142c, conductive layer 140 may be patterned in accordance with any desired layouts or designs. In some embodiments, regions of conductive layer 140 may be patterned for the purpose of facilitating the removal of heat from (or, in some cases, the addition of heat to) the battery cells. For example, regions of conductive layer 140 may be disposed beneath and, optionally, directly attached to the housing of the battery cells for improved heat transfer. Furthermore, the thickness of conductive layer 140 may be chosen to reduce resistive power loss and/or promote heat transfer. In some embodiments, the thickness of conductive layer 140 may range from 25 micrometers to over 2 mm.

Figure 8F:
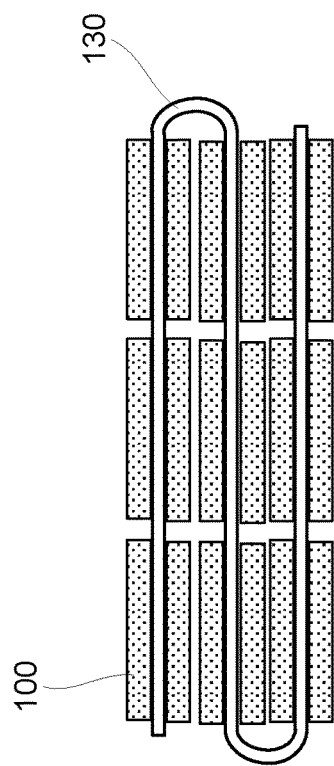
FIG. 8F is a side-view schematic diagram illustrating a single interconnect circuit looping throughout a stack of battery cells disposed at multiple levels and connected to these circuits, in accordance with some embodiments.
Figure 8E:
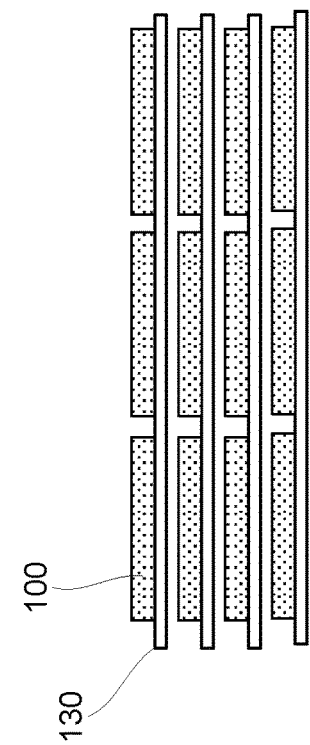
FIG. 8E is a side-view schematic diagram illustrating multiple interconnect circuits and battery cells connected to these circuits, both of which stacked in a direction perpendicular to the planes of interconnect circuits, in accordance with some embodiments.

In applications in which the length and width of the interconnect circuits are limited by external constraints (for example, by the lateral dimensions of a battery pack or an electrical device being powered by a battery or battery pack), stacked arrangements may be employed to increase the total energy storage capacity of the pack. For example, FIG. 8E shows a configuration in which more than one interconnect circuit 130 and corresponding battery cells 100 are stacked in the direction perpendicular to the plane of interconnect circuit 130. To electrically connect the stack of interconnect circuits 130 together, the conductive foil at the edges of a first interconnect circuit may be attached to the conductive foil at the edges of an adjacent interconnect circuit to achieve a desired series, parallel, or series/parallel connection. Alternatively, FIG. 8F shows a configuration in which battery cells 100 are attached to both sides of a single folded interconnect circuit 130. For example, battery cells 100 may be electrically connected to both sides of the conductive layer of interconnect circuit 130. Interconnect circuit 130 may be folded after the attachment of battery cells 100, or may be folded as battery cells 100 are individually attached to the interconnect circuit. In other embodiments, a wide variety of stacked arrangements may be implemented, including combinations of the arrangements shown in FIGS. 8E and 8F.

Figure 8G:
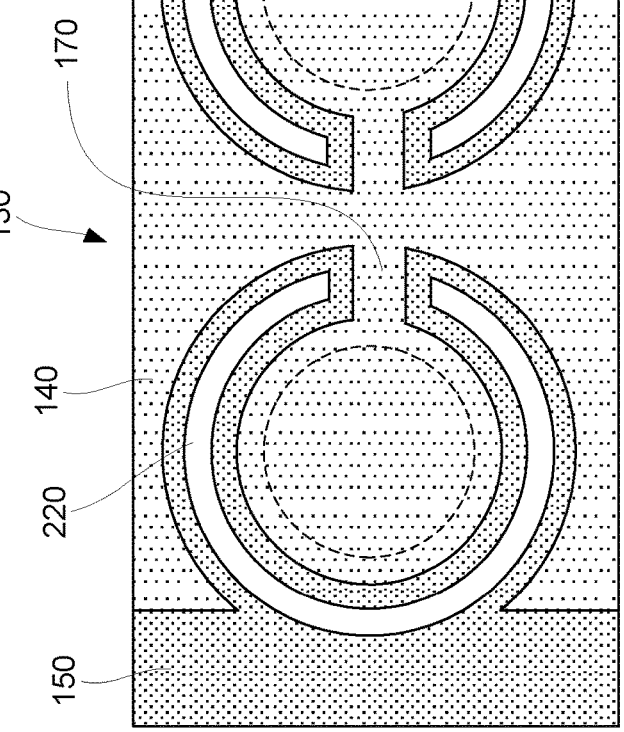
FIG. 8G is a plan-view schematic diagram illustrating patterns of different components of an interconnect circuit in the vicinity of two terminals having different polarities, in accordance with some embodiments.

As in other embodiments, interconnect circuit 130 may be patterned to provide circuit features in the vicinity of two terminals having different polarities, as shown in FIG. 8G. For example, insulating layer 150 may be patterned with slot 220 to help reduce the mechanical stress and/or improve vibration resistance in the areas of interconnection between interconnect circuit 130 and the terminals. In addition, conductive layer 140 may be patterned to form fusible link 170. The composition, width, thickness, and length of fusible link 170 may be chosen to cause fusible link 170 to blow open at a desired fuse current (e.g., in the event that battery cell develops an internal short).

The use of a planar or tiled configuration for prismatic battery cells may provide benefits in other aspects of a battery pack. An example of the implementation of interconnect circuit 130 and battery cells 100 (as shown in FIG. 8A-8E) into a battery pack having a substantially flat form factor is shown in exploded view in FIG. 8H. Compression plate 840 may be made from a structurally strong material (e.g., 0.5-5 millimeter thick stainless steel, aluminum, titanium, carbon fiber, or the like) and may be used to seal and apply pressure to the other elements of battery pack 830. To help maintain uniform pressure across the pack, an array of bolts (not shown in FIG. 8H for the sake of clarity) may be used to fasten the pack in between compression plate 840 and an upper compression plate which is not visible in FIG. 8H. For example, bolts may be positioned at each corner of battery cells 100 to help apply uniform pressure.

Conformal layer 850 may be made from a relatively soft material (e.g., 0.5-5 millimeter thick polyurethane foam, rubber, silicone, or the like) and may be used to help maintain even pressure within the pack. In addition, conformal layer 850 may be designed to help accommodate any swelling that may occur in the battery cells 100 during pack operation.

Figure 8H:
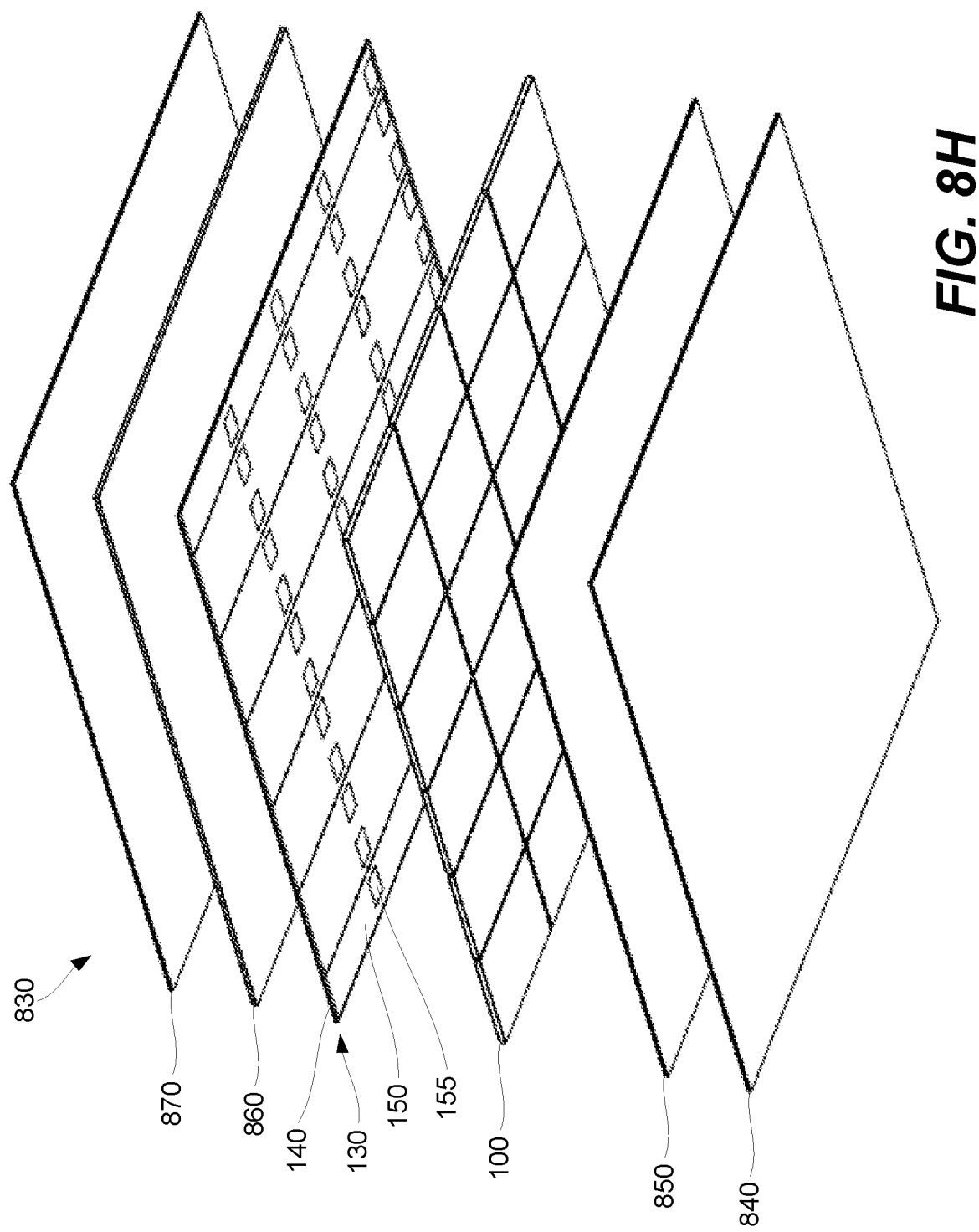
FIG. 8H is an exploded perspective view illustrating a battery pack comprising an interconnect circuit and battery cells having a substantially flat form factor, in accordance with some embodiments.

Battery cells 100 may have a prismatic form factor and may be configured in a flat or tiled orientation with respect to the z direction shown in FIG. 8H. In some embodiments, battery cells 100 may be of the so-called "pouch cell" variety, with a package thickness ranging from 3-30 mm. In addition, the battery cells 100 may optionally possess foil-based positive terminals 510 and negative terminals 520 that protrude from one edge of the cell. In the exploded view shown in FIG. 8H, the foil terminals have been folded over the battery cells 100 so that they are not visible. In some embodiments, the terminals may first be welded or otherwise electrically connected to the interconnect circuit 130 prior to folding the battery cells 100 over the tabs or vice-versa. This configuration may help to increase the packing density of the battery cells 100.

Interconnect circuit 130 may be designed in accordance with the layouts depicted in FIGS. 8B-8D. Alternatively, interconnect circuit 130 may have an entirely different layout or layer stack arrangement altogether. As described in other embodiments, an adhesive layer (e.g., a pressure-sensitive adhesive (PSA)) may be coated on the upper surface of insulating layer 150 to provide for the attachment of the packaging of battery cells 100 to interconnect circuit 130. This may act to reduce the mechanical stress on the battery terminals. A second insulating layer, which is not visible from the perspective shown in FIG. 8H, may be disposed in between conductive layer 140 of interconnect circuit 130 and optional heat spreader/sink 860. A second insulating layer may provide electrical isolation between the conductive layer 140 and the heat spreader/sink 860 (e.g. in cases in which the heat sink is electrically conducting). The second insulating layer may further incorporate an adhesive layer to facilitate the mechanical attachment of the interconnect circuit 130 to the heat spreader/sink 860, as described in other embodiments.

As an alternative to the use of a heat spreader/sink 860, the conductive layer 140 of the interconnect circuit 130 may be made sufficiently thick to perform as a heat sink in addition to providing electrical conductivity. For example, conductive layer 140 may be made 0.25-3 millimeters thick, or more specifically 0.5-2 millimeters thick, at which point the heat capacity of the conductive layer 140 may be suitably high so as to reduce the impact of any rapid influxes of heat from the battery cells 100 on circuit temperature.

In addition, conductive layer 140 may be patterned so that the area of the openings in conductive layer 140 (as viewed from a plan view perspective) occupies a relatively small percentage of the total area of the conductive layer 140. For example, conductive layer 140 may be designed so that more than 85% of the total area of the layer is occupied by conductive layer 140, or more specifically, so that more than 95% of the total area of the layer is occupied by a conductor. This will tend to increase the heat sinking capability of conductive layer 140.

To assist in the removal of heat from the battery pack, a heat removal element 870 may be placed into contact with the heat spreader/sink 860 or, optionally, in direct contact with interconnect circuit 130. The heat removal element may rely on a variety of means to remove heat from battery pack 830. In some embodiments, heat removal element 870 may include channels that circulate liquid coolant throughout the battery pack and out to a heat exchanger. In other embodiments, the heat removal element may be designed to flow air across battery pack 830 and, ultimately, away from the pack.

In some embodiments, an upper compression plate may be disposed above heat removal element 870 to complete battery pack 830. This element is not shown in FIG. 8G. Alternatively, the assembly shown in FIG. 8G may be layered in the z-direction with additional assemblies if a higher total energy storage capability is desired in the pack. This arrangement would be analogous to the arrangement shown in FIG. 8E.

Compared to configurations in which prismatic battery cells are stacked with their largest surfaces facing each other (e.g., in FIGS. 5A-5G and 6A-6G), a potential advantage of the flat or tiled cell configurations depicted in FIGS. 8A and 8H is that the largest surfaces of the battery cells are easily accessible for heat transfer. This may lead to simpler cooling systems and better thermal uniformity across the battery pack. In addition, a battery pack 830 having a substantially flat form factor may provide an advantage in applications in which a low pack height or profile may be desired, such as in certain automotive and aerospace designs.

Processing Examples

The use of traditional flexible circuits for interconnecting battery cells has a number of challenges. For example, battery cells may utilize large charge and discharge currents, such as during acceleration of electrical/hybrid vehicles, start-stop battery applications, and the like. At the same time, individual battery cells operate at very low voltages, such as 2-5V, for example. The cross-sectional area of conductive components or, more specifically, the thickness of conductive layers suitable for maintaining low power losses is often so large that many conventional mask-and-etch techniques used to pattern these layers are prohibitively expensive and inefficient. For example, the volume of chemical etch waste generated by mask-and-etch manufacturing lines is generally directly proportional to the thickness of the conductive layers. The disposal and/or treatment of this waste presents a significant environmental challenge. In addition, since most existing mask-and-etch manufacturing lines are designed for relatively thin conductors (e.g., 35 micrometer thick copper), an increase in the thickness of the conductor layer can lead to a directly proportionate reduction in the throughput of the manufacturing line. Furthermore, as described above, the etching of thick conductive layers frequently results in undercutting of the etchant beneath the mask layer, which can lead to very poorly-defined traces in the final circuit.

In addition, a significant challenge associated with conventional flexible circuit fabrication techniques is the production of flexible circuits that have openings in both a first insulating layer (known in conventional flexible circuit parlance as a "base") and in a second insulating layer that is disposed on the opposite surface of the conductive layer from the base (known in conventional flexible circuit parlance as a "coverlay"). The challenge in producing these so-called "back-bared" flexible circuits arises from a process step in which a pre-patterned base is laminated in registration to a masked, but un-etched, conductive layer. Because the conductive layer is un-etched, there is no line of sight available between the layers to ensure the proper alignment of the layers prior to lamination. This can result in a low manufacturing yield and increased manufacturing costs for this type of circuit.

To overcome these challenges, various examples of a method of fabricating an interconnect circuit that does not involve mask-and-etch techniques are described herein. Specifically, FIG. 9 is a process flowchart corresponding to method 900 of forming an interconnect circuit that is suitable for interconnecting battery cells in a battery pack, in accordance with some embodiments. FIGS. 10A-14 show the interconnect circuit and its components at various stages of this method.

Method 900 may commence with forming a conductive layer during optional operation 902. This operation may be performed prior to laminating the conductive layer to a support layer as further described below. Furthermore, the operation of forming the conductive layer may be performed prior to forming openings in the conductive layer. Alternatively, the conductive layer may be formed in a different process and supplied to method 900 in a ready-to-use form.

Figure 10A:
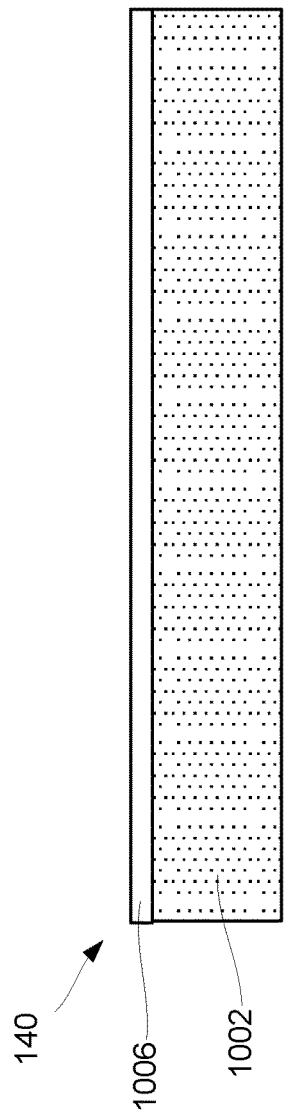
FIGS. 10A-10C are schematic representations of different examples of a conductor.
Figure 10B:
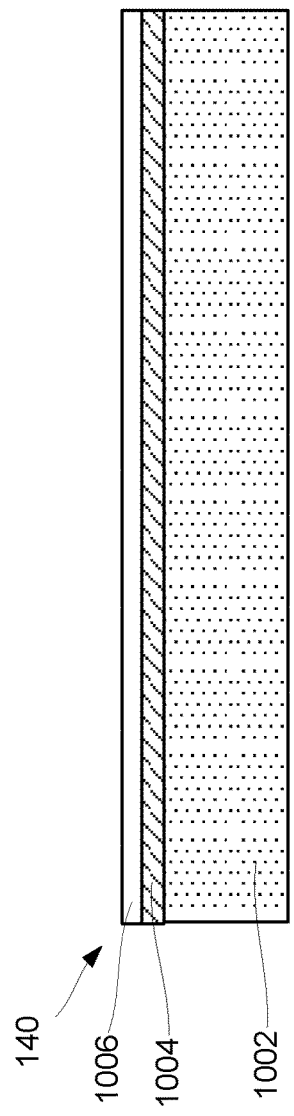
Figure 10C:
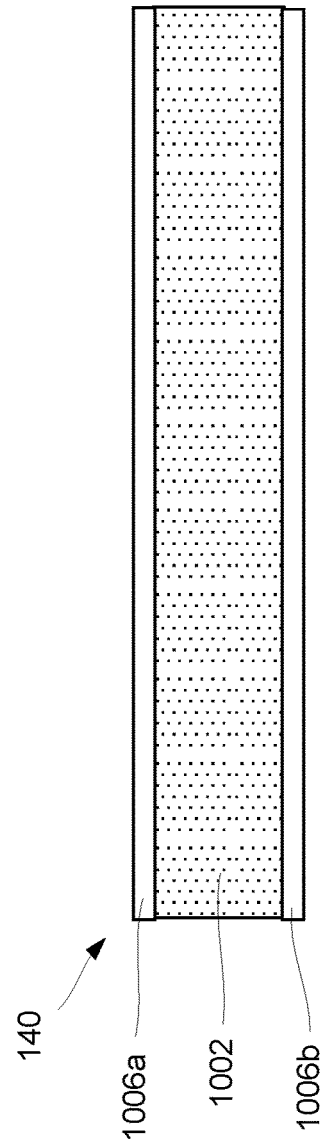

Examples of the formation of a conductive layer during operation 902 (or supplied as such) are shown in FIGS. 10A-10C. FIG. 10A illustrates an example of conductive layer 140 having base sublayer 1002 and surface sublayer 1006 disposed on one side of base sublayer 1002. FIG. 10B illustrates an example of conductive layer 140 having base sublayer 1002, intermediate sublayer 1004 and surface sublayer 1006, such that intermediate sublayer 1004 is disposed between base sublayer 1002 and surface sublayer 1006. Finally, FIG. 10C illustrates an example of conductive layer 140 having two surface sublayers 1006a and 1006b such that base sublayer 1002 is disposed between two surface sublayers 1006a and 1006b.

Regardless of the example, each sublayer may have a different composition. Specifically, base sublayer 1002 may have a different composition than intermediate sublayer 1004 and surface sublayer 1006. Furthermore, intermediate sublayer 1004 may have a different composition than surface sublayer 1006. In some embodiments, base sublayer 1002 may include aluminum or alloys thereof, nickel, copper, or steel. Intermediate sublayer 1004 may include chromium, titanium, nickel, vanadium, zinc, or copper. Surface sublayer 1006 may include tin, lead, zinc, nickel, silver, palladium, platinum, gold, indium, tungsten, molybdenum, chrome, or copper. Intermediate and surface sublayers may each be coated on either or both sides of base sublayer, as shown in FIGS. 10A-10C. While base sublayer 1002 is generally available as a sheet or roll of material, intermediate sublayers 1004 and surface sublayers 1006 may generally be applied or coated using techniques including electroplating, electroless plating, sputtering, vacuum evaporation, electron beam evaporation, cladding, or cold welding. Alternatively, intermediate sublayers 1004 and surface sublayers 1006 may be applied or coated using other techniques altogether.

Forming one or more sublayers on a base sublayer allows more material options for the base layer without compromising the performance of the interconnect circuit. In some cases, the performance (e.g., weight) and cost of the resulting interconnect circuit is improved when a stacked conductive layer is used. For example and as noted above, the base layer may be made from aluminum. Aluminum is not a common material for electrical conductors because it tends to form an oxide layer that is difficult to make electrical and mechanical connections to. For example, aluminum foils and other types of aluminum structures may be difficult to solder to or to resistance weld to. Copper has been a material of choice for such applications. However, copper is substantially more expensive and much heavier. The density-to-conductivity ratio of copper is twice greater than that for aluminum.

By contrast, in embodiments described herein, a surface sublayer may be used for electrical and/or mechanical coupling to an aluminum base sublayer, and the aluminum base sublayer may be used as a primary electrical conductor and, in some embodiments, a primary thermal conductor. In some embodiments, an interface sublayer may be disposed between the surface sublayer and aluminum base sublayer, for example, to promote adhesion between the two. In some embodiments, the thickness of the surface sublayer may be between about 0.01 and 10 micrometers or, more specifically between about 0.05 micrometers and 1 micrometer. The thickness of the interface sublayer may be between about 0.01 micrometers and 10 micrometers or, more specifically between about 0.05 micrometers and 1 micrometer. The thickness of the base sublayer generally depends on the overall conductance requirements of the interconnect circuit. The thickness of the base sublayer may be between about 10 and 2000 micrometers or, more specifically between about 50 and 500 micrometers.

In the above example, the conductive layer forming operation may involve forming the intermediate sublayer over the base layer followed by forming the surface layer on the intermediate layer.

It should be noted that the surface sublayer of a conductive layer is not limited to contact pad areas. Instead, the surface sublayer extends under insulating layers as, for example, shown in FIG. 18. Specifically, FIG. 18 illustrates conductive layer 140 including surface sublayer 1006 disposed on base sublayer 1002 and laminated to insulating layer 150. An intermediate sublayer may or may not be present as described above. As such, surface sublayer 1006 extends beyond contact pad 160 and may assist with adhesion of insulating layer 150 to conductive layer 140. This is contrary to an example where surface sublayer is formed after the conductive layer is laminated to the insulating layer as, for example, is shown in FIG. 19. Specifically, FIG. 19 illustrates surface sublayer 1006 being present only in contact pad 160 and only within opening 157.

It should be noted that in some embodiments, surface sublayers may be present on both sides of base sublayer as, for example, shown in FIG. 20. Specifically, FIG. 20 illustrates conductive layer 140 including base sublayer 1002, first surface sublayer 1006*a*, and second surface sublayer 1006*b* such that base sublayer 1002 is disposed between first surface sublayer 1006*a* and second surface sublayer 1006*b*. In this example, first surface sublayer 1006*a*, and second surface sublayer 1006*b* have been laminated to corresponding insulating layers 150 and 156.

Configurations in which surface sublayers 1006*a* and 1006*b* extend underneath insulating layer 150 and/or second insulating layer 156 (as shown in FIGS. 18 and 20) may be of particular benefit when the base sublayer 1002 is made from aluminum foil. During the process of rolling aluminum sheet stock to produce foil, rolling oils and other contaminates can form on the surface of the aluminum that tend to reduce the adhesion that can be achieved between insulating layer 150 and the aluminum foil. In addition, if the aluminum foil is annealed as a roll (as is typically done following rolling if soft or annealed foil is desired), the roll can oxidize from the top and bottom surfaces of the roll towards the center during annealing, leading to a gradient in oxide thickness (and, consequently, a gradient in surface energy) across the foil web. This, also, may interfere with the adhesion of insulating layer 150 with base sublayer 1002. A potential solution to this issue is to apply intermediate sublayer 1004 (as shown in FIG. 10B) and/or surface sublayer 1006 to base sublayer 1002 prior to lamination to insulating layer 150, as shown in FIGS. 18 and 20. During the application of intermediate and/or surface sublayers, a cleaning and/or etching step may be employed to remove contaminates and the aluminum oxide layer from the aluminum foil. For example, if intermediate and/or surface sublayers are applied using sputtering, a plasma cleaning step may be used to remove the contaminants and/or the aluminum oxide layer prior to deposition of intermediate and/or surface sublayers. The application of intermediate and/or surface sublayers at operation 902 may therefore act to both promote the adhesion of insulating layer 150 to aluminum base sublayer 1002 (e.g., at operations 910, 918, and/or 926), as well to electrically activate the surface of the aluminum base sublayer 1002 for further processing (e.g., make it solderable).

In some embodiments, the conductive foil may include a continuous coating of an electrically insulating material on one surface. This insulating coating may have a thickness of between about 0.5 and 50 micrometers. The insulating coating may be coated, deposited, anodized, or laminated onto the conductive layer, either before or after the lamination of the insulating layer and/or the second insulating layer. If the thin layer of electrically insulating material is thinner and/or more thermally conductive than the insulating layer and/or the second insulating layer, in some embodiments the thin layer of insulating material might enable processes such as welding or heat sinking to take place efficiently while also preventing the exposed (i.e., not welded or soldered) surfaces of the conductive foil from forming electrical shorts to other elements of the battery module or pack. In some embodiments, the thin layer of electrically insulating material may comprise a metal oxide material. Examples of metal oxide materials which may be suitable for the thin layer of insulating material include, but are not limited to, silicon dioxide ($SiO_2$), silicon nitride ($Si_3N_4$), aluminum oxide ($Al_2O_3$), boron nitride (BN), aluminum nitride (AlN), diamond (C), or silicon carbide (SiC).

Returning to FIG. 9, method 900 may proceed with forming a set or multiple sets of first conductive layer openings in the conductive layer during operation 906. FIG. 11A illustrates conductive layer 140 after this operation, in accordance with some embodiments. Specifically, this conductive layer 140 includes one set 1005 of first conductive layer openings 1010. The openings may be formed using various techniques including, but not limited to, punching, flat bed die cutting, match-metal die cutting, male/female die cutting, rotary die cutting, steel rule die cutting, laser cutting, water-jet cutting, machining, or combinations thereof. In some embodiments, rotary die cutting may be used to form these sets of openings. Each set of openings may partially define a region (e.g., contact pad 160 for electrically coupling to a terminal of a battery cells as, for example, shown in FIG. 11A) of the conductive layer. When the region is a contact pad, the relative position of different sets of openings (in the conductive layer) is determined by the relative positions of battery cells in a pack as well as connection schemes between these battery cells, as described above.

Referring to FIG. 11A, after forming set 1005 of conductive layer openings 1010, two or more connecting tabs 1020 mechanically support and maintain registration of the region of conductive layer 140 (identified with a dashed line in FIG. 11A) relative to other portions of conductive layer 140 (e.g., portions of conductive layer 140 outside of the boundary defined by set 1005 of first conductive layer openings 1010). Specifically, FIG. 11A illustrates four connecting tabs 1020 supporting the region of conductive layer 140 which later becomes contact pad 160. In some embodiments, these two or more connecting tabs 1020 may be evenly distributed around the region of the conductive layer to provide uniform support. For example, two or more connecting tabs 1020 may be offset by the same angle (e.g., 90° in FIG. 11A) with respect to each other relative to the center of the region of conductive layer 140, which later becomes contact pad 160.

It should be noted that one (or more) of connecting tabs 1020 (shown in FIG. 11A) may later be used as a fusible link (170 in FIG. 12A). As further described elsewhere in this disclosure, the fusible link may require a very particular geometry to ensure its electrical fuse characteristics. Specifically, the length and the cross-section of the fusible link need to be precisely controlled and often require high aspect ratio cross-sectional profiles, in particular when thicker conductive layers are used for overall current carrying. This requirement may apply to forming a connecting tab 1020 that later serves as a fusible link.

Referring to operation 906 in FIG. 9, when conductive layer openings 1010 are formed and define connecting tabs 1020, traditional mask-and-etch-based flexible circuit fabrication methods may have major issues with patterning circuit traces with a linewidth smaller than four to five times the thickness of the conductive foil. In some embodiments, the non-chemical-etch-based patterning methods described above with reference to operation 906 may be used to precisely define the width of the fusible link independent of its thickness. For example, if a conductive layer is 100 micrometers thick, the width of the fusible link or other narrow circuit traces may range from 50-10000 micrometers.

The use of non-chemical-etch-based patterning (operation 906 in FIG. 9) to achieve precise control of the width (and the aspect ratio) of the fusible link may result in better control over the fuse characteristics, e.g., a current required to cause the fusible link to blow open (i.e., the fuse current rating), in comparison to traditional ways of patterning conductive layers. Specifically, the conductive layer may be patterned using a through-cutting technique before the conductive layer is attached to an insulating layer. Alternatively, when laser processing or machining is used for patterning the conductive layer, the conductive layer may be attached to the insulating layer before patterning. In this example, operation 906 in FIG. 9 may involve ablating or milling away the conductive layer from the insulating layer after the attachment has occurred. For precise control over fusible characteristics of formed connecting tabs (one or more of which is later used as fusible links), an ohmmeter or four-point probe may be used to provide feedback to the patterning system while forming conductive layer openings in the conductive layer during operation 906.

As noted above, FIG. 11A illustrates conductive layer 140 after completing operation 906. Conductive layer 140 has set 1005 of first conductive layer openings 1010. In this example, set 1005 includes four first conductive layer openings 1010. One having ordinary skill in the art would understand that one set 1005 may include any number of two or more first conductive layer openings 1010. First conductive layer openings 1010 in set 1005 are separated by connecting tabs 1020. Connecting tabs 1020 provide mechanical support during subsequent processing and, in some embodiments, are used as references, e.g., provide mechanical registration/alignment of conductive layer 140 relative to other components, e.g., one or more insulating layers. While the connecting tabs 1020 shown in the top view of FIG. 11A are rectangular in shape, in other embodiments the connecting tabs 1020 may possess any shape, size, or aspect ratio. In addition, the size and shape of the connecting tabs 1020 may differ across the interconnect circuit 130. For example, different connecting tab sizes and shapes may be used in order to provide a desired level of mechanical support and/or registration in different regions of the interconnect circuit.

First conductive layer openings 1010 in set 1005 surround and define contact pad 160. The boundaries of contact pad 160 are shown with a dashed line in FIG. 11A. The boundaries of contact pad 160 are further defined in later operations by removing some connecting tabs 1020. For example, FIG. 11A illustrates contact pad 160 being supported by four connecting tabs 1020. For effective support, connecting tabs 1020 may optionally be distributed uniformly around the perimeter of contact pad 160. For example, FIG. 11A illustrates contact pad 160 having a circular shape and four connecting tabs 1020 positioned at 90° with respect to each other.

It should be noted that while FIG. 11A and subsequent figures refer to a region defined and surrounded by first conductive layer openings as a contact pad, this region may be any other components formed from the conductive layer, such as conductive layer islands, voltage traces, auxiliary traces, contact pads, collections of contact pads provided on the same continuous portion of the conductive layer, or any other like component.

Returning to FIG. 9, method 900 may proceed with laminating the conductive layer to a support layer during operation 910. If the support layer has any patterned features, then just prior to lamination, these features may be aligned with the first conductive layer openings formed in the previous operation. In this example, the alignment of a patterned support layer to a partially-patterned conductive layer may be performed using openings in each of the layers as aligning features. Compared to conventional techniques for producing a back-bared flexible circuit, the availability of patterned features on the same side of both the conductive layer and insulating layer may help simplify process the aligning of the layers, thereby improving yield and reducing cost.

In some embodiments, the optimal lamination conditions for the support layer may depend on how the support layer is used in the process. For example, if the support layer is the insulating layer that is to become a part of the completed interconnect circuit, a combination of heat and/or pressure may be used to attach support layer to the conductive layer and form a high-strength adhesive bond. By contrast, if the support layer is a releasable substrate (as described below), the support layer may optionally include a low-tack pressure-sensitive adhesive that allows for the formation of a low-tack bond to conductive layer 140 through a simple pressure-based lamination process.

FIG. 11C is a schematic top view of an example of interconnect circuit 130 after laminating conductive layer 140 to support layer 1025. In this view, conductive layer 140 is shown on the top of support layer 1025. Portions of support layer 1025 are visible through conductive layer openings 1010. For reference, support layer 1025 is shown as a standalone component (prior to laminating to the conductive layer) in FIG. 11B. In this example, support layer 1025 may be operable as an insulating layer that may later remain a part of the interconnect circuit. In this case, support layer 1025 may already be patterned. FIG. 11B illustrates support layer 1025 having optional opening 155 and slot 220, which may be referred to as an insulating layer opening and an insulating layer slot. In some embodiments, support layer 1025 may only have openings but not slots. In FIG. 11C, a part of slot 220 is visible through conductive layer openings 1010. In this view, opening 155 may be fully covered by conductive layer 140. As such, opening boundary 1055 is shown with a dashed line.

Figure 11E:
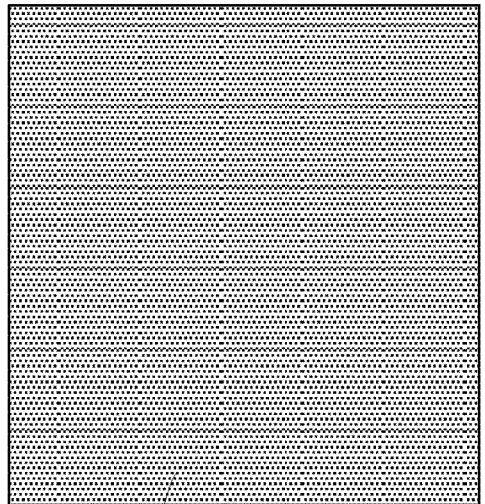
FIG. 11E is a schematic representation of a portion of a support layer having no opening, in accordance with some embodiments.
Figure 11D:
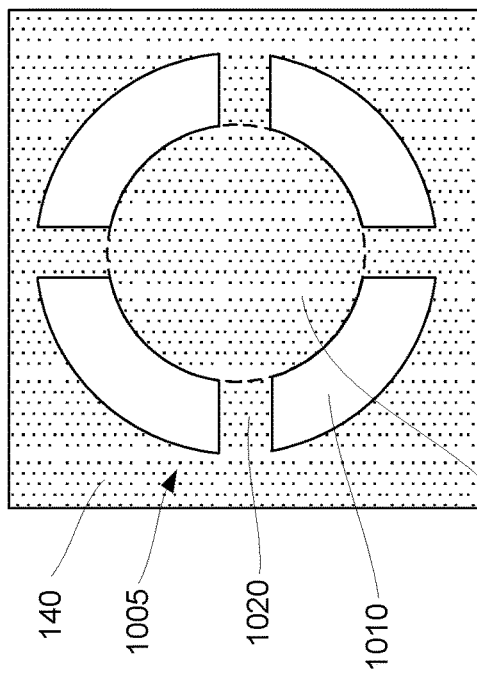
FIG. 11D is a schematic representation of a portion of a conductive layer having a contact pad, in accordance with some embodiments.
Figure 11F:
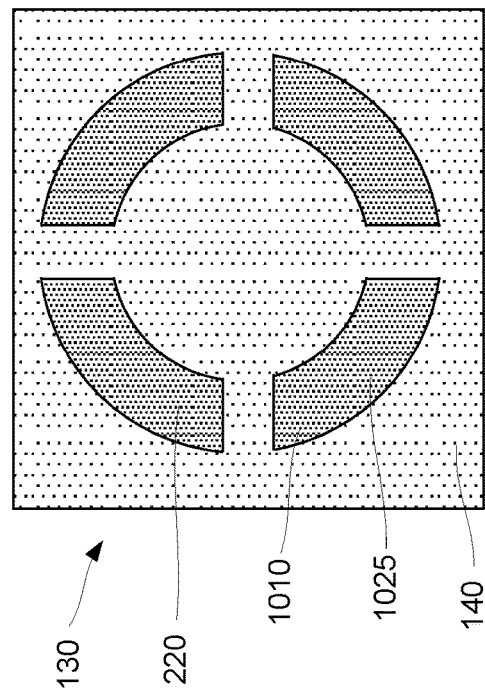
FIG. 11F is a schematic representation of a portion of an interconnect circuit having the conductive layer of FIG. 11D and the support layer of FIG. 11E, in accordance with some embodiments.

Alternatively, at the time of lamination to the conductive foil, support layer 1025 may not have any features. For example, support layer 1025 may be a temporary releasable substrate that is later removed and, in some embodiments, replaced with a different layer. The releasable substrate may be used to temporarily support the conductive foil while additional openings are formed in the foil or, more specifically, when some or all of the connecting tabs are removed. FIG. 11F is a schematic top view of another example of interconnect circuit 130 after laminating conductive layer 140 to support layer 1025, in which support layer is a releasable liner without any openings. An example of such a support layer 1025 is shown in FIG. 11E. FIG. 11D shows conductive layer 140 prior to lamination and is provided for reference.

After laminating the conductive layer to the support layer, the support layer mechanically supports and maintains registration of the region of the conductive layer relative to the other portions of the conductive layer. As such, some or all of the two or more connecting tabs may be removed as support from these opening is not needed. It should be noted that one or more connecting tabs may be completely or partially retained in order to provide electrical connections to the region of the conductive layer. Returning to FIG. 9, method 900 may proceed with removing at least one of the connecting tabs in each of the multiple sets during operation 914. During this operation, at least two of the first conductive layer openings in each set are converted into a continuous conductive layer channel that at least partially surrounds the region (e.g., a contact pad or other circuitry of the conductive layer). Various techniques may be used to remove the connecting tabs, including, but not limited to, punching, flat bed die cutting, match-metal die cutting, male/female die cutting, rotary die cutting, laser cutting, laser ablation, machining, applying a large voltage, or combinations thereof. In some embodiments, a vision alignment system may be used to ensure that the cutting apparatus precisely removes the connecting tabs. Such a vision system could enable a highly precise removal step by registering the cutting apparatus to fiducial marks made in the conductive layer during the formation of sets of first openings in the conductive layer at operation 902. In some embodiments, rotary die cutting with a vision alignment system may be used to remove the connecting tabs. The die cutting pattern may be made slightly larger than the size of the tab itself to make sure the connecting tabs are completely removed by the cutting apparatus. In some embodiments, the insulating layer lying above (or beneath) the connecting tab may be removed in the process of removing the tab, while in other embodiments the insulating layer may be left intact.

In some embodiments, while at least one of the connecting tabs is removed during operation 914, at least one of the connecting tabs 1020 is retained in the final assembly and is operable as a fusible link. The fuse current rating of a fusible link is generally proportional to its thickness and width. The thickness of the fusible link is typically the same as the surrounding regions of the conductive layer and may range from about 10-2000 micrometers, or more specifically from about 50-500 micrometers. Specifically, the fusible link is monolithic with the rest of the conductive layer. Achieving a desired fuse current rating, therefore, is generally approached by controlling the width of the fusible link, which may range from about 50-10,000 micrometers, or more specifically from about 100-1,000 micrometers using the methods described herein. For a 100-micrometer thick conductive layer and a desired fuse current rating of 30 Amps, the width of the fusible link should be about 500 micrometers. In some embodiments, the width of the fuse may be varied depending on the measured thickness of the conductor layer. For example, if the conductive layer thickness is measured at 110 micrometers (e.g. due to variability in the thickness of the incoming metal foil), the width of the fusible link may be adjusted to 450-460 micrometers to maintain the target fuse current rating of around 30 Amps. This adjustment may be performed during operation 906 for each link to ensure consistent fusing characteristics. The adjustment may be performed based on the thickness measurements and/or based on the actual resistance measurement of a connecting tab while the openings defining this connecting tab are being formed.

Alternatively, in other embodiments method 900 may be used to fabricate features in conductive layer 140 that are completely electrically isolated from other features. In these embodiments, all of the connecting tabs that are connected to a region of conductive layer 140 in which electrical isolation is desired may be removed at operation 914. For example, the conductive layer islands 142*a*, 142*b*, and 142*c* shown in FIG. 1E may be first mechanically coupled via one or more connecting tabs until support layer 1025 is laminated to conductive layer 140. Then, during operation 914, all of the connecting tabs used to hold conductive layer islands 142*a*, 142*b*, and 142*c* in registration may be removed to fully electrically isolate these conductive layer islands from each other, with registration still being maintained by support layer 1025. Additional examples of electrically isolated features that may be patterned using this method include, but are not limited to, circuit traces, busbars, ancillary traces, heat sinks, surface mount traces, routing traces, or other types of circuitry.

Figure 12B:
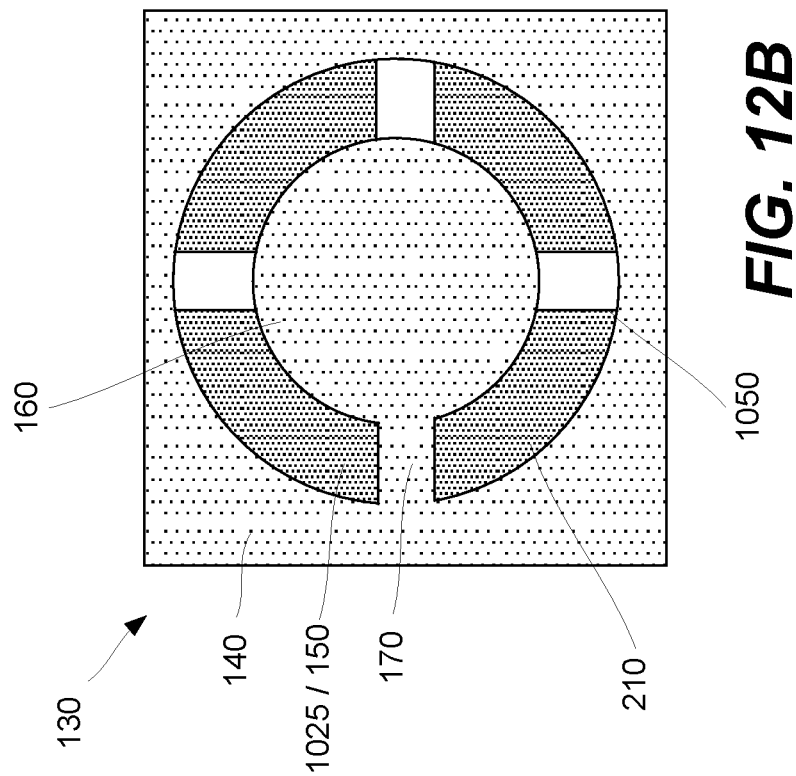
FIGS. 12A and 12B illustrate two examples of an interconnect circuit after the connecting tab removal operation.
Figure 12A:
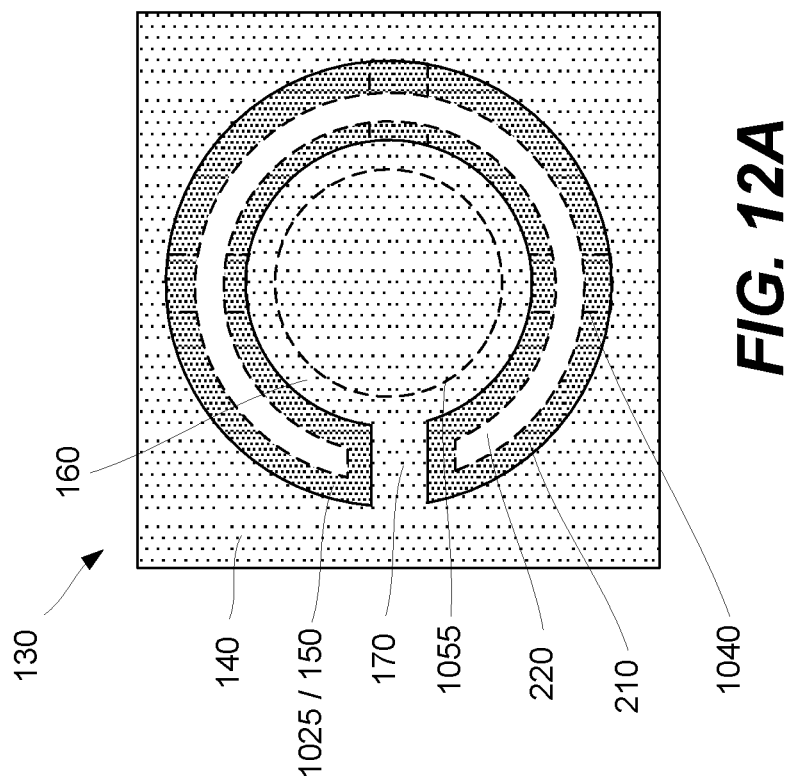

FIGS. 12A and 12B illustrate two alternative examples of interconnect circuit 130 after the connecting tab removal operation. In both examples, three connecting tabs positioned on the top, right, and bottom are removed. The connecting tab on the left has been retained providing an electrical connection between contact pad 160 and other parts of conductive layer 140. One having ordinary skill in the art would understand that this example would be also applicable to other components formed from conductive layer (besides contact pad 160). This remaining connecting tab may be operable as fusible link 170 as described above. The difference between these two examples lies in whether or not the support layer 1025 is cut when the connecting tabs are removed. Specifically, FIG. 12A illustrates the three tabs being removed without cutting through support layer 1025. As such, support layer 1025 may be operable as first insulating layer 150 and remain as a part of interconnect circuit 130.

On the other hand, FIG. 12B illustrates the three tabs being removed together with corresponding portions of support layer 1025 leaving tab openings 1050 in support layer 1025. This example may be used when support layer 1025 is operable as a temporary releasable layer, which is later removed and does not become a part of interconnect circuit 130. In this example, support layer 1025 may subsequently be replaced with an insulating layer that does not necessarily have such tab openings. Consequently, the presence of tab openings 1050 in the temporary releasable layer is irrelevant for electrical insulation. Furthermore, the size and location of tab openings 1050 may be such that support layer 1025 continues to provide mechanical support and registration to various features of conductive layer 140 and, in particular, to contact pad 160 of conductive layer 140 (or, more generally, the region) during later operations.

Materials that may be suitable for the releasable layer include, but are not limited to, polyimide (PI), polyethylene naphthalate (PEN), polyethylene terephthalate (PET), polymethyl methacrylate (PMMA), ethyl vinyl acetate (EVA), polyvinyl butyral (PVB), polyethylene (PE), paper, or conductive foil. Furthermore, the releasable layer may include an adhesive coating such as a PSA on its surface to facilitate bonding to the conductive foil. Alternatively, if the releasable layer does not include an adhesive coating, an adhesive material such as a thermoplastic sheet or wet-coatable PSA may be incorporated in between the conductive layer and releasable layer just prior to lamination. The releasable layer and its coatings may maintain a low-tack adhesive bond to the conductive layer through some operations including lamination of the conductive layer to an insulating layer. This feature ensures mechanical support to the conductive layer and its components while at the same time allowing the releasable layer to be removed when mechanical support is later provided by the insulating layer.

As noted above, the releasable layer may be used for registering the patterned insulating layer to the patterned conductive layer. For example, in a roll-to-roll-based manufacturing process, a roll of partially-patterned conductive layer may be additionally patterned with the releasable layer laminated to it to provide mechanical support to various conductive layer components formed during patterning (for example, this may be carried out in accordance with operation 906, 910, and 914 as shown in FIG. 9). This patterning process may be followed by the singulation of the rolls of conductive layer/releasable layer laminate into individual parts including the patterned conductive layer and releasable layer. For example, the individual parts may correspond to a single interconnect circuit or to 2-100 interconnect circuits. Similarly, rolls of the insulating layer may also be patterned in-line and then singulated into individual parts that optionally correspond to a single interconnect circuit or to 2-100 interconnect circuits. The individual parts (one part being the patterned conductive layer/releasable layer laminate and the other part being patterned insulating layer) may then be aligned with each other. For example, various flexible circuit lamination techniques, such as pin-based or optical registration, may be used for this purpose.

After the alignment, the parts are laminated together and the releasable layer is removed. Comparing this process to conventional processes in which patterned conductive layers and patterned insulating layers are registered to each other as continuous rolls in-line, the process described herein may help to simplify manufacturing, improve throughput, and improve yield, because it is generally significantly simpler to align individual parts for lamination than aligning entire rolls. Regardless of whether support layer 1025 is a first insulating layer or the support layer 1025 is a releasable layer and first insulating layer is later laminated to the conductive layer, the first insulating layer may be patterned with an array of openings prior to lamination to the conductive layer as shown by optional operations 908 and 916 in FIG. 9. In some embodiments, the first insulating layer may be coated with or bonded to an adhesive layer, which facilitates lamination to the conductive layer. In some embodiments, an adhesive material is a part or sublayer of the first insulating layer.

As in other embodiments, the alignment of patterned first insulating layer 150 to patterned conductive layer 140 may be performed using openings in each of the layers as aligning features. Compared to conventional techniques for producing a back-bared flexible circuit, the availability of patterned features on the same side of both the conductive layer 140 and insulating layer 150 may help simplify process the aligning of the layers, thereby improving yield and reducing cost. In some embodiments, releasable layer 1025 may be used to provide mechanical support to conductive layer 140 during the mask-and-etch-based patterning of conductive layer 140, e.g., prior to lamination of patterned conductive layer 140 to patterned insulating layer 150 using alignment features in the layers. This approach would also simplify the alignment and lamination of the layers relative to conventional techniques.

In some embodiments, an example of interconnect circuit 130 shown in FIG. 12A may be used for connecting to batteries without further processing. Alternatively, additional operations may be involved in forming interconnect circuit 130 as, for example, shown in FIG. 9. Specifically, if the support layer, which is laminated to the conductive layer prior to removing one or more connecting tabs, is a releasable temporary substrate, then method 900 may proceed with laminating a first insulating layer to the conductive layer during operation 918 followed by removing the support layer during operation 922. Note that during operation 918, the first insulating layer may be laminated to the opposite side of the conductive layer from the releasable substrate. The process conditions of this lamination step may be chosen such that the insulating layer 150 forms an intermediate level of tack with conductive layer 140 and the releasable layer but not a high level of tack. This can help ensure that the conductive layer 140 will remain bonded to insulating layer 150 during subsequent peeling of the releasable layer, while also ensuring that the bond will not be so strong that it becomes impossible to peel the releasable layer apart from the insulating layer 150 in regions (such as in conductor layer channel 210) where these two layers are in contact. The releasable layer may then be peeled from conductive layer 140 and insulating layer 150 during operation 922. In other words, the releasable layer may be used to provide support to conductive layer 140 prior to and while laminating insulator layer 150. In this example, the releasable layer may not be needed after laminating insulator layer 150 to conductive layer 140 as, after laminating, insulator layer 150 provides support to conductive layer 140.

This releasable layer should be distinguished from a temporary substrate, further described below with reference to FIGS. 27A-27F and FIGS. 28A-28B. The temporary substrate may remain as a part of interconnect even after laminating the one or more insulator layers. In fact, the temporary substrate may be laminated over one of the insulating layers such that this insulating layer is disposed between the conductive layer and the temporary substrate. The temporary substrate may be used to support portions of the conductive layer through the openings in the insulator layer when, for example, these openings in the insulator layer are too big to provide support to some features of the conductive layer.

In some embodiments, when the support layer is a temporary substrate, it may be removed during optional operation 942, which is performed after electrically coupling the contact to the battery terminal during operation 934. In other words, the temporary substrate may be used to provide support to different positions of the conductor, such as various contacts of the conductor, up until these portions are connected to battery terminals and further support by the releasable layer is not needed. This sequence of operations is further described below with reference to FIGS. 28A-28C.

In some embodiments, operations 918 and 922 are not performed and the support layer remains a part of the interconnect circuit. In these embodiments, the support layer may be also referred to as a first insulating layer.

In some embodiments, method 900 may also involve laminating a second insulating layer to the conductive layer during optional operation 926. After this operation, the conductive layer is disposed between the first insulating layer and the second insulating layer. This operation is independent from optional operations 918 and 922 described above. In other words, operation 926 may be performed without performing operations 918 and 922, in which case the first insulating layer is a support layer laminated to the conductive layer during operation 910. Alternatively, when operations 918 and 922 are performed, the first insulating layer is laminated to the conductive layer during operation 918 and the releasable layer is removed during operation 922. In this later case, the releasable layer may be effectively replaced with the second insulating layer.

FIG. 13A illustrates a top schematic view of an example of second insulating layer 156 prior to laminating this layer to the conductive layer. Second insulating layer 156 may include second insulating layer opening 157. As described above, this opening may be used to access the contact pad aligned with this opening during, for example, connecting the contact pad to a battery cell terminal. Second insulating layer 156 may include second insulating layer slot 221 to provide flexibility to a portion of second insulating layer 156 partially surrounded by this slot. Second insulating layer opening 157 and slot 221 may be patterned during operation 924, e.g. prior to operation 926.

FIG. 13B illustrates a top schematic view of an example of second insulating layer 156 after to laminating this layer to conductive layer 140. Furthermore, contact pad 160 of conductive layer 140 is visible through second insulating layer opening 157. FIG. 14 illustrates a cross-sectional schematic view of the same example as in FIG. 13B. First insulating layer 150 and its features are visible in this view. Specifically, first insulating layer opening 155 exposes a bottom surface of contact pad 160, while second insulating layer opening 157 exposes a top surface of contact pad 160. FIG. 14 illustrates both openings 155 and 157 having the same size. In some embodiments, openings 155 and 157 may have different sizes. For example, opening 157 may be used to protrude a battery cell terminal and may be larger than opening 157 that is used to access contact pad 160 to form an electrical connection between contact pad 160 and battery cell terminal. FIG. 14 also illustrates an example in which both insulating layers 150 and 156 have corresponding (and aligned) insulating layer slots 220 and 221. In some embodiments, contact pad 160 does not extend to insulating layer slots 220 and 221 and insulating layer 150 and 156 are laminated directly to each other in the area near slots 220 and 221 and around contact pad 160. FIG. 14 also shows fusible link 170 extending to contact pad 160. Fusible link 170 may be laminated between two insulating layers 150 and 156 as shown in FIG. 14.

Figure 15:
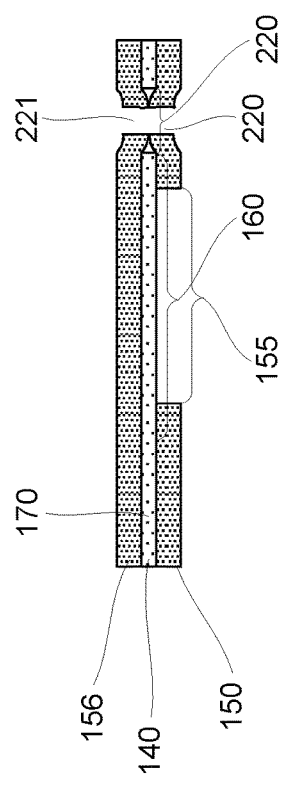
FIGS. 15-17 are side-view schematic diagrams illustrating different examples of interconnects having different arrangements of one or more insulating layers and openings in these insulating layers, in accordance with some embodiments.
Figure 16:
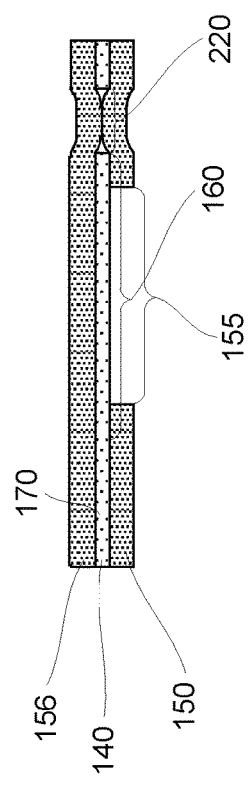

In some embodiments, the second insulating layer may have no openings above the contact pad 160. FIGS. 15 and 16 illustrate two such examples. Specifically, FIG. 15 illustrates an example in which both insulating layers 150 and 156 have corresponding insulating layer slots 220 and 221, which are aligned (similar to an example shown in FIG. 14 and describe above). However, only a bottom surface of contact pad 160 is exposed through first insulating layer opening 155. Second insulating layer 156 does not have a corresponding opening. Such a layer stack arrangement could be useful in applications in which complete electrical isolation of one surface of the interconnect circuit 130 is desired, for example.

FIG. 16 illustrates an example in which both insulating layers 150 and 156 do not have insulating layer slots (unlike examples shown in FIG. 14 and FIG. 15 and describe above). This example provides more support to contact pad 160 while making it less flexible at the same time. Some flexibility may be provided by forming slits in insulating layers 150 and 156 in particular around conductive layer channel 210 (as shown in FIG. 2D, for example). Furthermore, similar to the example shown in FIG. 15, only a bottom surface of contact pad 160 is exposed through first insulating layer opening 156. Second insulating layer 156 does not have a corresponding opening in this case.

In some embodiments, method 900 may involve forming slots in one or more insulating layers during optional operation 930. For example, the slots may be formed in the first insulating layer and/or in the second insulating layer. Alternatively, in some embodiments, one or both insulating layers have pre-formed slots at the time of their lamination to the conductive layer. Furthermore, slots may be formed (e.g., at least partially) during removal of the connecting tab as further described below. The function of the slots, such as providing a degree of freedom of motion to the contact pads) is described above with reference to FIG. 2C, FIG. 2D, and FIGS. 2F-2H.

Figure 17:
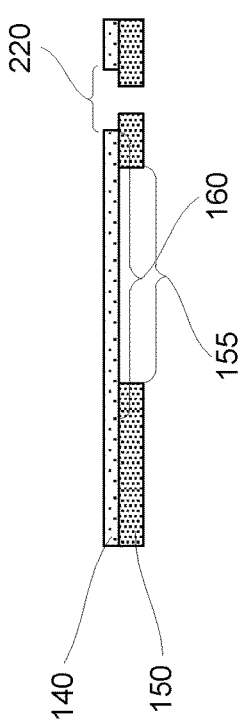

In some embodiments, an interconnect circuit has only one insulating layer when its fabrication is completed. This insulating layer may be a support layer initially present during fabrication or may be added later in the process (e.g. at operation 918). One such example of the insulating layer is show in FIG. 17, which is a schematic cross-sectional view illustrating insulating layer 150 laminated to conductive layer 140. Conductive layer 140 has contact pad 160 and, in some embodiments, conductive layer channel 210 partially surrounding contact pad 160. Insulating layer may include insulating layer opening 155 to provide access to contact pad 160. In some embodiments, the relative positions of conductive layer 140 and insulating layer 150 may be exchanged (e.g., either insulating layer 150 may be disposed between conductive foil 140 and battery cells 100 or conductive foil 140 may be disposed in between battery cells 100 and insulating layer 150) depending on the interconnection scheme of the battery pack.

In some embodiments, method 900 may also involve electrically coupling the contact pad to a terminal of a battery cell during operation 934. The terminals of the battery cell may optionally protrude through the openings in this insulating layer 150 to reach the conductive layer 140.

Figure 21A:
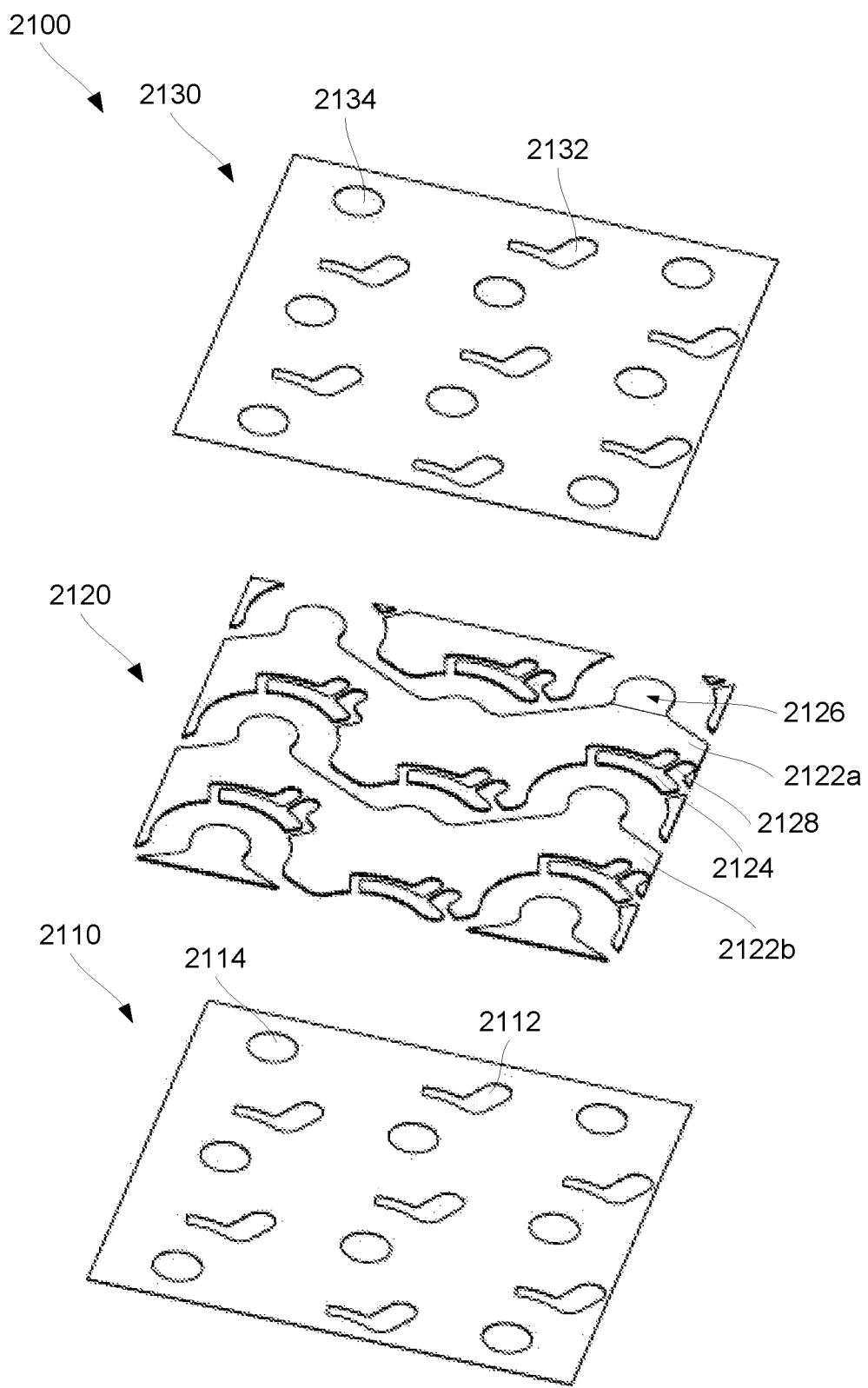
FIG. 21A is an expanded schematic view of an interconnect, in accordance with some embodiments.
Figure 21B:
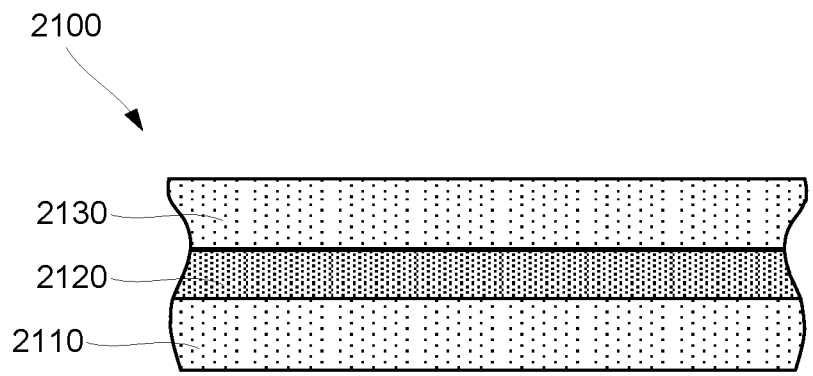
FIGS. 21B-21D are side-view schematic diagrams illustrating different insulator examples for interconnects, in accordance with some embodiments.
Figure 21C:
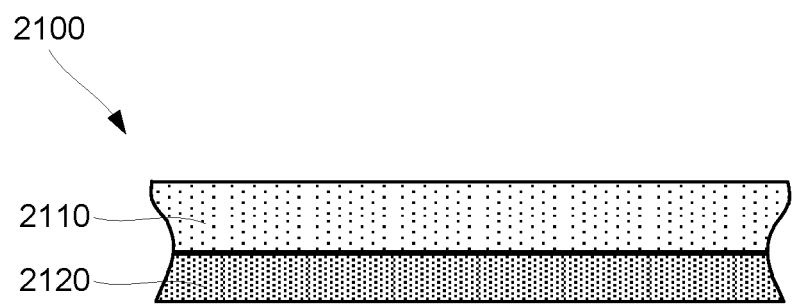
Figure 21D:
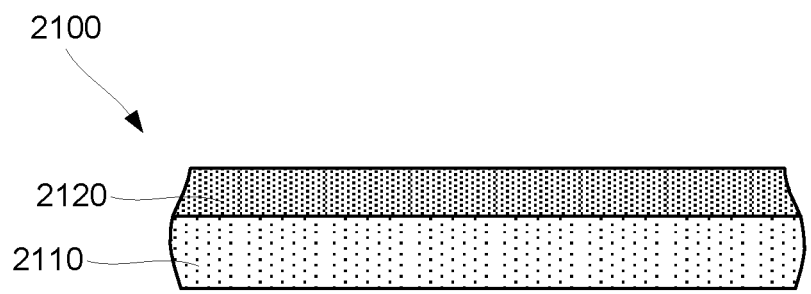

FIG. 21A is an expanded schematic view of interconnect 2100, in accordance with some embodiments. Interconnect 2100 may include conductor 2120 disposed between first insulator 2110 and second insulator 2130. In some embodiments, interconnect 2100 may include only one insulator, e.g., only first insulator 2110 as shown in FIG. 21D or only second insulator 2130 as shown in FIG. 21C. In these embodiments, a side of conductor 2120 opposite of the only insulator may be exposed. The connection to battery cells may be performed such that the only insulator is disposed between conductor 2120 and the battery cells or such that conductor 2120 is disposed between the battery cells and the only insulator.

When both insulators 2110 and 2130 are present, the configurations of these insulators may be the same or different. The description below focuses primarily on the features of first insulator 2110, which may be the insulator disposed between the battery cells and conductor 2120 or disposed on the opposite side of conductor 2120 (and separated by conductor from the battery cells). One having ordinary skill in the art would understand that these described features of first insulator 2110 will also apply to features of second insulator 2130. In some embodiments, first insulator 2110 and/or second insulator 2130 may comprise a polymer dielectric film, a flame-retardant polymer dielectric film, or a flame-retardant non-polymer film.

In some embodiments, conductor 2120 includes first portion 2122a and a second portion 2122b electrically isolated from the first portion 2122a. Additional portions may be present as well. Each portion of conductor 2120 may be configured to connect to terminals of two or more battery cells in order to interconnect these batteries. Various interconnection schemes are possible with these portions or, more generally, with interconnect 2100. For example, all cells connected to the same portion of conductor 2120 may be interconnected in series, e.g., wherein each individual portion is connected to the opposite terminals of two battery cells. Alternatively, a set of cells connected to the same portion of conductor 2120 may be interconnected in parallel, e.g., wherein each individual portion is connected to terminals of the same polarity of multiple battery cells. Furthermore, the interconnection scheme may be a combination of series and parallel connections. The example shown in FIG. 21A (and further described below with reference to FIG.

24A) has first portion 2122*a* of conductor 2120, which is configured to interconnect six cells. These 6 cells form two sets of 3 cells. The cells within each set are interconnected in parallel, but the two sets are interconnected in series. This type of connection may be referred to as 3p2s, or two series-connected sets of three cells in parallel.

Specifically, first portion 2122*a* includes first contact 2124 and second contact 2126. In some embodiments, first contact 2124 is configured to form a contact to a first terminal of one battery cell, while second contact 2126 is configured to form a contact to a second terminal of another battery cell, such that the first terminal and the second terminal have opposite polarities. As such, first portion 2122*a* interconnects these two battery cells in series. As shown in FIG. 21A, first portion 2122*a* also includes two other contacts similar to first contact 2124 for connecting to first terminals of two additional cells. Finally, FIG. 21A illustrates first portion 2122*a* including two other contacts similar to second contact 2126 for connecting to second terminals of yet two additional cells. For clarity, an approximate lower boundary of second contact 2126 is shown with a dotted line. However, in this example, second contact 2126 is monolithic with the rest of first portion 2122*a* including first contact 2124 and fuse 2128.

First portion 2122*a* also includes fuse 2128. Fuse 2128 forms an electrical connection between first contact 2124 and a remaining part of first portion 2122*a*. This remaining part of first portion 2122*a* may include second contact 2126 and, in some embodiments (as, e.g., shown in FIG. 21), other contacts and/or fuses. Fuse 2128 may have a specific cross-section for controlling the flow of current through fuse 2128 and, in the example shown in FIG. 21A, through first contact 2124. As such, fuse 2128 may be rated to a specific maximum current. When the current flowing through fuse 2128 exceeds this specific maximum current, fuse 2128 may overheat and melt, thereby effectively preventing any further flow of current.

Figure 25B:
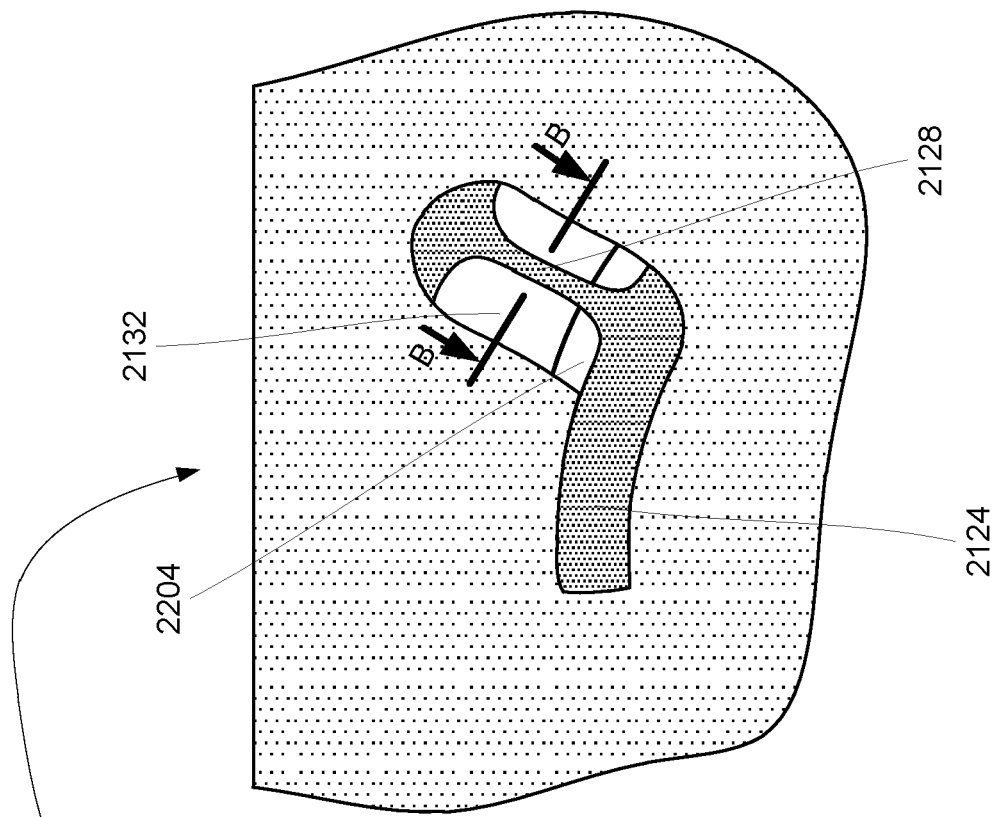
FIG. 25B is an expanded view of a portion of the assembly of FIG. 25A illustrating an insulator opening relative to a fuse of the conductor, in accordance with some embodiments.

It should be noted that the cross-sectional profile of fuse 2128 may be substantially rectangular as, for example, shown in FIG. 25B (identifying the cross-section B-B) and FIGS. 25C and 25D illustrating the cross-sectional profile of fuse 2128. Most conventional subtractive metal processing techniques, such as etching and die cutting, are not able to provide such a cross-sectional profile. The cross-sectional profile of a metal strip formed using etching resembles profile 2150 shown in FIG. 25E, while the cross-sectional profile of a metal strip formed using die cutting resembles profile 2152 shown in FIG. 25F. Furthermore, conventional profiles formed using conventional techniques are not uniform and can have a significant variation in the cross-sectional area, which is not desirable for fuse applications. This issue can be particularly challenging when it is desirable for fuse 2128 to have high aspect ratio (i.e., a ratio of fuse height to fuse width), such as an aspect ratio greater than 1:5, due to the fact that the distance associated with etch undercut can become significant relative to the width of the fuse. Burrs, undercuts, and other variations of the cross-sectional profile associated with conventional techniques may result in localized heating, insufficient heating, unacceptable variation in the fuse current rating, and/or other performance issues.

In some embodiments, fuse 2128 and other regions and/or traces of conductor 2120 may comprise rolled metal foil. In contrast to the vertical grain structure associated with electrodeposited foil and/or plated metal, the horizontally-elongated grain structure of rolled metal foil may help increase the resistance to crack propagation in conductor 2120 under cyclical loading conditions. This may help increase the fatigue life of fuse 2128 and other regions and traces of conductor 2120.

Referring to FIG. 25D, both surfaces 2128*a* and 2128*b* may be substantially planar and, in some embodiments, substantially parallel to each other. Likewise, sidewalls 2128*c* and 2128*d* may be substantially parallel. Furthermore, angles of intersection between surfaces 2128*a* and 2128*b* and sidewalls 2128*c* and 2128*d* may be substantially perpendicular. For a given conductor thickness, the width of fuse 2128 may be varied to achieve the desired fuse current rating. In some embodiments, aspect ratios ranging from 1:0.1 to 1:100 may be chosen to achieve the desired fuse current rating.

During normal operation (e.g., when the current flowing through fuse 2128 does not exceed the specific maximum current), fuse 2128 may experience significant heating. When other materials such as insulating materials are in direct contact with fuse 2128, these materials need to be made from heat resistant materials to prevent melting and changing the thermal characteristics of the fuse. The heat resistant materials may be expensive, difficult to work with, and may not provide other desirable characteristics (e.g., mechanical and/or electrical characteristics). Furthermore, if fuse 2128 becomes sufficiently hot, insulating materials lying directly above or directly below fuse 2128 may catch fire. To address these issues, fuse 2128 may overlap with first opening 2112 in first insulator 2110 such that the heat transfer between first insulator 2110 and fuse 2128 is minimal. First insulator 2110 may still support fuse 2128 indirectly, through other regions of first portion 2122*a* of conductor 2120. For example, first insulator 2110 may adhere to first portion 2122*a* before and after fuse 2128 with first opening 2112 extending adjacent to fuse 2128. In some embodiments, fuse 2128 fully overlaps with first opening 2112. This feature can be seen in FIGS. 25A-25C.

First insulator 2110 may be adhered to conductor 2120 and mechanically support first portion 2122*a* and second portion 2122*b* of conductor 2120. Furthermore, first insulator 2110 may support, directly or indirectly, various features of first portion 2122*a* and second portion 2122*b*. For example, a portion of first contact 2124 may be adhered to and supported by first insulator 2110. In some embodiments (e.g., when conductor 2120 is disposed in between first insulator 2110 and battery cells), the entire first contact 2124 may be adhered to and supported by first insulator 2110. Alternatively, first contact 2124 partially overlaps with first opening 2112, thereby creating regions of first contact 2124 which are freestanding. The portion of first opening 2112 overlapping with first contact 2124 may be used to form an electrical connection to first contact 2124.

In some embodiments, first insulator 2110 may include second opening 2114 partially overlapping with second contact 2126, thereby creating regions of second contact 2126 which are freestanding. The portion of second opening 2114 overlapping with second contact 2126 may help facilitate the formation of an electrical connection to second contact 2126. Second opening 2114 and first opening 2112 may have different shapes. In order to provide support to second contact 2126, a portion of second contact 2126 may be adhered to and supported by first insulator 2110.

Similar to first portion 2122*a*, second portion 2122*b* may include first contact 2124, second contact 2126, and fuse 2128 forming an electrical connection between first contact 2124 and the part of second portion 2122*b*. Fuse 2128 of second portion 2122*b* may be substantially the same as fuse 2128 of the first portion 2122*a*.

In some embodiments, interconnect 2100 may include second insulator 2130 adhered to conductor 2120. Second insulator 2130 may provide mechanical support to first portion 2122a and second portion 2122b of conductor 2120. Second insulator 2130 may include first opening 2132 such that fuse 2128 overlaps with first opening 2132. In some embodiments, first opening 2132 of second insulator 2130 overlaps with first opening 2112 of first insulator 2110. This approach simplifies design of first insulator 2110 and second insulator 2130, which in some embodiments may be used interchangeably. When first insulator 2110 is disposed between conductor 2120 and battery cells, the openings in second insulator 2130 may be used to provide access to conductor 2120 (e.g., allowing the insertion of a weld head to make a direct contact with conductor 2120) while, for example, forming electrical connections between conductor 2120 and the battery cells.

In some embodiments, conductor 2120 may include aluminum. Furthermore, conductor 2120 may include a surface coating on one or both sides. In some embodiments, the side of conductor 2120 opposite of first insulator 2110 may be exposed. This side may be used to provide access to conductor 2120 during the formation of electrical connections to battery cells.

Also provided is an assembly including a set of battery cells 2200 and interconnect 2100. Various examples of interconnects are described above. Specifically, interconnect 2100 may include conductor 2120 and first insulator 2110. Conductor 2120 may include first portion 2122a and second portion 2122b electrically isolated from first portion 2122a. First portion 2122a comprises first contact 2124, second contact 2126, and fuse 2128 forming electrical connection between first contact 2124 and first portion 2122a. First contact 2124 may be connected to first terminal 2204 of second battery 2202b of the battery cell set 2200. Second contact 2126 may be connected to second terminal 2206 of first battery 2202a of set of battery cells 2200. One example of such a connection is shown in FIG. 24A. First insulator 2110 may be adhered to conductor 2120 and mechanically support first portion 2122a and second portion 2122b of conductor 2120. First insulator 2110 comprises first opening 2112 such that fuse 2128 overlaps with first opening 2112.

In some embodiments, first insulator 2110 is disposed between conductor 2120 and battery cell set 2200. First insulator 2110 may optionally be adhered to battery cell set 2200. This feature may help provide mechanical support to electrical and/or mechanical joints between interconnect 2100 and battery cell set 2200.

First contact 2124 may be connected to first terminal 2204 of second battery 2202b of battery cell set 2200 through first opening 2112 in first insulator 2110. In the same or other embodiments, second contact 2126 is connected to second terminal 2206 of first battery 2202a of battery cell set 2200 through first opening 2114 in first insulator 2110. Fuse 2128 may extend over a space between battery cell set 2200 and does not overlap with any of the battery cells. As such, if fuse 2128 melts it does not fall onto or potentially short the terminals of a battery cell or other contacts.

FIGS. 22A-25A illustrate relative positions of different components of interconnect 2100 and battery cells in set 2200. These figures do not necessarily represent the order of operations. For example, first insulator 2110 may be adhered to conductor 2120 prior to aligning first insulator relative to the battery cells in set 2200. In some embodiments, some assembly of interconnect 2100 is performed while attaching interconnect to battery cells in set 2200.

Figures 22A, 22B:
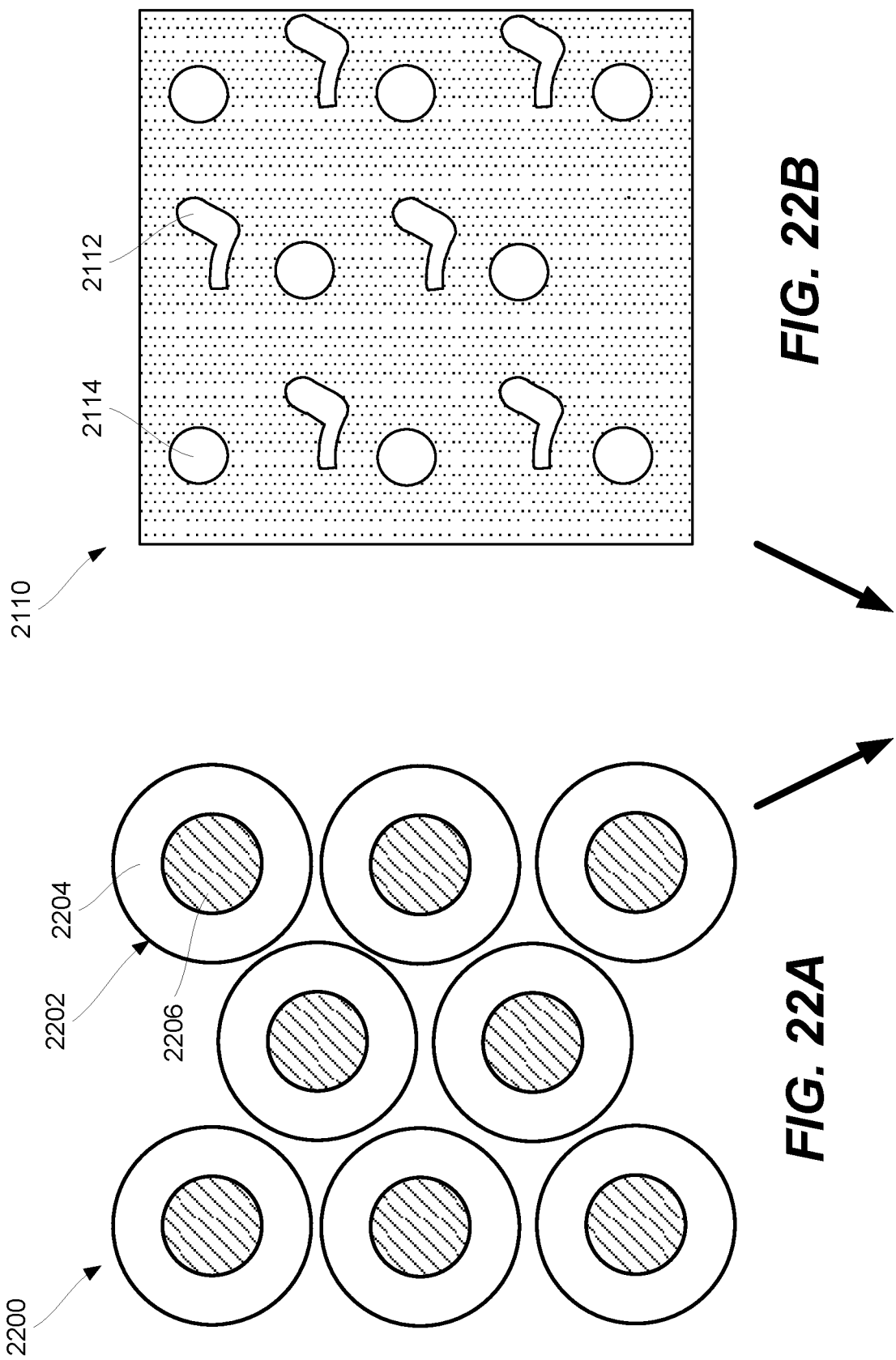
FIG. 22A illustrates battery cells forming a battery set, in accordance with some embodiments.
FIG. 22B illustrates an insulator (shown as a standalone component), in accordance with some embodiments.

FIG. 22A illustrates battery cells forming battery set 2200, in accordance with some embodiments. While cylindrical cells are shown in this figure, the battery cells may have any form or shape, e.g., may be prismatic cells. Furthermore, the orientations and geometry of battery cells in set 2200 may vary (e.g., to achieve maximum packing density, to allow spacing for heat transfer, etc.). In some embodiments, each cell in set 2200 has its first terminal 2204 and second terminal 2206 facing the same direction and, more specifically, roughly within the same plane. In other embodiments, some cells of set 2200 may be oriented in the opposite direction of other cells of set 2200, for example in architectures in which interconnection is desired to both the top and bottom of the battery cells.

FIG. 22B illustrates first insulator 2110 (shown as a standalone component), in accordance with some embodiments. First insulator 2110 includes first opening 2112 and second opening 2114. First insulator 2110 may include other openings, which may form patterns based on the arrangement of battery cells in set 2200.

FIG. 23A illustrates an orientation of first insulator 2110 relative to battery cell set 2200, in accordance with some embodiments. Hidden edges of battery cells are shown with dashed lines. Specifically, first opening 2112 in first insulator 2110 may overlap with first terminal 2204 of second battery 2202b. First opening 2112 may be used to form an electrical connection to this first terminal 2204. Furthermore, first opening 2112 may extend beyond first terminal 2204 and even beyond second battery 2202b. This part of first opening 2112 may overlap with fuse 2128 as further described below.

FIG. 23B illustrates conductor 2120 (shown as a standalone component), in accordance with some embodiments. Conductor 2120 may include different disjoined components, such as first portion 2122a and second portion 2122b. Because first portion 2122a and second portion 2122b are disjoined, they are electrically isolated. To preserve orientation and alignment of different components of conductor 2120, conductor 2120 may be adhered to first insulator 2110, to second insulator 2130, or to both first insulator 2110 and second insulator 2130.

FIG. 23B also illustrates first contact 2124, second contact 2126, and fuse 2128 of first portion 2122a. Fuse 2128 is positioned such that any flow of current through second contact 2126 is controlled by fuse 2128. In other words, first contact 2124 is fused relative to the rest of first portion 2122a. FIG. 23B illustrates two other fuses that are parts of first portion 2112a.

FIG. 24A illustrates a stack of first insulator 2110 and conductor 2120 disposed over battery cell set 2200, in accordance with some embodiments. Hidden edges of first insulator 2110 are shown with dashed lines. FIG. 24A illustrates that second contact 2126 of first portion 2122a may extend over second terminal 2206 of first battery cell 2202a. After installation of interconnect 2100, second contact 2126 of first portion 2122a forms an electrical connection to second terminal 2206 of first battery cell 2202a, e.g., though second opening 2114 in first insulator 2110. In a similar manner, first contact 2124 of first portion 2122a extends over first terminal 2204 of second battery cell 2202b. After installation of interconnect 2100, first contact 2124 of first portion 2122a forms an electrical connection to first terminal 2204 of second battery cell 2202b, e.g., though first opening 2112 in first insulator 2110. As such, first battery cell 2202a and second battery cell 2202b are interconnected in series. First portion 2122a also extends and, after interconnection, makes electrical connections to a second terminal of third battery cell 2202c, first terminal of fourth battery cell 2202d, second terminal of fifth battery cell 2202e, and first terminal of sixth battery cell 2202f. As such, first battery cell 2202a, third battery cell 2202c, and fifth battery cell 2202e have parallel connections to each other. Likewise, second battery cell 2202b, fourth battery cell 2202d, and sixth battery cell 2202f have parallel connections to each other. Furthermore, the set of first battery cell 2202a, third battery cell 2202c, and fifth battery cell 2202e is interconnected in series with the set of second battery cell 2202b, fourth battery cell 2202d, and sixth battery cell 2202f. All these connections are made by first portion 2122a of conductor 2120. Furthermore, second battery cell 2202b, fourth battery cell 2202d, and sixth battery cell 2202f are each connected to the first portion 2122a through a fuse 2128. The ability of interconnect 2100 to electrically interconnect multiple battery cells with a single interconnect or circuit may significantly improve the manufacturability of battery packs relative to manual wiring.

FIG. 24B illustrates second insulator 2130 (shown as a standalone component), in accordance with some embodiments. Second insulator 2130 includes first opening 2132 and second opening 2134. Second insulator 2130 may include other openings, which may form patterns based on the arrangement of battery cells in set 2200 and/or other factors.

Figure 25A:
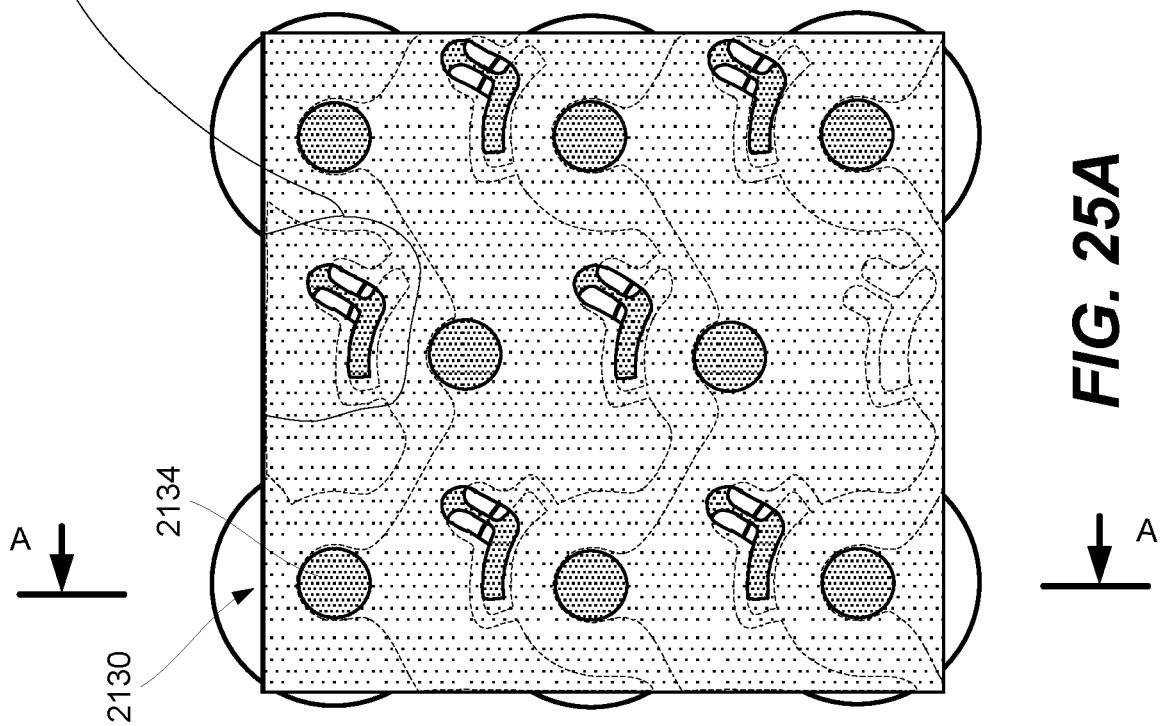
FIG. 25A illustrates a stack of a first insulator, a conductor, and a second insulator disposed over the battery cell set, in accordance with some embodiments.
Figure 26:
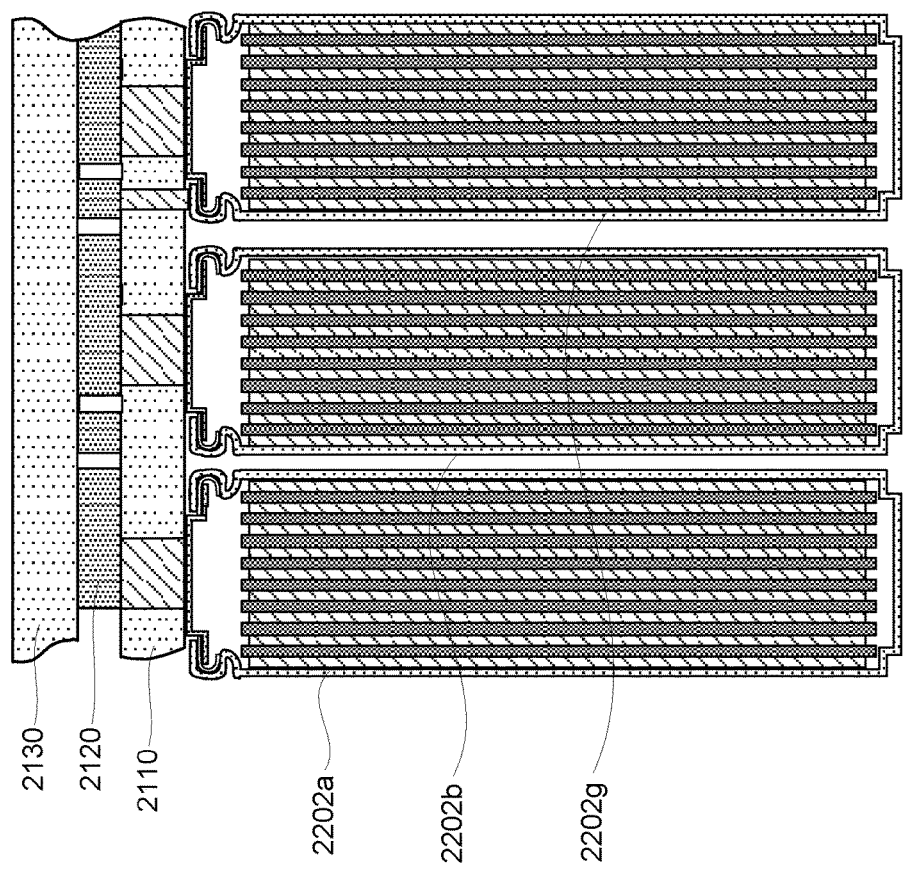
FIG. 26 is a cross-sectional side view of the assembly of FIG. 25A, in accordance with some embodiments.

FIG. 25A illustrates a stack of first insulator 2110, conductor 2120, and second insulator 2130 disposed over battery cell set 2200, in accordance with some embodiments. Hidden edges of conductor 2120 are shown with dashed lines. First opening 2132 and second opening 2134 in second insulator 2130 may be used to provide access to conductor 2120. Furthermore, first opening 2132 may be used to avoid contact between second insulator 2130 and fuse 2120 as shown in FIG. 25B.

Figure 27B:
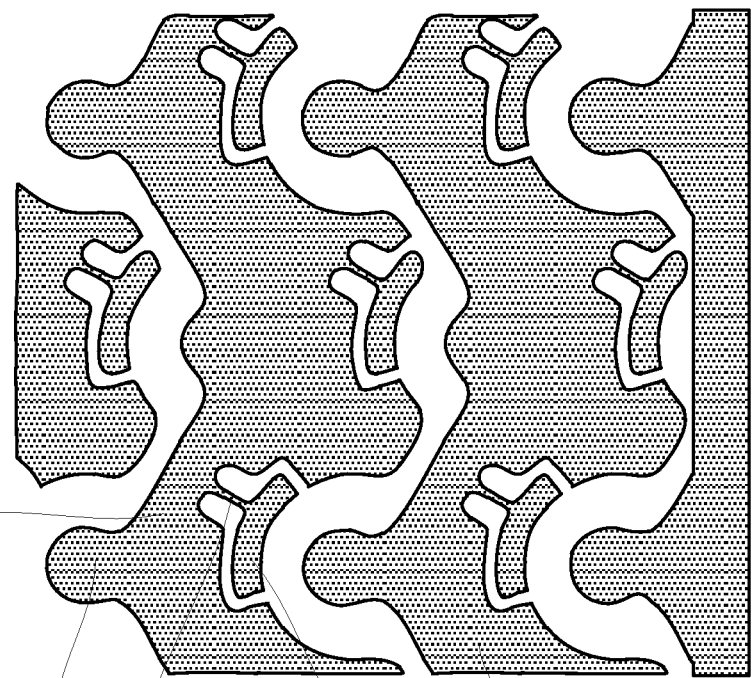
FIG. 27B illustrates an example of a conductor having fuses, in accordance with some embodiments.
Figure 27A:
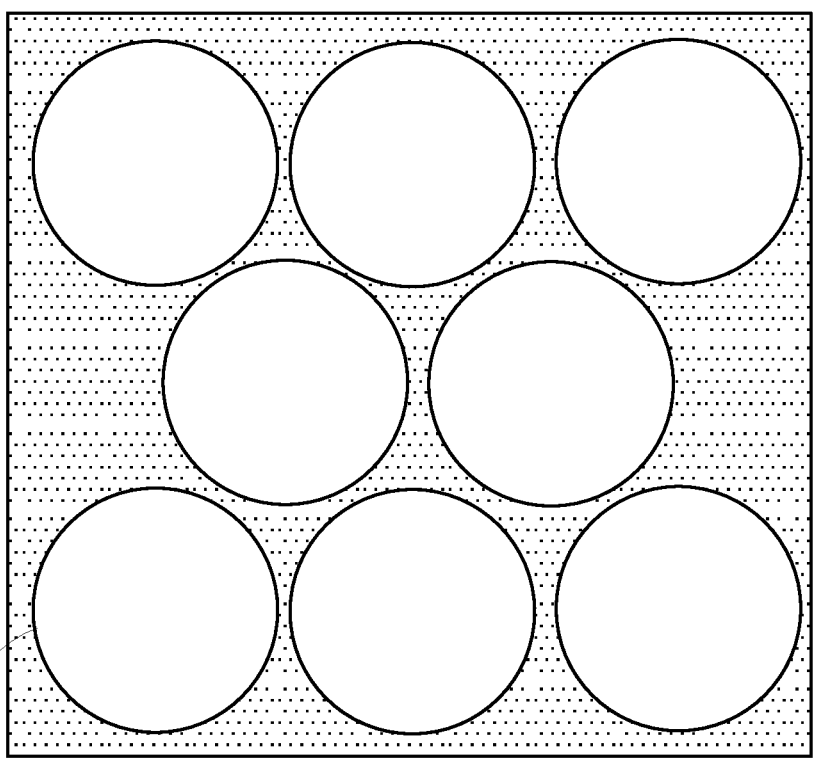
FIG. 27A illustrates an example of an insulator having openings, in accordance with some embodiments.

In some embodiments, some openings of first insulator 2110 and/or second insulator 2130 may be large and not able to provide support to various portions of conductor 2120, such as first contact 2124 and second contact 2126. For example, the principal size of one or more openings may be between about 25% and 250% of the principal size of the battery cell. More specifically, if 18650 cells are connected using interconnect 2100, the diameter of the openings in first insulator 2110 and/or second insulator 2130 may be between about 4.5 millimeters and 45 millimeters. FIG. 27A illustrates an example of first insulator 2110 with such first openings 2112. FIG. 27B illustrates conductor 2120 that is laminated to first insulator 2110. As described above, conductor 2120 includes first contact 2124 connected by fuse 2128 to another portion of conductor 2120. If this first contact 2124 is not attached to any other supporting structures, it may bend out of plane and even break, thereby potentially making conductor 2120 unsuitable for further use. FIG. 27C is a schematic representation of first insulator 2110 positioned over conductor 2120 illustrating that first insulator 2110 does not provide support to first contact 2124 of conductor 2120. It should be noted that that first insulator 2110 also does not provide support to second contact 2126 of conductor 2120. While FIG. 27C illustrates that second contact 2126 is better supported by remaining portions of conductor 2120 than first contact 2124, this support may be still not sufficient.

Overall, FIGS. 27A-27C show an example of first insulator layer 2110 having first openings 2112 that are sufficiently large that both first contacts 2124 and second contacts 2126 fall completely within a footprint of these first openings 2112 and, and therefore, are not supported by first insulator 2110. During fabrication and subsequent handling/processing of the interconnect circuit, these unsupported or poorly supported portions of conductor 2120 may become folded, bent, twisted, or otherwise damaged, resulting in a reduction in manufacturing yield of the interconnect circuit and/or battery pack assembly.

Figure 27F:
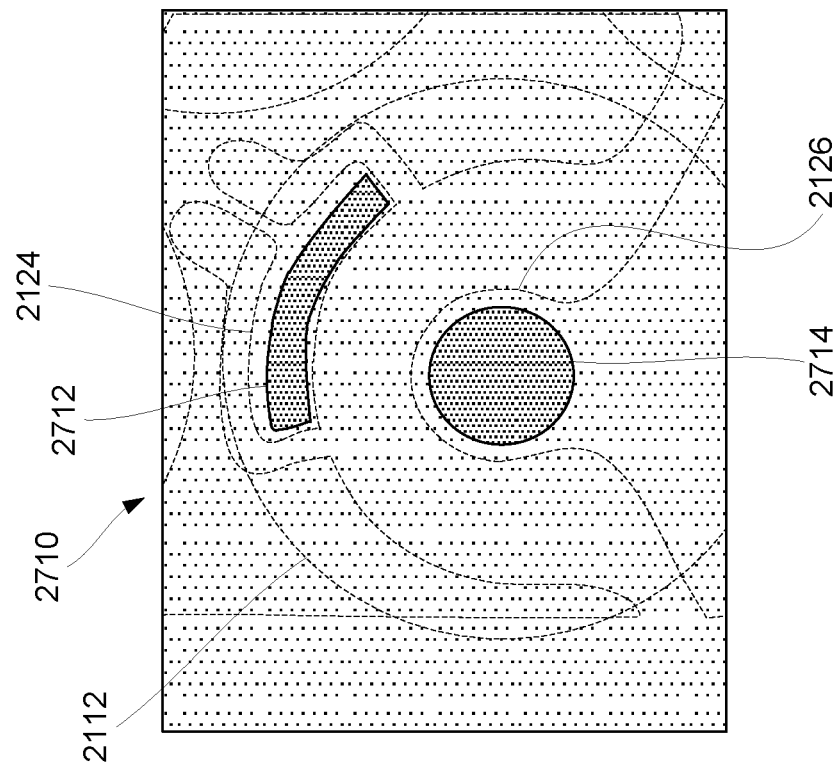
FIGS. 27E and 27F illustrate an example of the interconnect in which the temporary substrate of FIG. 27D is laminated to the insulator such that the insulator is disposed between the conductor and the temporary substrate, in accordance with some embodiments.
Figure 27E:
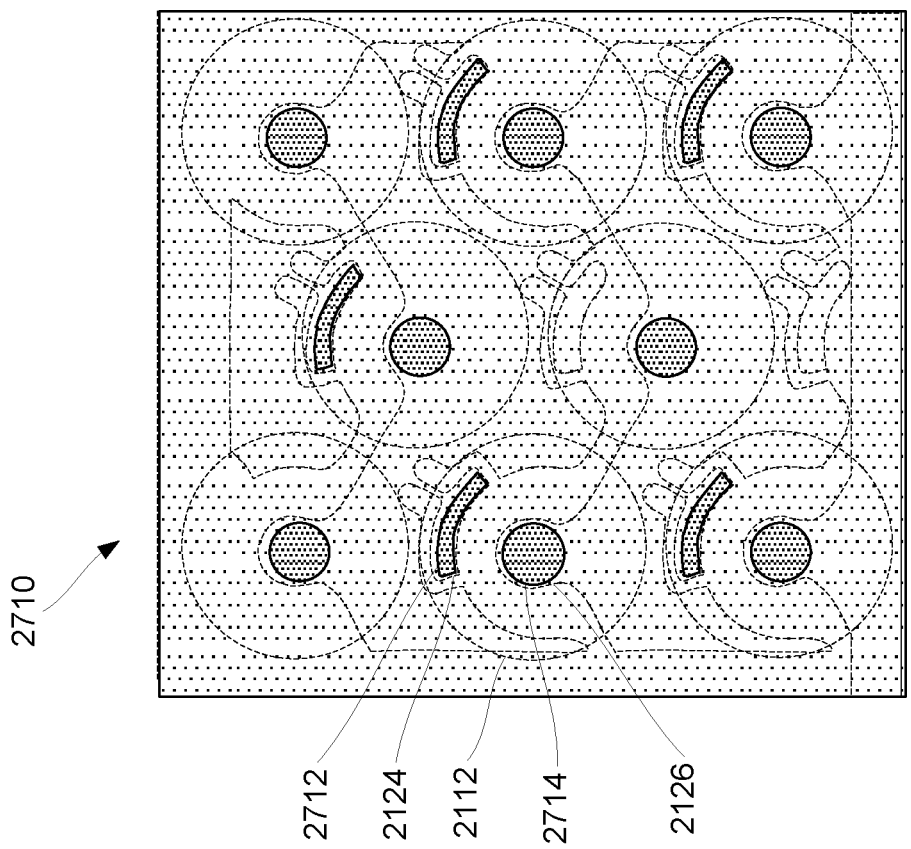
Figure 28A:
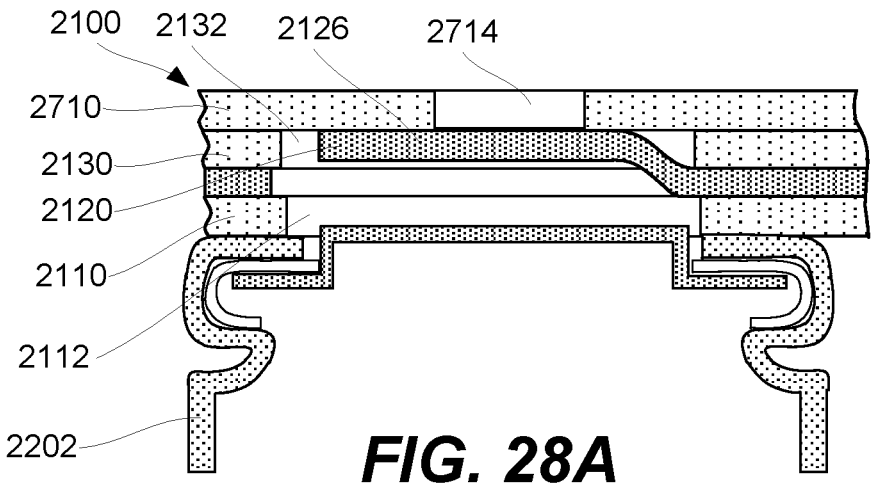
FIGS. 28A-28C illustrates an interconnect at different stages of forming an electrical connection to a battery cell, in accordance with some embodiments.
Figure 28B:
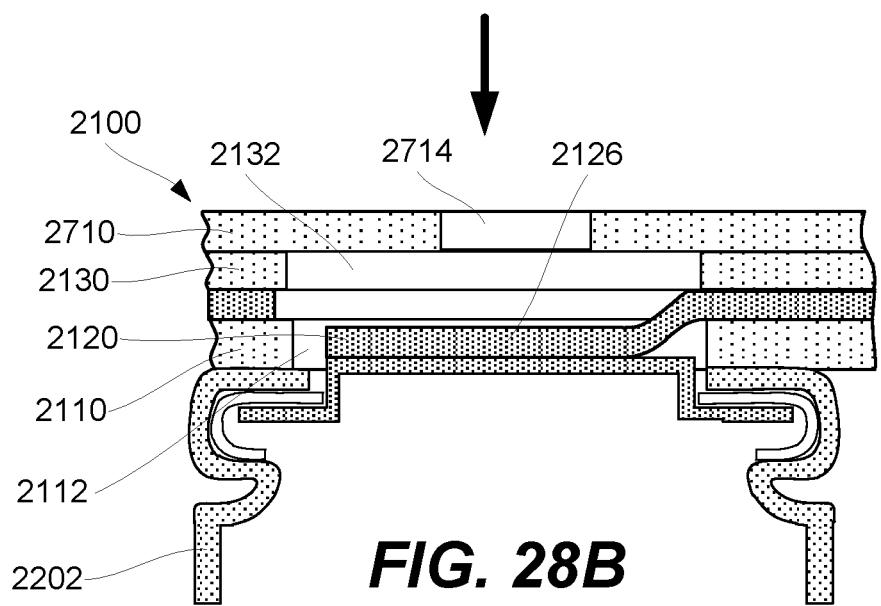
Figure 28C:
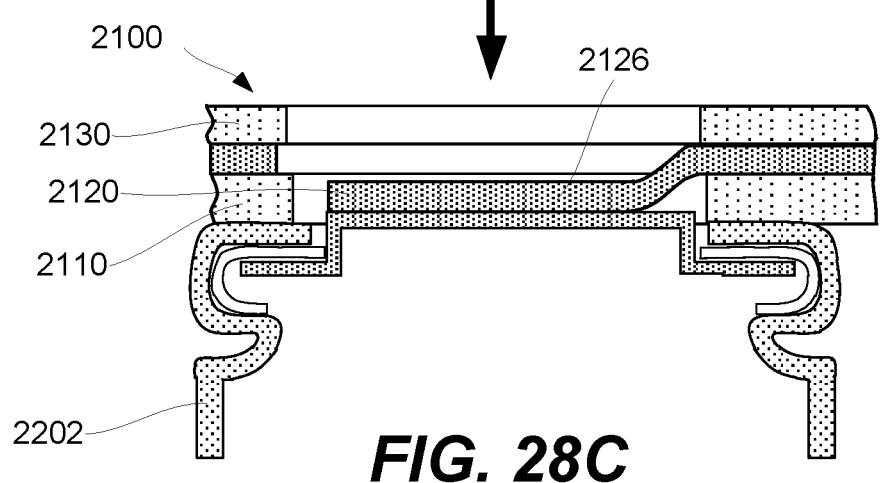

In some embodiments, temporary substrate 2710 may be used to ensure that these portions of conductor 2120 have sufficient support during fabrication and handling. Temporary substrate 2710 is a specific example of a support layer described above, which is later removed (e.g., after forming electrical and mechanical connections to battery cells 2202). One example of temporary substrate 2710, as a standalone structure, is shown in FIG. 27D. Temporary substrate 2710 may be laminated to the interconnect circuit assembly during various stages of fabrication. Temporary substrate 2710 may be laminated to interconnect 2100 and, thus, may temporarily become a part of interconnect 2100. Specifically, temporary substrate 2710 may be laminated to a first surface or a second surface of conductor 2120 or to a surface of first insulator 2110 or second insulator 2130. FIGS. 27E and 27F illustrate an example in which temporary substrate 2710 is laminated to first insulator 2110. However, because first insulator 2110 has large openings 2112, temporary substrate 2710 is also laminated to first contact 2124 and second contact 2126 of conductor 2120. FIGS. 28A-28C illustrate an example in which temporary substrate 2710 is laminated to second insulator 2130. In some embodiments, temporary substrate 2710 may be laminated over the insulator opposite of battery cell 2202 as shown in FIGS. 28A and 28B.

Optionally, temporary substrate 2710 may comprise an array of first openings 2712 and second openings 2714. In some embodiments, the locations of first opening 2712 and second opening 2714 may correspond to the locations of first contact 2124 and second contact 2126, respectively. In such an arrangement, first opening 2712 and second opening 2714 may provide access to first contact 2124 and second contact 2126, which may help facilitate the attachment of the contacts to terminals of the battery cells, for example. Furthermore, the size of first opening 2712 and second opening 2714 may be smaller than the size of first contact 2124 and second contact 2126, respectively (e.g., less than 75% of the contact area or even less than 50%). This size discrepancy ensures that the edges of first contact 2124 and second contact 2126 extend beyond the edges of first opening 2712 and second opening 2714, respectively, as, for example, illustrated in an expanded schematic view of FIG. 27F. As such, temporary substrate 2710 may provide mechanical support to first contact 2124 and second contact 2126 and prevent first contact 2124 and second contact 2126 from folding or twisting during fabrication or subsequent handling of the interconnect circuit.

Some examples of materials that may be suitable for temporary substrate 2710 include, but are not limited to, polyimide (PI), polyethylene naphthalate (PEN), polyethylene terephthalate (PET), polymethyl methacrylate (PMMA), ethyl vinyl acetate (EVA), polyvinyl butyral (PVB), polyethylene (PE), paper, or conductive foil. Furthermore, temporary substrate 2710 may include a low-tack adhesive coating such as a PSA on its surface to facilitate bonding to conductor 2120, first insulator 2110, or second insulator 2130. Alternatively, if temporary substrate 2710 does not include an adhesive coating, an adhesive material such as a thermoplastic sheet or wet-coatable PSA may be incorporated in between temporary substrate 2710 and conductor 2120, first insulator 2110, or second insulator 2130 just prior to lamination. Temporary substrate 2710 and its coatings may be designed to maintain a low-tack adhesive bond to conductor 2120, first insulator 2110, or second insulator 2130 through fabrication and subsequent handling of the interconnect circuit. This ensures that the temporary substrate provides mechanical support to the other layers of the interconnect circuit while at the same time allowing the temporary substrate to be removed when mechanical support is later provided by another layer or apparatus.

As described above, in some embodiments first opening 2712 and second opening 2714 may provide access to the first contact 2124 and second contact 2126 for the attachment of the contacts to the terminals of the battery cells. For example, this access may help simplify electro-mechanical joining processes including, but not limited to, soldering, bonding with ECA, laser welding, resistive welding, or ultrasonic welding.

FIGS. 28A-28C schematically illustrates different stages of forming electrical and mechanical contact between interconnect 2100 and battery cell 2202, in accordance with some embodiments. Specifically, FIG. 28A illustrates interconnect 2100 positioned above battery cell 2202. The edges of second contact 2126 are laminated to temporary substrate 2710 using an adhesive such as a low-tack adhesive or PSA. As such, second contact 2126 is supported by temporary substrate 2710 at this stage of processing. Second opening 2714 of temporary substrate 2710 provides access to second contact 2126, which may be used when attaching second contact 2126 to battery cell 2202. While the adhesive bond between temporary substrate 2710 and second contact 2126 may be sufficiently low-tack to later allow second contact 2126 to be separated from temporary substrate 2710, (e.g., during the attachment of second contact 2126 to battery cell 2202), it provides sufficient mechanical support to second contact 2126 during handling of interconnect 2100 and during initial stages of battery pack assembly, such as the alignment of second contact 2126 with battery cell 2202.

FIG. 28B illustrates the next stage of processing, when second contact 2126 is peeled from temporary substrate 2710 and, in some embodiments, connected to battery cell 2202. For example, the low-tack adhesive using for lamination of temporary substrate 2710 may release second contact 2126 from temporary substrate 2710 upon the application of mechanical force during the contact bonding operation (e.g., via pressure from an ultrasonic welding head or other mechanical apparatus). Specifically, second contact 2126 may be released from temporary substrate 2710 and pressed against battery cell 2202. It should be noted that temporary substrate 2710 may remain laminated to second insulator 2130 at this stage as, for example, shown in FIG. 28B. It should also be noted that even though the reference is made to temporary substrate 2710 being laminated to second insulator 2130, in alternative embodiments, temporary substrate 2710 may be laminated to first insulator 2110 or to conductor 2120. Finally, one having ordinary skill in the art would understand that temporary substrate 2710 may be used to support first contact 2124 in addition to or instead of second contact 2126.

Following the joining operation, or at another step of the interconnect circuit or battery pack assembly processes, temporary substrate 2710 may be peeled from the layer to which temporary substrate 2710 is laminated, e.g., second insulator 2130 in the examples shown in FIGS. 28A-28C. It should be noted that battery cell 2202 provides mechanical support to second contact 2126 at this point and temporary substrate 2710 may no longer be needed.

Conclusion

The methods and devices described herein may be extended to the interconnection of electronic devices in general, including, but not limited to, integrated circuits, resistors, capacitors, inductors, photovoltaic cells, and other electronic components and/or power sources.

It is to be understood that the above description is intended to be illustrative, and not restrictive. For example, the above-described embodiments (and/or aspects thereof) may be used in combination with each other. In addition, many modifications may be made to adapt a particular situation or material to the teachings presented herein. Dimensions, types of materials, orientations of the various components, and the number and positions of the various components described herein are intended to define parameters of some embodiments, and are by no means limiting and are merely examples. Many embodiments and modifications within the spirit and scope of the claims will be apparent to those of skill in the art upon reviewing the above description. The scope should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. § 112, sixth paragraph, unless and until such claim limitations expressly use the phrase "means for" followed by a statement of function void of further structure.

What is claimed is:

1. An interconnect for interconnecting a set of battery cells, the interconnect comprising:
   a conductor comprising a plurality of contacts, a plurality of fuses, and a remaining part, wherein:
      each of the plurality of contacts is coupled to a corresponding one of the plurality of fuses that forms an electrical connection between each of the plurality of contacts and the remaining part,
      the plurality of contacts, the plurality of fuses, and the remaining part are monolithic and are formed from a continuous metal layer,
      the remaining part comprises a voltage monitoring trace that is monolithic and has same thickness as each of the plurality of contacts and each of the plurality of fuses by being formed from the continuous metal layer, and
      the voltage monitoring trace comprises a contact point for forming an external connection; and
   a first insulator adhered to the conductor, wherein the first insulator comprises a first insulator opening that fully overlaps with a first contact of the plurality of contacts such that the first contact is not mechanically supported by the first insulator and such that the first contact is configured to protrude into the first insulator opening while forming an electrical connection.

2. The interconnect of claim 1, further comprising a second insulator adhered to the conductor,
   wherein the conductor is positioned between the first insulator and the second insulator, and
   wherein the second insulator comprises a second insulator opening that partially overlaps with the first contact such that the second insulator is adhered to and mechanically supports an edge of the first contact.

3. The interconnect of claim 2, wherein the first contact is configured to release from the second insulator to form a connection with a terminal of a first battery cell of the set of battery cells through the first insulator opening.

4. The interconnect of claim 2, wherein each of the plurality of fuses overlaps with both the first insulator opening and the second insulator opening.

5. The interconnect of claim 1, further comprising:
a second insulator adhered to the conductor, wherein the conductor is positioned between the first insulator and the second insulator, and wherein the second insulator comprises a second insulator opening that fully overlaps with the first contact such that the first contact is not mechanically supported by the second insulator; and
a temporary substrate adhered to the second insulator such that the second insulator is positioned between the temporary substrate and the conductor, wherein the temporary substrate is adhered to the first contact and mechanically supports the first contact.

6. The interconnect of claim 5, wherein the temporary substrate comprises a first substrate opening that partially overlaps with the first contact such that the temporary substrate is adhered to and mechanically supports an edge of the first contact.

7. The interconnect of claim 6, wherein the first contact is configured to release from the temporary substrate to form a connection with a terminal of a first battery cell of the set of battery cells through the first insulator opening.

8. The interconnect of claim 1, wherein the continuous metal layer is a rolled metal foil comprising aluminum that has an in-plane elongated grain structure thereby increasing a fatigue life of the plurality of fuses.

9. The interconnect of claim 1, wherein:
the conductor comprises aluminum, and
the thickness is from 50 micrometers to 2000 micrometers.

10. The interconnect of claim 1, wherein:
the conductor comprises aluminum with two oxide layers formed on opposite sides of the conductor, and
the two oxide layers have different thicknesses.

11. The interconnect of claim 1, wherein each of the plurality of fuses is freestanding and does not overlap with the first insulator.

12. The interconnect of claim 1, wherein each of the plurality of fuses overlaps with the first insulator.

13. The interconnect of claim 1, wherein the first insulator comprises a material selected from the group consisting of polyimide (PI), polyethylene naphthalate (PEN), and polyethylene terephthalate (PET).

14. The interconnect of claim 1, wherein the first insulator comprises an adhesive sublayer, adhered to the conductor.

15. The interconnect of claim 1, wherein the first insulator comprises an additional adhesive sublayer facing away from the conductor.

16. An assembly comprising:
a set of battery cells; and
an interconnect comprising:
a conductor comprising a plurality of contacts, a plurality of fuses, and a remaining part, wherein:
each of the plurality of contacts is coupled to a corresponding battery cell in the set of battery cells and is further coupled to a corresponding one of the plurality of fuses that forms an electrical connection between the corresponding battery cell and the remaining part,
the plurality of contacts, the plurality of fuses, and the remaining part are monolithic and are formed from a continuous metal layer,
the remaining part comprises a voltage monitoring trace that is monolithic and has same thickness as each of the plurality of contacts and each of the plurality of fuses by being formed from the continuous metal layer, and
the voltage monitoring trace comprises a contact point for forming an external connection; and
a first insulator adhered to the conductor, wherein the first insulator comprises a first insulator opening that fully overlaps with a first contact of the plurality of contacts such that the first-contact is not mechanically supported by the first insulator and such that the first contact protrudes into the first insulator opening and forms an electrical connection with one battery cell in the set of battery cells.

17. The assembly of claim 16, further comprising a second insulator adhered to the conductor, wherein the conductor is positioned between the first insulator and the second insulator, and wherein the second insulator comprises a second insulator opening that partially overlaps with the first contact.

18. The assembly of claim 16, wherein the voltage monitoring trace is folded to a side of the set of battery cells.

19. An interconnect system comprising:
a first conductor portion;
a second conductor portion, electrically isolated from the first conductor portion, wherein each of the first conductor portion and the second conductor portion comprises, a plurality of fuses, and a remaining part, wherein:
each of the plurality of contacts is coupled to a corresponding one of the plurality of fuses that forms an electrical connection between each of the plurality of contacts and the remaining part by the corresponding one of the plurality of fuses,
the plurality of contacts, the plurality of fuses, and the remaining part are monolithic and are formed from a continuous metal layer,
the remaining part comprises a voltage monitoring trace that is monolithic and has same thickness as each of the plurality of contacts and each of the plurality of fuses by being formed from the continuous metal layer, and
the voltage monitoring trace comprises a contact point for forming an external connection; and
a first insulator adhered to the first conductor portion and the second conductor portion, wherein the first insulator comprises a first insulator opening that fully overlaps with a first contact of the plurality of contacts such that the first contact is not mechanically supported by the first insulator and such that the first contact is configured to protrude into the first insulator opening while forming an electrical connection.

20. The interconnect system of claim 19, further comprising a second insulator adhered to the first conductor portion and the second conductor portion, wherein the first conductor portion and second conductor portion are positioned between the first insulator and the second insulator, and wherein the second insulator comprises a second insulator opening that partially overlaps with the first contact such that the second insulator is adhered to and mechanically supports an edge of the first contact.

* * * * *